(12) United States Patent
Kuramoto et al.

(10) Patent No.: US 8,786,941 B2
(45) Date of Patent: Jul. 22, 2014

(54) SEMICONDUCTOR OPTICAL AMPLIFIER

(75) Inventors: Masaru Kuramoto, Kanagawa (JP); Masao Ikeda, Kanagawa (JP); Rintaro Koda, Tokyo (JP); Tomoyuki Oki, Kanagawa (JP); Hideki Watanabe, Kanagawa (JP); Takao Miyajima, Kanagawa (JP); Hiroyuki Yokoyama, Miyagi (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 202 days.

(21) Appl. No.: 13/166,900

(22) Filed: Jun. 23, 2011

(65) Prior Publication Data
US 2012/0002271 A1    Jan. 5, 2012

(30) Foreign Application Priority Data
Jun. 30, 2010    (JP) ................ P2010-149345

(51) Int. Cl.
*H01S 5/00*    (2006.01)

(52) U.S. Cl.
USPC ......................................... 359/344

(58) Field of Classification Search
USPC ......................................... 359/344
See application file for complete search history.

(56) References Cited

U.S. PATENT DOCUMENTS

| | | | |
|---|---|---|---|
| 6,310,995 B1 * | 10/2001 | Saini et al. ............... 385/28 |
| 6,807,213 B1 * | 10/2004 | Shimoyama et al. ...... 372/49.01 |
| 7,271,422 B2 * | 9/2007 | Hashimoto et al. ............. 257/96 |
| 2005/0127394 A1 * | 6/2005 | Nagahama et al. ........... 257/103 |
| 2005/0157766 A1 | 7/2005 | Kim et al. |

FOREIGN PATENT DOCUMENTS

| | | |
|---|---|---|
| JP | 05-067845 | 3/1993 |
| JP | 05-335691 | 12/1993 |
| JP | 10-075004 | 3/1998 |
| JP | 11-112073 | 4/1999 |
| JP | 2000-299530 | 10/2000 |
| JP | 2005-210120 | 8/2005 |
| JP | 2007-243072 | 9/2007 |
| JP | 2007-251064 | 9/2007 |
| JP | 2009-049310 | 3/2009 |
| WO | WO 2006/075759 | 7/2006 |

OTHER PUBLICATIONS

Hiroyuki Yokoyama et al.; Generation of subpicosecond coherent optical pulses by passive mode locking of an AlGaAs diode laser; Applied Physics Letters; 40(2); Jan. 15, 1982.

(Continued)

*Primary Examiner* — Eric Bolda
(74) *Attorney, Agent, or Firm* — Dentons US LLP

(57) ABSTRACT

A semiconductor optical amplifier includes: a laminated structure sequentially including a first compound semiconductor layer composed of GaN compound semiconductor and having a first conductivity type, a third compound semiconductor layer having a light amplification region composed of GaN compound semiconductor, and a second compound semiconductor layer composed of GaN compound semiconductor and having a second conductivity type; a second electrode formed on the second compound semiconductor layer; and a first electrode electrically connected to the first compound semiconductor layer. The laminated structure has a ridge stripe structure. When widths of the ridge stripe structure in a light output end face and the ridge stripe structure in a light incident end face are respectively $W_{out}$ and $W_{in}$, $W_{out} > W_{in}$ is satisfied. A carrier non-injection region is provided in an internal region of the laminated structure from the light output end face along an axis line of the semiconductor optical amplifier.

7 Claims, 30 Drawing Sheets

(56) References Cited

OTHER PUBLICATIONS

S. Gee and J. E. Bowers; Ultraviolet picosecond optical pulse generation from a mode-locked InGaN laser diode; Applied Physics Letters; vol. 79, No. 13; Sep. 24, 2001.

Japanese Office Action issued in connection with related Japanese Patent Application No. 2010-149345 dated Mar. 11, 2014.

* cited by examiner

15 μm

15 μm

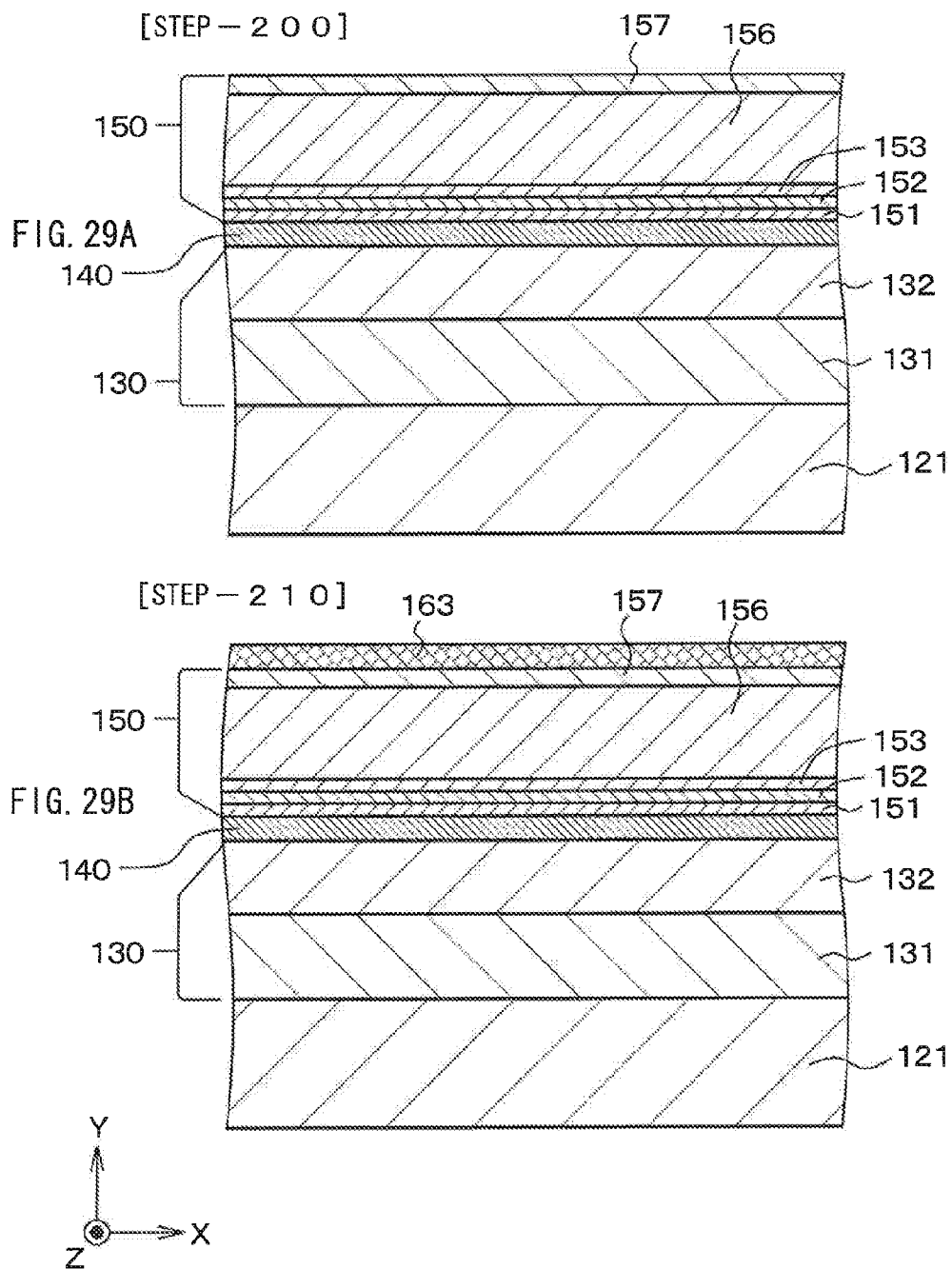

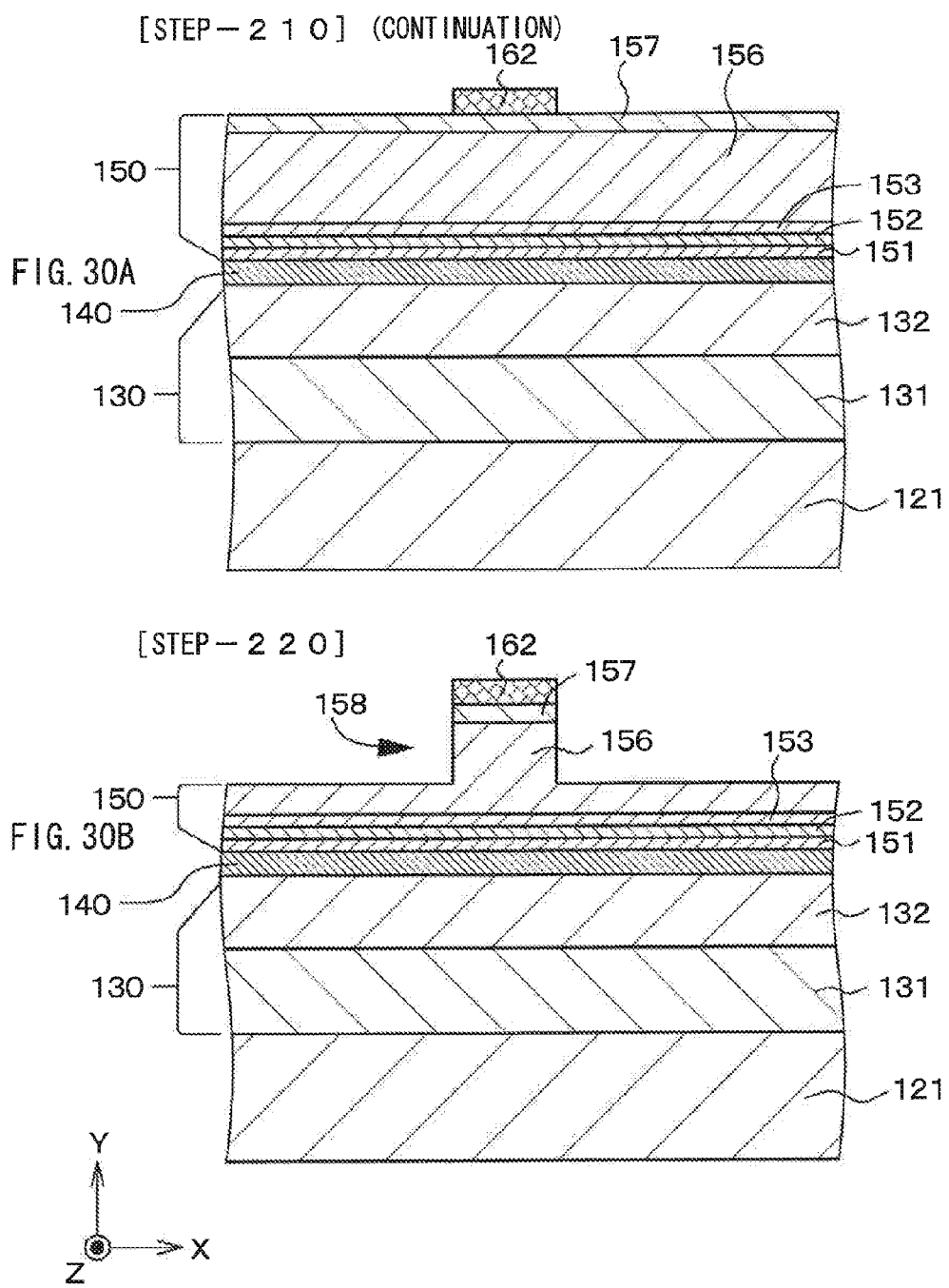

SEMICONDUCTOR OPTICAL AMPLIFIER

BACKGROUND OF THE INVENTION

1. Field of the Invention

The present invention relates to a semiconductor optical amplifier.

2. Description of the Related Art

In these days, in the advanced scientific region researches using laser light with the pulse time on the attosecond time scale or on the femtosecond time scale, the ultrashort pulse and ultrahigh power laser is actively used. Further, the high power and ultrashort pulse laser diode device that is composed of GaN compound semiconductor and that has light emitting wavelength of 405 nm band has been expected to be a light source for a volumetric optical disc system expected as a next generation optical disc system displacing the blu-ray optical disc system or has been expected to be a light source demanded in the medical field, the bio imaging field and the like.

As the ultrashort pulse and ultrahigh power laser, for example, titanium/sapphire laser is known. Such a titanium/sapphire laser is an expensive and large solid laser light source, which is a main factor to inhibit spread of the technology. If the ultrashort pulse and ultrahigh power laser is realized with the use of a laser diode or a laser diode device, significant miniaturization, price reduction, and high stability are able to be realized, which is expected to become a breakthrough for promoting its wide usage in these fields.

Meanwhile, short pulsation of the laser diode device has been actively researched since 1960s in the communication system field. As a method of generating short pulses in the laser diode device, gain switching method, loss switching method (Q switching method), and mode locking method are known. In these methods, high output is pursued by combining the laser diode device with a semiconductor amplifier, a nonlinear optical device, an optical fiber and the like. The mode locking is further categorized into active mode locking and passive mode locking. To generate light pulses based on the active mode locking, an external oscillator is configured by using a mirror or a lens, and further high frequency (RF) modulation is added to the laser diode device. Meanwhile, in the passive mode locking, light pulses are able to be generated by simple direct current drive by using a laser diode device having a multiple electrode structure.

In the laser light source, obtaining high power is a big challenge. As a means for amplifying light from the laser light source, the semiconductor optical amplifier (SOA) has been keenly examined. The optical amplifier is an amplifier that directly amplifies an optical signal in a state of light without converting the optical signal to an electric signal. The optical amplifier has a laser structure without resonator, and amplifies incident light by light gain of the amplifier.

In the past, the optical amplifier has been mainly developed for optical communication. Thus, for practical application of the semiconductor optical amplifier in 405 nm band, very few precedent cases exist. For example, based on Japanese Unexamined Patent Application Publication No. 5-067845, the semiconductor optical amplifier in 1.5 µm band that uses GaInAsP compound semiconductor and that has a tapered ridge stripe structure has been known. In the technique disclosed in the foregoing Japanese Unexamined Patent Application Publication No. 5-067845, in the semiconductor optical amplifier, a light guide width is gently extended in tapered shape from the narrow input-side-light guide satisfying single mode conditions to output-side-light guide. Thereby, mode field is expanded along the light guide width to improve maximum output of the semiconductor optical amplifier.

SUMMARY OF THE INVENTION

However, it becomes clear by studies by the inventors of the invention as follows. That is, in the semiconductor optical amplifier composed of GaN compound semiconductor, even if the light guide width on the output side is widened, the width of an outputted near-field image is not expanded and is narrower than the light guide width. The foregoing fact may lead to inhibition of increase of the maximum output of the semiconductor optical amplifier, and instability of laser light outputted from the semiconductor optical amplifier.

Accordingly, in the invention, it is firstly desirable to provide a semiconductor optical amplifier composed of GaN compound semiconductor that is able to retain higher light output. Further, it is secondly desirable to provide a semiconductor optical amplifier with which there is no possibility that laser light outputted from the semiconductor optical amplifier is unstable.

According to a first embodiment to a third embodiment of the invention to attain the foregoing first and the second objects, there is provided a semiconductor optical amplifier including: a laminated structure in which a first compound semiconductor layer that has a first conductivity type and is composed of GaN compound semiconductor, a third compound semiconductor layer that has a light amplification region (carrier non-injection region, gain region) composed of GaN compound semiconductor, and a second compound semiconductor layer that has a second conductivity type different from the first conductivity type and is composed of GaN compound semiconductor are sequentially layered; a second electrode formed on the second compound semiconductor layer; and a first electrode electrically connected to the first compound semiconductor layer, wherein the laminated structure has a ridge stripe structure. When a width of the ridge stripe structure in a light output end face is $W_{out}$, and a width of the ridge stripe structure in a light incident end face is $W_{in}$, $W_{out} > W_{in}$ is satisfied.

In the semiconductor optical amplifier according to the first embodiment of the invention to attain the foregoing first object, a carrier non-injection region is provided in an internal region of the laminated structure from the light output end face along an axis line of the semiconductor optical amplifier.

In the semiconductor optical amplifier according to the second embodiment of the invention to attain the foregoing second object, a width of the second electrode is narrower than the width of the ridge stripe structure.

In the semiconductor optical amplifier according to the third embodiment of the invention to attain the foregoing second object, when a maximum width of the ridge stripe structure is $W_{max}$, $W_{max} > W_{out}$ is satisfied.

In the semiconductor optical amplifiers according to the first embodiment to the third embodiment of the invention, where the width of the ridge stripe structure in the light output end face is $W_{out}$, and the width of the ridge stripe structure in the light incident end face is $W_{in}$, $W_{out} > W_{in}$ is satisfied. That is, the light guide width is broadened from the light guide on the light output side having a narrow width satisfying single mode conditions to the light guide on the light output side having a wide width. Thus, mode field is able to be expanded according to the light guide width, high light output of the semiconductor optical amplifier is able to be attained, and laser light is able to be optically amplified while single lateral mode is maintained.

Further, in the semiconductor optical amplifier according to the first embodiment of the invention, the carrier non-injection region is provided in the internal region of the laminated structure from the light output end face along the axis line of the semiconductor optical amplifier. Thus, the width of a laser light outputted from the light output end face is able to be broadened. Therefore, higher light output is able to be attained, and reliability is able to be improved. Meanwhile, in the semiconductor optical amplifier according to the second embodiment of the invention, the width of the second electrode is narrower than the width of the ridge stripe structure. In the semiconductor optical amplifier according to the third embodiment of the invention, when the maximum width of the ridge stripe structure is $W_{max}$, $W_{max} > W_{out}$ is satisfied. Thereby, stable lateral mode amplified light is obtained, and there is no possibility that laser light outputted from the semiconductor optical amplifier becomes unstable.

Other and further objects, features and advantages of the invention will appear more fully from the following description.

BRIEF DESCRIPTION OF THE DRAWINGS

FIGS. 29A and 29B are schematic partial cross sectional views of a substrate and the like for explaining a method of manufacturing the mode locking laser diode device in the second example.

FIGS. 30A and 30B are schematic partial cross sectional views of a substrate and the like for explaining a method of manufacturing the mode locking laser diode device in the second example following FIG. 29B.

DETAILED DESCRIPTION OF THE PREFERRED EMBODIMENTS

Figure 1:
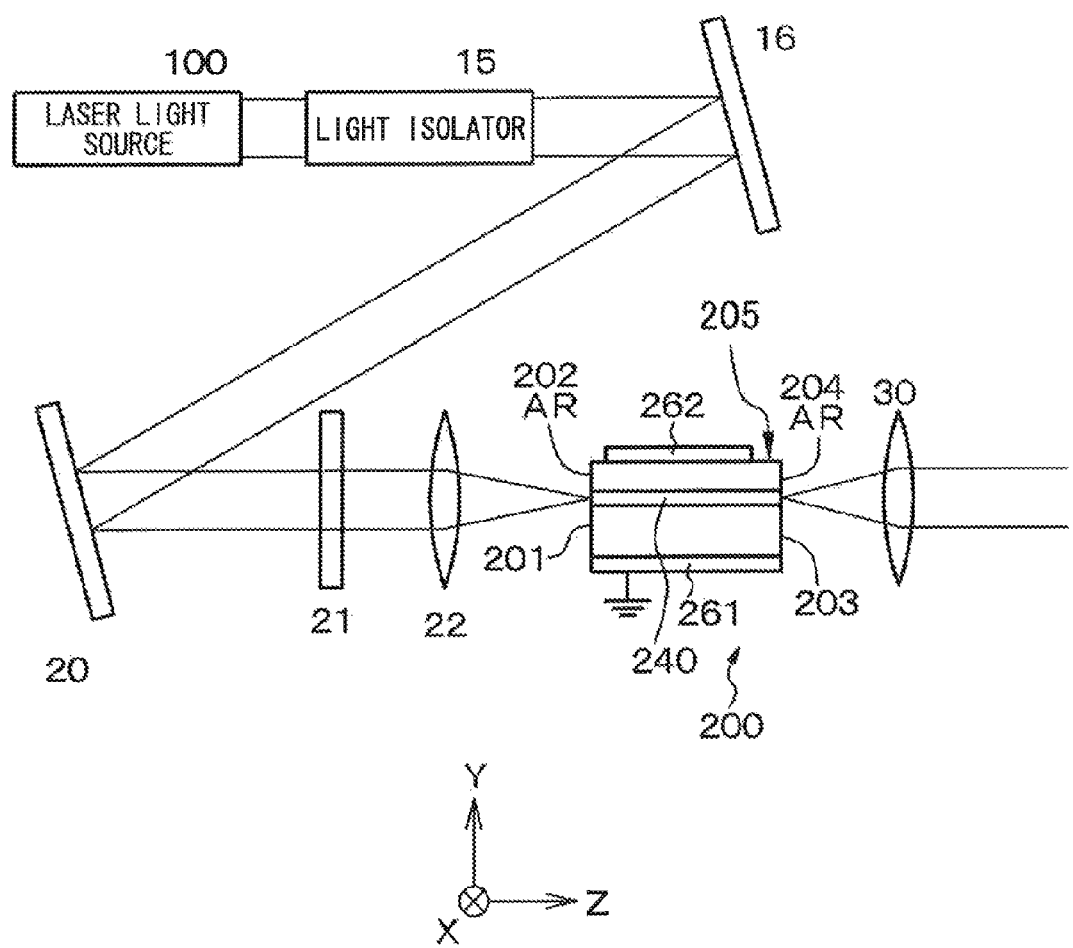
FIG. 1 is a conceptual view of a light output device of a first example including a semiconductor optical amplifier.

While the invention will be hereinafter described based on examples with reference to the drawings, the invention is not limited to the examples, and various numerical values and materials in the examples are exemplification. The description will be given in the following order:
1. Semiconductor optical amplifiers according to a first embodiment to a third embodiment of the invention and overall description
2. First example (the semiconductor optical amplifier according to the first embodiment of the invention)
3. Second example (modification of the first example)
4. Third example (the semiconductor optical amplifiers according to the second embodiment and the third embodiment of the invention)
5. Fourth example (modification of the third example)
6. Fifth example (modification of the mode locking laser diode device in the second example)
7. Sixth example (another modification of the mode locking laser diode device in the second example)
8. Seventh example (another modification of the mode locking laser diode device in the second example)
9. Eighth example (another modification of the mode locking laser diode device in the second example)
10. Ninth example (another modification of the mode locking laser diode device in the second example) and others
Semiconductor Optical Amplifiers According to a First Embodiment to a Third Embodiment of the Invention and Overall Description In the semiconductor optical amplifier according to the first embodiment of the invention, $W_{out}$ may be 5 μm or more. Though the upper limit of $W_{out}$ is not limited, for example, $4 \times 10^2$ μm can be exemplified as the upper limit of $W_{out}$. Further, in the semiconductor optical amplifier according to the first embodiment of the invention, $W_{in}$ may be from 1.4 μm to 2.0 μm both inclusive. The foregoing preferred embodiments may be applied to the semiconductor optical amplifiers according to the second embodiment and the third embodiment of the invention.

In the semiconductor optical amplifier according to the second embodiment of the invention, the value of (width of a second electrode)/(width of a ridge stripe structure) is desirably from 0.2 to 0.9 both inclusive, and is preferably from 0.6 to 0.9 both inclusive. The width of the second electrode and the width of the ridge stripe structure mean the width of the second electrode and the width of the ridge stripe structure obtained where the semiconductor optical amplifier is cut in a certain virtual plane orthogonal to the axis line of the semiconductor optical amplifier.

Further, in the semiconductor optical amplifier according to the third embodiment of the invention, $0.2 \leq W_{out}/W_{max} \leq 0.9$ is desirably satisfied, and $0.5 \leq W_{out}/W_{max} \leq 0.9$ is preferably satisfied.

In the semiconductor optical amplifiers according to the second embodiment and the third embodiment of the invention, as in the semiconductor optical amplifier according to the first embodiment of the invention, a carrier non-injection region may be provided in an internal region of a laminated structure from a light output end face along the axis line of the semiconductor optical amplifier. In the semiconductor optical amplifiers according to the first embodiment to the third embodiment of the invention, further, the carrier non-injection region may be also provided in an internal region of the laminated structure from a light incident end face along the axis line of the semiconductor optical amplifier.

Further, in the semiconductor optical amplifiers according to the first embodiment to the third embodiment of the invention, it is possible that the second electrode is not provided in the carrier non-injection region, or it is possible that the second electrode is composed of a first section and a second section that are separated by an isolation trench, and the second section of the second electrode is provided in the carrier non-injection region. In the latter case, a voltage equal to or less than a built-in voltage is desirably applied to the second section of the second electrode. Specifically, a voltage equal to or less than $(1.2398/\lambda)$ is desirably applied to the second section of the second electrode. λ represents wavelength of incident laser light to the semiconductor optical amplifier (unit: μm), and "1.2398" represents constant number. For example, in the case where 0.4 μm wavelength laser light enters the semiconductor optical amplifier, a voltage equal to or less than 3.0995 volt is desirably applied. Though not limited, as the lower limit value of voltage applied to the second section of the second electrode, −20 volt can be exemplified. Light amplification as an inherent function of the semiconductor optical amplifier is able to be performed by applying a voltage to the first section of the second electrode, while monitoring light intensity and measurement for position adjustment and the like are able to be performed by applying a voltage to the second section of the second electrode. For such a point, a description will be given in detail later. Further, near-field image is able to be controlled.

Further, in the semiconductor optical amplifiers according to the first embodiment to the third embodiment of the invention, the axis line of the semiconductor optical amplifier may intersect with the axis line of the ridge stripe structure at a given angle. As given angle θ, 0.1 deg≤θ≤10 deg can be exemplified. The axis line of the ridge stripe structure is a straight line that connects the point obtained by equally dividing the line between both ends of the ridge stripe structure in the light output end face with the point obtained by equally dividing the line between both ends of the ridge stripe structure in the light incident end face.

Further, in the semiconductor optical amplifiers according to the first embodiment to the third embodiment of the invention, a low reflective coating layer formed from a laminated structure composed of at least two types of layers selected from the group consisting of a titanium oxide layer, a tantalum oxide layer, a zirconia oxide layer, a silicon oxide layer, and an aluminum oxide layer may be formed in the light incident end face and the light output end face.

Further, in the semiconductor optical amplifiers according to the first embodiment to the third embodiment of the invention, though not limited, the light intensity density of laser light outputted from the semiconductor optical amplifier may be 60 kilowatt or more per 1 $cm^2$ of a third compound semiconductor structuring the light output end face, and may be preferably 600 kilowatt or more.

Further, in the semiconductor optical amplifiers according to the first embodiment to the third embodiment of the invention, the value of (width of the ridge stripe structure in the light output end face)/(width of laser light outputted from the semiconductor optical amplifier) may be from 1.1 to 10 both inclusive, and may be preferably from 1.1 to 5 both inclusive.

Further, in the semiconductor optical amplifiers according to the first embodiment to the third embodiment of the invention (hereinafter, in some cases, such semiconductor optical amplifiers will be generically and simply referred to as "semiconductor optical amplifier of the embodiment of the invention,") the semiconductor optical amplifier may be composed of a transmissive semiconductor optical amplifier. However, the semiconductor optical amplifier is not limited to the transmissive semiconductor optical amplifier. For example, the semiconductor optical amplifier may be composed of a monolithic semiconductor optical amplifier.

In the semiconductor optical amplifier of the embodiment of the invention, $W_{out} > W_{in}$ is satisfied where the width of the ridge stripe structure in the light output end face is $W_{out}$, and the width of the ridge stripe structure in the light incident end face is $W_{in}$. In this case, each end section of the ridge stripe structure may be composed of one line segment (the semiconductor optical amplifiers according to the first embodiment and the second embodiment of the invention), or may be composed of two or more line segments (the semiconductor optical amplifiers according to the first embodiment to the third embodiment of the invention). In the former case, for example, the width of the ridge stripe structure is gently and flatly extended in tapered shape from the light incident end face to the light output end face. Meanwhile, in the latter case and in the semiconductor optical amplifiers according to the first embodiment and the second embodiment of the invention, for example, the width of the ridge stripe structure is firstly the same, and is next gently and flatly extended in tapered shape from the light incident end face to the light output end face. Further, in the latter case and in the semiconductor optical amplifier according to the second embodiment of the invention, for example, the width of the ridge stripe structure is firstly widened, and is next narrowed after the width exceeds the maximum width from the light incident end face to the light output end face.

In the semiconductor optical amplifier according to the first embodiment of the invention or the semiconductor optical amplifiers according to the second embodiment to the third embodiment of the invention, the carrier non-injection region is provided in the internal region of the laminated structure from the light output end face along the axis line of the semiconductor optical amplifier. As length of the carrier non-injection region along the axis line of the semiconductor optical amplifier (width of the carrier non-injection region) $L_{NC}$, a value from 0.1 μm to 100 μm both inclusive can be exemplified.

Further, in the semiconductor optical amplifier according to the first embodiment of the invention or the semiconductor optical amplifiers according to the second embodiment to the third embodiment of the invention, the second electrode is composed of the first section and the second section that are separated by the isolation trench, and the second section of the second electrode is provided in the carrier non-injection region. When the length of the first section is $L_{Amp-1}$ and the length of the second section is $L_{Amp-2}$, $0.001 \leq L_{Amp-2}/L_{Amp-1} \leq 0.01$ is desirably satisfied, and $0.0025 \leq L_{Amp-2}/L_{Amp-1} \leq 0.01$ is preferably satisfied. The electric resistance value between the first section and the second section of the second electrode in the semiconductor optical amplifier is $1 \times 10^2 \Omega$ or more, is preferably $1 \times 10^3 \Omega$ or more, and is more preferably $1 \times 10^4 \Omega$ or more. Further, the electric resistance value between the first section and the second section of the second electrode is $1 \times 10$ times or more the electric resistance value between the second electrode and the first electrode, is preferably $1 \times 10^2$ times or more the electric resistance value between the second electrode and the first electrode, and is more preferably $1 \times 10^3$ times or more the electric resistance value between the second electrode and the first electrode. Further, the width of the isolation trench that separates the second electrode into the first section and the second section is desirably 1 μm or more and 50% or less the length of the semiconductor optical amplifier, and is preferably 10 μm or more and 10% or less as much as the length of the semiconductor optical amplifier. Further, as the width of the isolation trench, a value from 3 μm to 20 μm both inclusive can be exemplified. As the length of the second section of the second electrode $L_{Amp-2}$, a value from 3 μm to 100 μm both inclusive can be exemplified.

In the semiconductor optical amplifier of the embodiment of the invention, a laser light source may be composed of a mode locking laser diode device, and pulse laser light outputted from the mode locking laser diode device may enter the semiconductor optical amplifier. In this case, the laser light source may output pulse laser light based on mode locking operation. However, the laser light source is not limited thereto. A known continuous oscillation laser light source, known various types of pulse oscillation laser light sources such as a gain switching laser light source and a loss switching laser light source (Q switching laser light source), and a laser light source such as a titanium sapphire laser are able to be used. The semiconductor optical amplifier of the embodiment of the invention is an amplifier that directly amplifies an optical signal in a state of light without converting the optical signal to an electric signal. The semiconductor optical amplifier of the embodiment of the invention has a laser structure excluding resonator effect as much as possible, and amplifies incident light by light gain of the semiconductor optical amplifier. That is, the semiconductor optical amplifier of the embodiment of the invention may substantially have the same composition and the same configuration as those of the laser diode device structuring the laser light source of the embodiment of the invention, and may have a composition and a configuration different from those of the laser diode device structuring the laser light source of the embodiment of the invention.

In the semiconductor optical amplifier of the embodiment of the invention, in the case where the laser light source is composed of the mode locking laser diode device as described above, the mode locking laser diode device (hereinafter referred to as "mode locking laser diode device of the embodiment of the invention") may include: a laminated structure in which a first compound semiconductor layer that has a first conductivity type and is composed of GaN compound semiconductor, a third compound semiconductor layer that has a light emitting region composed of GaN compound semiconductor, and a second compound semiconductor layer that has a second conductivity type different from the first conductivity type and is composed of GaN compound semiconductor are sequentially layered; the second electrode formed on the second compound semiconductor layer; and a first electrode electrically connected to the first compound semiconductor layer. The laminated structure may be formed on a compound semiconductor substrate having polarity. The third compound semiconductor layer may have a quantum well structure including a well layer and a barrier layer. In addition, though not limited, the thickness of the well layer is from 1 nm to 10 nm both inclusive, and is preferably from 1 nm to 8 nm both inclusive. The impurity doping concentration of the barrier layer is from $2 \times 10^{18}$ cm$^{-3}$ to $1 \times 10^{20}$ cm$^{-3}$ both inclusive, and is preferably from $1 \times 10^{19}$ cm$^{-3}$ to $1 \times 10^{20}$ cm$^{-3}$ both inclusive.

In driving the mode locking laser diode device of the embodiment of the invention, light pulse may be generated in the light emitting region by flowing a current from the second electrode to the first electrode through the laminated structure. Further, in the mode locking laser diode device of the embodiment of the invention, light pulse may be generated in the light emitting region by flowing a current from the second electrode to the first electrode through the laminated structure.

To enable mode locking operation of the laser diode device, the light emitting region and a saturable absorption region should be provided for the laser diode device. Based on arrangement state of the light emitting region and the saturable absorption region, the laser diode device is able to be generally categorized into SAL (saturable absorber layer) type or WI (weakly index guide) type in which the light emitting region and the saturable absorption region are arranged in vertical direction, and multielectrode type including bisection type in which the light emitting region and the saturable absorption region are arranged in line in the resonator direction. In the mode locking method, in a cubic (mainly GaAs) laser diode device, it has been confirmed that light pulse with time width of 0.6 psec is able to be generated (see "Appl. Phys. Lett. 39 (1981) 525," H. Yokoyama, et al.). Further, in the hexagonal (mainly GaAs) laser diode device, S. Gee et al. firstly reported generation of light pulse by using mode locking method in 2001 (see "Appl. Phys. Lett. 79 (2001) 1951," S. Gee and J. E. Bowers). However, according to "Appl. Phys. Lett. 79 (2001) 1951," the time width of light pulse is 30 psec, which is still long. Further, in the case where the multielectrode laser diode device is fabricated by using a substrate having polarity, specifically, for example, in the case where a multielectrode GaN laser diode device is provided on {0001} plane (C plane) of a GaN substrate, in some cases, saturable absorption is difficult to be controlled electrically due to QCSE effect (quantum confinement Stark effect) by internal electric field resulting from piezoelectric polarization or intrinsic polarization. That is, it has been found that in some cases, it is necessary to increase direct current value flown to the first electrode for obtaining mode locking operation and reverse bias voltage value applied to the saturable absorption region, subpulse component associated with main pulse is generated, or synchronization is difficult to be obtained between an external signal and light pulse.

In the mode locking laser diode device of the embodiment of the invention, it is preferable that the thickness of the well layer composing the third compound semiconductor layer is defined as a value from 1 nm to 10 nm both inclusive, and the impurity doping concentration of the barrier layer composing the third compound semiconductor layer is defined as a value from $2\times10^{18}$ cm$^{-3}$ to $1\times10^{20}$ cm$^{-3}$ both inclusive. That is, the thickness of the well layer is decreased, and carrier of the third compound semiconductor layer is increased. In the result, influence of piezoelectric polarization is able to be decreased, and a laser light source capable of generating single-peaked light pulse that has a short time width and small subpulse component is able to be obtained. Further, mode locking drive is able to be retained with low reverse bias voltage, and light pulse train in synchronization with an external signal (electric signal and optical signal) is able to be generated. Accordingly, the mode locking laser diode device of the embodiment of the invention is able to be applied as an oscillator that generates light pulse in a volumetric optical disc system, for example.

In the mode locking laser diode device of the embodiment of the invention, the third compound semiconductor layer may further include the saturable absorption region, the second electrode may be separated into the first section for obtaining forward bias state by flowing a current to the first electrode through the light emitting region and the second section for adding electric field to the saturable absorption region by an isolation trench. The forward bias state may be obtained by flowing a current from the first section of the second electrode to the first electrode through the light emitting region, and electric field may be added to the saturable absorption region by applying a voltage between the first electrode and the second section of the second electrode.

It is desirable that a reverse bias voltage is applied between the first electrode and the second section (that is, the first electrode is a cathode and the second section is an anode). A pulse current or a pulse voltage in synchronization with a pulse current or a pulse voltage applied to the first section of the second electrode, or direct current bias may be applied to the second section of the second electrode.

Further, in the mode locking laser diode device of the embodiment of the invention, the electric resistance value between the first section and the second section of the second electrode is $1\times10^2\Omega$ or more, is preferably $1\times10^3\Omega$ or more, and is more preferably $1\times10^4\Omega$ or more. Further, the electric resistance value between the first section and the second section of the second electrode is desirably 1×10 times or more as much as the electric resistance value between the second electrode and the first electrode, is preferably $1\times10^2$ times or more the electric resistance value between the second electrode and the first electrode, and is more preferably $1\times10^3$ times or more the electric resistance value between the second electrode and the first electrode.

In the case where the electric resistance value between the first section and the second section of the second electrode is $1\times10^2\Omega$ or more, or the electric resistance value between the first section and the second section of the second electrode is 10 times or more the electric resistance value between the second electrode and the first electrode, flow of leakage current from the first section to the second section of the second electrode is able to be inhibited securely. That is, a current injected to the light emitting region (carrier injection region, gain region) is able to be increased. At the same time, reverse bias voltage $V_{sa}$ applied to the saturable absorption region (carrier non-injection region) is able to be increased. In addition, such a high electric resistance value between the first section and the second section of the second electrode is able to be attained only by separating the second electrode into the first section and the second section by the isolation trench. That is, generation of light pulse by mode locking is able to be realized more easily.

Further, in the mode locking laser diode device of the embodiment of the invention, the width of the isolation trench that separates the second electrode into the first section and the second section is desirably 1 μm or more and 50% or less the resonator length, and is preferably 10 μm or more and 10% or less the resonator length. As the resonator length, though 0.3 mm can be exemplified. However, the value is not limited thereto. In the following description, the resonator direction is regarded as Z direction and the thickness direction of the laminated structure is regarded as Y direction. Further, the length of the saturable absorption region may be shorter than the length of the light emitting region. Further, the length of the second electrode (total length of the first section and the second section) may be shorter than the length of the third compound semiconductor layer. Examples of arrangement state of the first section and the second section of the second electrode include the following:

(1) State in which two first sections of the second electrode and one second section of the second electrode are provided, an end of the second section is opposed to one first section with one isolation trench in between, and the other end of the second section is opposed to the other first section with the other isolation trench in between (that is, the second electrode has a structure in which the second section is sandwiched between the first sections);
(2) State in which one first section of the second electrode and one second section of the second electrode are provided, and the first section of the second electrode and the second section of the second electrode are arranged with an isolation trench in between; and
(3) State in which one first sections of the second electrode and two second sections of the second electrode are provided, an end of the first section is opposed to one second section with one isolation trench in between, and the other end of the first section is opposed to the other second section with the other isolation trench in between. Specially, the structures (1) and (2) are desirable. Further, more generally, examples of arrangement state of the first section and the second section of the second electrode include the following:
(4) State that N pieces of the first sections of the second electrode and (N−1) pieces of the second sections of the second electrode are provided, and the second section of the second electrode is sandwiched between the first sections of the second electrode; and
(5) State that N pieces of the second sections of the second electrode and (N−1) pieces of the first sections of the second electrode are provided, and the first section of the second electrode is sandwiched between the second sections of the second electrode. In other words, the States 4 and 5 are described as follows:
(4') State that N pieces of light emitting regions [carrier injection region, gain region] and (N−1) pieces of saturable absorption regions [carrier non-injection region] are provided, and the saturable absorption region is sandwiched between the light emitting regions; and
(5') State that N pieces of saturable absorption regions [carrier non-injection region] and (N−1) pieces of light emitting regions [carrier injection region, gain region] are provided, and the light emitting region is sandwiched between the saturable absorption regions.

Further, in the driving method of the mode locking laser diode device of the embodiment of the invention, it is possible that a current is flown from the second electrode to the first electrode through the light emitting region, and an external electric signal is superimposed on the first electrode from the second electrode through the light emitting region. Thereby, light pulse is able to be sync with the external electric signal. Alternatively, an optical signal may enter from one end face of the laminated structure. Again, thereby light pulse is able to be sync with the optical signal.

Further, in the semiconductor optical amplifier of the embodiment of the invention or the mode locking laser diode device of the embodiment of the invention, doping impurity for the barrier layer may be silicon (Si). However, doping impurity is not limited thereto. As other doping impurity, oxygen (O) may be adopted.

Further, the mode locking laser diode device of the embodiment of the invention may be a laser diode device having a ridge stripe type separate confinement heterostructure (SCH structure). Alternatively, the mode locking laser diode device of the embodiment of the invention may be a laser diode device having an oblique ridge stripe type separate confinement heterostructure. The height of the ridge stripe structure is desirably from 0.1 μm to 10 μm both inclusive, and is preferably from 0.2 μm to 1 μm both inclusive. However, the value thereof is not limited thereto. Further, as the width of the ridge stripe structure, 2 μm or less is able to be exemplified, and as the lower limit of the width of the ridge stripe structure, for example, 0.8 μm is able to be exemplified. However, the value thereof is not limited thereto. Definition of the height of the ridge stripe structure is also able to be applied to the semiconductor optical amplifier of the embodiment of the invention.

The mode locking laser diode device of the embodiment of the invention is, for example, able to be manufactured by the following method. That is, the mode locking laser diode device of the embodiment of the invention is, for example, able to be manufactured by the following manufacturing method including the following respective steps:
(A) step of forming the laminated structure in which the first compound semiconductor layer that has the first conductivity type and is composed of GaN compound semiconductor, the third compound semiconductor layer that has the light emitting region composed of GaN compound semiconductor and the saturable absorption region, and the second compound semiconductor layer that has the second conductivity type different from the first conductivity type and is composed of GaN compound semiconductor are sequentially layered is formed;
(B) subsequent step of forming the strip-shaped second electrode on the second compound semiconductor layer;
(C) subsequent step of etching at least part of the second compound semiconductor layer with the use of the second electrode as an etching mask, and thereby forming the ridge stripe structure; and
(D) subsequent step of forming a resist layer for forming the isolation trench in the second electrode, and subsequently forming the isolation trench in the second electrode by wet etching method with the use of the resist layer as a wet etching mask, and thereby separating the second electrode into the first section and the second section by the isolation trench.

The ridge stripe structure is formed by adopting the foregoing manufacturing method, that is, by etching at least part of the second compound semiconductor layer with the use of the strip-shaped second electrode as an etching mask. That is, the ridge stripe structure is formed by self alignment method by using the patterned second electrode as an etching mask. Thus, there is no joint misalignment between the second electrode and the ridge stripe structure. Further, the isolation trench is formed in the second electrode by wet etching method. By adopting wet etching method as described above, deterioration of the optical and electric characteristics of the second compound semiconductor layer is able to be inhibited differently from dry etching method. Accordingly, deterioration of light emitting characteristics is able to be securely prevented.

In the step (C), part of the second compound semiconductor layer may be etched in the thickness direction, all of the second compound semiconductor layer may be etched in the thickness direction, the second compound semiconductor layer and the third compound semiconductor layer may be etched in the thickness direction, or part of the second compound semiconductor layer, the third compound semiconductor layer, and the first compound semiconductor layer may be etched in the thickness direction.

Further, when etching rate of the second electrode is $ER_1$ and etching rate of the laminated structure is $ER_1$ in forming the isolation trench in the second electrode in the foregoing step D, $ER_0/ER_1 \geq 1 \times 10$ is desirably satisfied, and $ER_0/ER_1 \geq 1 \times 10^2$ is preferably satisfied. In the case where $ER_0/ER_1$ satisfies the foregoing relation, the second electrode is able to be securely etched without etching the laminated structure (or if the laminated structure is etched, the etching portion is little.)

The semiconductor optical amplifier of the embodiment of the invention is able to be substantially manufactured by a manufacturing method similar to the manufacturing method of the foregoing mode locking laser diode device of the embodiment of the invention though depending on the form thereof. However, the manufacturing method thereof is not limited thereto.

In the mode locking laser diode device of the embodiment of the invention, the second electrode may be composed of a palladium (Pd) single layer, a nickel (Ni) single layer, a platinum (Pt) single layer, or a laminated structure of a palladium layer and a platinum layer in which the palladium layer is in contact with the second compound semiconductor layer, or a laminated structure of a palladium layer and a nickel layer in which the palladium layer is in contact with the second compound semiconductor layer. In the case where the lower metal layer is composed of palladium, and the upper metal layer is composed of nickel, the thickness of the upper metal layer is desirably 0.1 µm or more, and is preferably 0.2 µm or more. Further, the second electrode is preferably composed of the palladium (Pd) single layer. In this case, the thickness thereof is desirably 20 nm or more, and is preferably 50 nm or more. Further, the second electrode is preferably composed of a palladium (Pd) single layer, a nickel (Ni) single layer, a platinum (Pt) single layer, or a laminated structure of a lower metal layer and an upper metal layer in which the lower metal layer is in contact with the second compound semiconductor layer (however, the lower metal layer is composed of one metal selected from the group consisting of palladium, nickel, and platinum; and the upper metal layer is composed of a metal having etching rate in forming the isolation trench in the second electrode in the foregoing step (D) equal to, similar to, or higher than etching rate of the lower metal layer). Further, an etching liquid used in forming the isolation trench in the second electrode in the foregoing step (D) is desirably aqua regia, nitric acid, vitriolic acid, muriatic acid, or a mixed liquid composed of at least two types out of these acids (specifically, a mixed liquid composed of nitric acid and vitriolic acid, or a mixed liquid composed of nitric acid and muriatic acid). The width of the second electrode is desirably from 0.5 µm to 50 µm both inclusive, and is preferably from 1 µm to 5 µm both inclusive. The structure of the second electrode in the foregoing mode locking laser diode device of the embodiment of the invention is able to be also applied to the semiconductor optical amplifier of the embodiment of the invention though depending on the form thereof.

In the semiconductor optical amplifier of the embodiment of the invention or the mode locking laser diode device of the embodiment of the invention, the laminated structure may be composed of AlGaInN compound semiconductor. Specific examples of AlGaInN compound semiconductor include GaN, AlGaN, GaInN, and AlGaInN. Further, such a compound semiconductor may include boron (B) atom, thallium (Tl) atom, arsenic (As) atom, phosphorus (P) atom, or antimony (Sb) atom according to needs. Further, the third compound semiconductor layer structuring a light amplification region or the light emitting region (gain region) and the saturable absorption region (in some cases, the third compound semiconductor layer is referred to as "active layer") has the quantum well structure. Specifically, the third compound semiconductor layer may have single quantum well structure [QW structure], or multiquantum well structure [MQW structure]. The third compound semiconductor layer having the quantum well structure has a structure in which at least one well layer and at least one barrier layer are layered. As a combination of compound semiconductor composing the well layer and compound semiconductor composing the barrier layer, $(In_yGa_{(1-y)}N, GaN)$, $(In_yGa_{(1-y)}N, In_zGa_{(1-z)}N)$ (y>z), and $(In_yGa_{(1-y)}N, AlGaN)$ can be exemplified.

Further, in the mode locking laser diode device of the embodiment of the invention, the second compound semiconductor layer may have a superlattice structure in which a p-type GaN layer and a p-type AlGaN layer are alternately layered. The thickness of the superlattice structure may be 0.7 µm or less. By adopting such a superlattice structure, while a refractive index necessary as a cladding layer is maintained, a series resistance component of the laser diode device is able to be decreased, leading to realizing a low operation voltage of the laser diode device. Though the lower limit value of the thickness of the superlattice structure is not limited, the lower limit value is, for example, 0.3 µm. As the thickness of the p-type GaN layer composing the superlattice structure, a thickness from 1 nm to 5 nm both inclusive can be exemplified. As the thickness of the p-type AlGaN layer composing the superlattice structure, a thickness from 1 nm to 5 nm both inclusive can be exemplified. As the total number of layers of the p-type GaN layer and the p-type AlGaN layer, the number from 60 layers to 300 layers both inclusive can be exemplified. Further, the distance from the third compound semiconductor layer to the second electrode may be 1 µm or less, and preferably 0.6 µm or less. By defining the distance from the third compound semiconductor layer to the second electrode, the thickness of the p-type second compound semiconductor layer having high resistance is able to be decreased, and the operation voltage of the laser diode device is able to be decreased. Though the lower limit value of the distance from the third compound semiconductor layer to the second electrode is not limited, for example, the lower limit value of the distance from the third compound semiconductor layer to the second electrode is 0.3 µm. Further, the second compound semiconductor layer may be doped with Mg at the level of $1 \times 10^{19}$ cm$^{-3}$ or more. The absorption coefficient of the second compound semiconductor layer to light in 405 nm wavelength from third compound semiconductor layer may be at least 50 cm$^{-1}$. The atom concentration of Mg comes from material property that the maximum hole concentration is shown at the value of $2 \times 10^{19}$ cm$^{-3}$, and is a result of design that the maximum hole concentration, that is, the specific resistance of the second compound semiconductor layer becomes the minimum. The absorption coefficient of the second compound semiconductor layer is defined in viewpoint of decreasing resistance of the laser diode device as much as possible. In the result, in general, the absorption coefficient of light of the third compound semiconductor layer becomes 50 cm$^{-1}$. However, it is possible that the Mg dope amount is intentionally set to the concentration of $2 \times 10^{19}$ cm$^{-3}$ or more in order to increase the absorption coefficient. In this case, the upper limit Mg dope amount for obtaining a practical hole concentration is, for example, $8 \times 10^{19}$ cm$^{-3}$. Further, the second compound semiconductor layer may have a non-doped compound semiconductor layer and a p-type compound semiconductor layer from the third compound semiconductor layer side. The distance from the third compound semiconductor layer to the p-type compound semiconductor layer may be $1.2 \times 10^{-7}$ m or less. By defining the distance from the third compound semiconductor layer to the p-type compound semiconductor layer as above, internal loss is able to be suppressed in a range in which the internal quantum efficiency is not lowered. Thereby, threshold current $I_{th}$ at which laser oscillation is started is able to be decreased. Though the lower limit value of the distance from the third compound semiconductor layer to the p-type compound semiconductor layer is not limited, for example, the lower limit value is $5 \times 10^{-8}$ m. Further, on both side faces of the ridge section, a laminated insulating film composed of SiO$_2$/Si laminated structure may be formed. The difference between the effective refractive index of the ridge section and the effective refractive index of the laminated insulating film may be from $5\times10^{-3}$ to $1\times10^{-2}$ both inclusive. By using such a laminated insulating film, even in the case of high output operation exceeding 100 mW, single fundamental lateral mode is able to be maintained. Further, the second compound semiconductor layer may have a structure in which a non-doped GaInN layer (p-side light guide layer), a non-doped AlGaN layer (p-side cladding layer), a Mg doped AlGaN layer (electron barrier layer), a superlattice structure (superlattice cladding layer) composed of a GaN layer (Mg doped)/AlGaN layer, and a Mg doped GaN layer (p-side contact layer) are layered from the third compound semiconductor layer side. The bandgap of compound semiconductor composing the well layer in the third compound semiconductor layer is desirably 2.4 eV or more. Further, the wavelength of laser light outputted from the third compound semiconductor layer is desirably from 360 nm to 500 nm both inclusive, and is preferably from 400 nm to 410 nm both inclusive. It is needless to say that the foregoing various structures are able to be combined as appropriate. The above-mentioned structure in the foregoing mode locking laser diode device of the embodiment of the invention is also applicable to the semiconductor optical amplifier of the embodiment of the invention substantially though depending on the form thereof.

As described above, in the second compound semiconductor layer, a non-doped compound semiconductor layer (for example, a non-doped GaInN layer or a non-doped AlGaN layer) may be formed between the third compound semiconductor layer and the electron barrier layer. Further, a non-doped GaInN layer as a light guide layer may be formed between the third compound semiconductor layer and the non-doped compound semiconductor layer. The uppermost layer of the second compound semiconductor layer may have a structure occupied by a Mg doped GaN layer (p-side contact layer).

Various GaN compound semiconductor layers composing the semiconductor optical amplifier of the embodiment of the invention or the mode locking laser diode device of the embodiment of the invention are sequentially formed over a substrate. Examples of the substrate include a GaAs substrate, a GaN substrate, an SiC substrate, an alumina substrate, a ZnS substrate, a ZnO substrate, an MN substrate, a LiMgO substrate, a LiGaO$_2$ substrate, a MgAl$_2$O$_4$ substrate, an InP substrate, an Si substrate, and a laminated body in which a foundation layer and a buffer layer are formed on the surface (main face) of the foregoing substrate in addition to a sapphire substrate. Mainly, in the case where the GaN compound semiconductor layer is formed on the substrate, the GaN substrate has the preference due to its small defect density. However, it is known that in the GaN substrate, its characteristics are changed from/to polarity, non-polarity, and semi-polarity according to the growth plane. Further, examples of methods of forming the various GaN compound semiconductor layers composing the semiconductor optical amplifier of the embodiment of the invention or the mode locking laser diode device of the embodiment of the invention include metal organic chemical vapor deposition method (MOCVD method and MOVPE method), molecular beam epitaxy method (MBE method), and hydride vapor growth method in which halogen contributes to transfer or reaction and the like.

Examples of organic gallium source gas in MOCVD method include trimethyl gallium (TMG) gas and triethyl gallium (TEG) gas. Examples of nitrogen source gas include ammonia gas and hydrazine gas. In forming the GaN compound semiconductor layer having n-type conductivity type, for example, silicon (Si) may be added as n-type impurity (n-type dopant). In forming the GaN compound semiconductor layer having p-type conductivity type, for example, magnesium (Mg) may be added as p-type impurity (p-type dopant). Further, in the case where aluminum (Al) or indium (In) is contained as a component atom of the GaN compound semiconductor layer, trimethyl aluminum (TMA) gas may be used as an Al source, and trimethyl indium (TMI) gas may be used as an In source. Further, monosilane gas (SiH$_4$ gas) may be used as a Si source, and ciclopentadienyl magnesium gas, methylciclopentadienyl magnesium, or bisciclopentadienyl magnesium (Cp$_2$Mg) may be used as a Mg source. Examples of n-type impurity (n-type dopant) include Ge, Se, Sn, C, Te, SO, Pd, and Po in addition to Si. Examples of p-type impurity (p-type dopant) include Zn, Cd, Be, Ca, Ba, C, Hg, and Sr in addition to Mg.

When the first conductive type is n type, the first electrode electrically connected to the first compound semiconductor layer having n-type conductivity type desirably has a single layer structure or a multilayer structure containing at least one metal selected from the group consisting of gold (Au), silver (Ag), palladium (Pd), Al (aluminum), Ti (titanium), tungsten (W), Cu (copper), Zn (zinc), tin (Sn) and indium (In), and for example, Ti/Au, Ti/Al, and Ti/Pt/Au are able to be exemplified. The first electrode is electrically connected to the first compound semiconductor layer. The first electrode may be formed on the first compound semiconductor layer, and the first electrode may be connected to the first compound semiconductor layer with a conductive material layer or a conducive substrate in between. The first electrode and the second electrode are able to be formed by PVD method such as vacuum evaporation method and sputtering method.

A pad electrode may be provided on the first electrode and the second electrode in order to obtain electrical connection to an external electrode or a circuit. The pad electrode desirably has a single layer structure or a multilayer structure containing at least one metal selected from the group consisting of Ti (titanium), aluminum (Al), Pt (platinum), Au (gold), and Ni (nickel). Otherwise, the pad electrode may have a multilayer structure exemplified as a Ti/Pt/Au multilayer structure and a Ti/Au multilayer structure.

The mode locking laser diode device of the embodiment of the invention may further include an external reflecting mirror. That is, the mode locking laser diode device of the embodiment of the invention may be an external resonator type mode locking laser diode device. Alternatively, the mode locking laser diode device of the embodiment of the invention may be a monolithic mode locking laser diode device. The external resonator type mode locking laser diode device may be light condensing type, or collimation type. In the external resonator type mode locking laser diode device, light reflectance on one end face of a laminated structure from which light pulse is outputted is preferably 0.5% or less. The light reflectance value is significantly lower than the light reflectance on one end face of a laminated structure from which light pulse is outputted in existing laser diode devices (in general, from 5% to 10% both inclusive). In the external resonator mode locking laser diode device, the value of the external resonator (Z', unit mm) desirably satisfies $0<Z'<1500$, and is preferably satisfies $30 \leq Z' \leq 150$.

The embodiment of the invention is applicable to various fields such as the optical disc system, the communication field, the optical information field, the photoelectronic integration circuit, the field applying nonlinear optical phenomenon, the optical switch, the laser measurement field and various analysis fields, the ultrafast spectroscopy field, the multiphoton excitation spectroscopy field, the mass analysis field, the microspectroscopic field using multiphoton absorption, quantum control of chemical reaction, the nano three-dimensional processing field, various processing fields applying multiphoton absorption, the medical field, and the bio imaging field.

First Example

Figure 2:
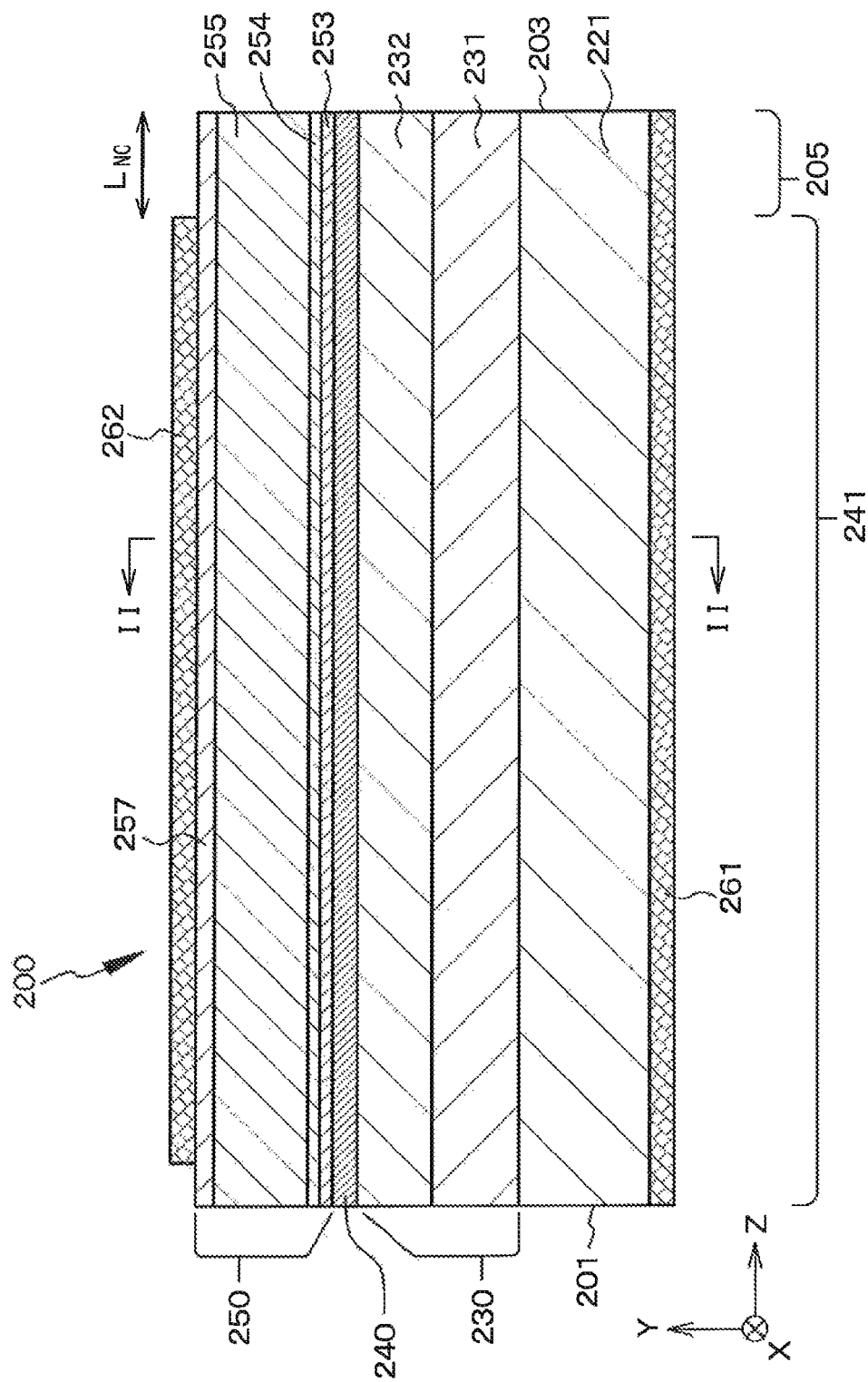
FIG. 2 is a schematic cross sectional view of the semiconductor optical amplifier where the semiconductor optical amplifier is cut along a virtual vertical plane (YZ plane) including an axis line (Z direction) of the semiconductor optical amplifier of the first example.
Figure 3:
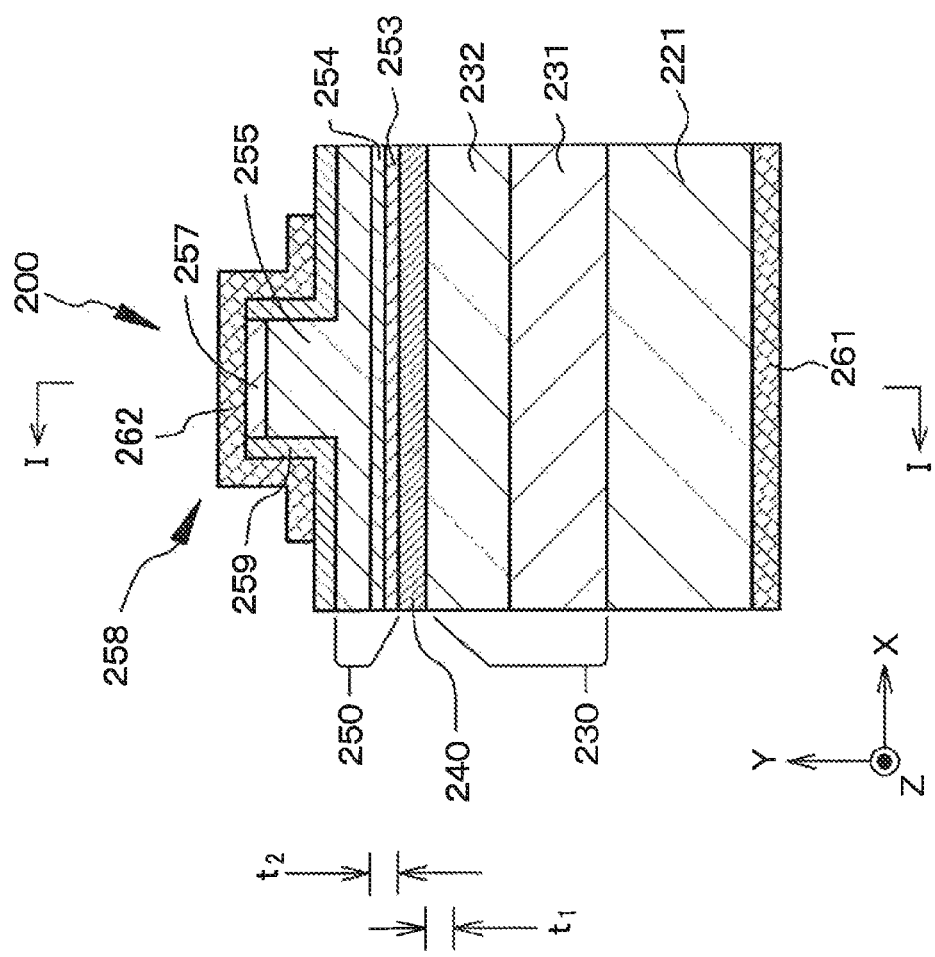
FIG. 3 is a schematic cross sectional view of the semiconductor optical amplifier where the semiconductor optical amplifier is cut along a virtual vertical plane (XY plane) orthogonal to the axis line of the semiconductor optical amplifier of the first example.
Figure 4:
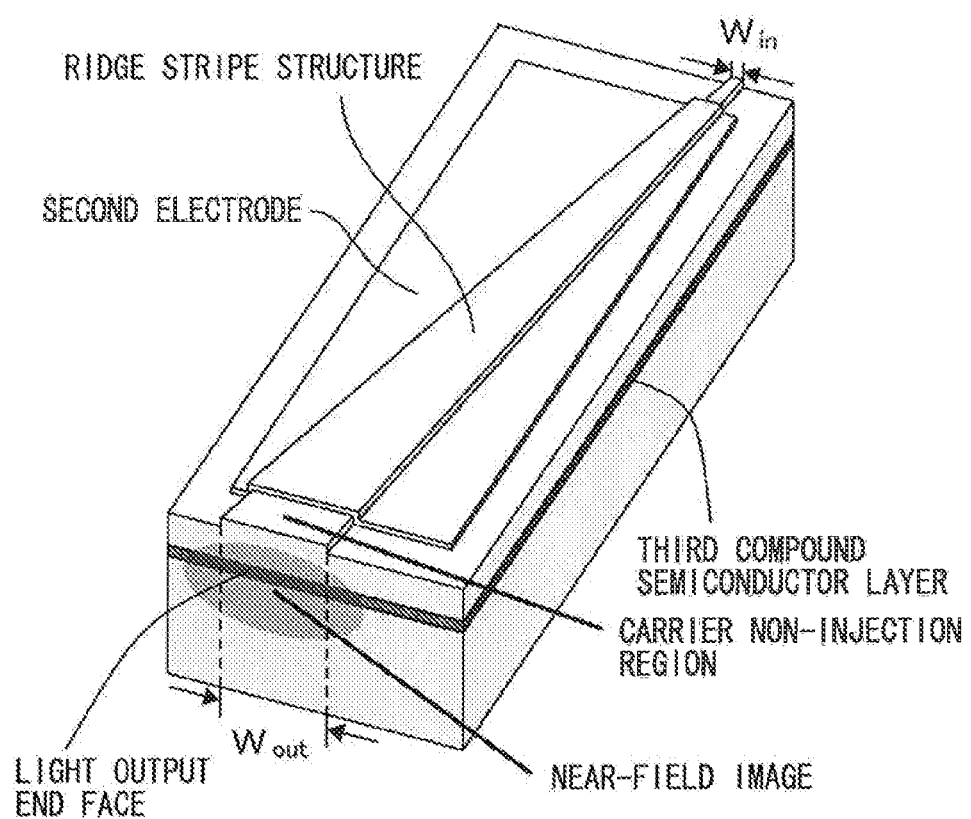
FIG. 4 is a schematic perspective view of the semiconductor optical amplifier of the first example.
Figure 5:
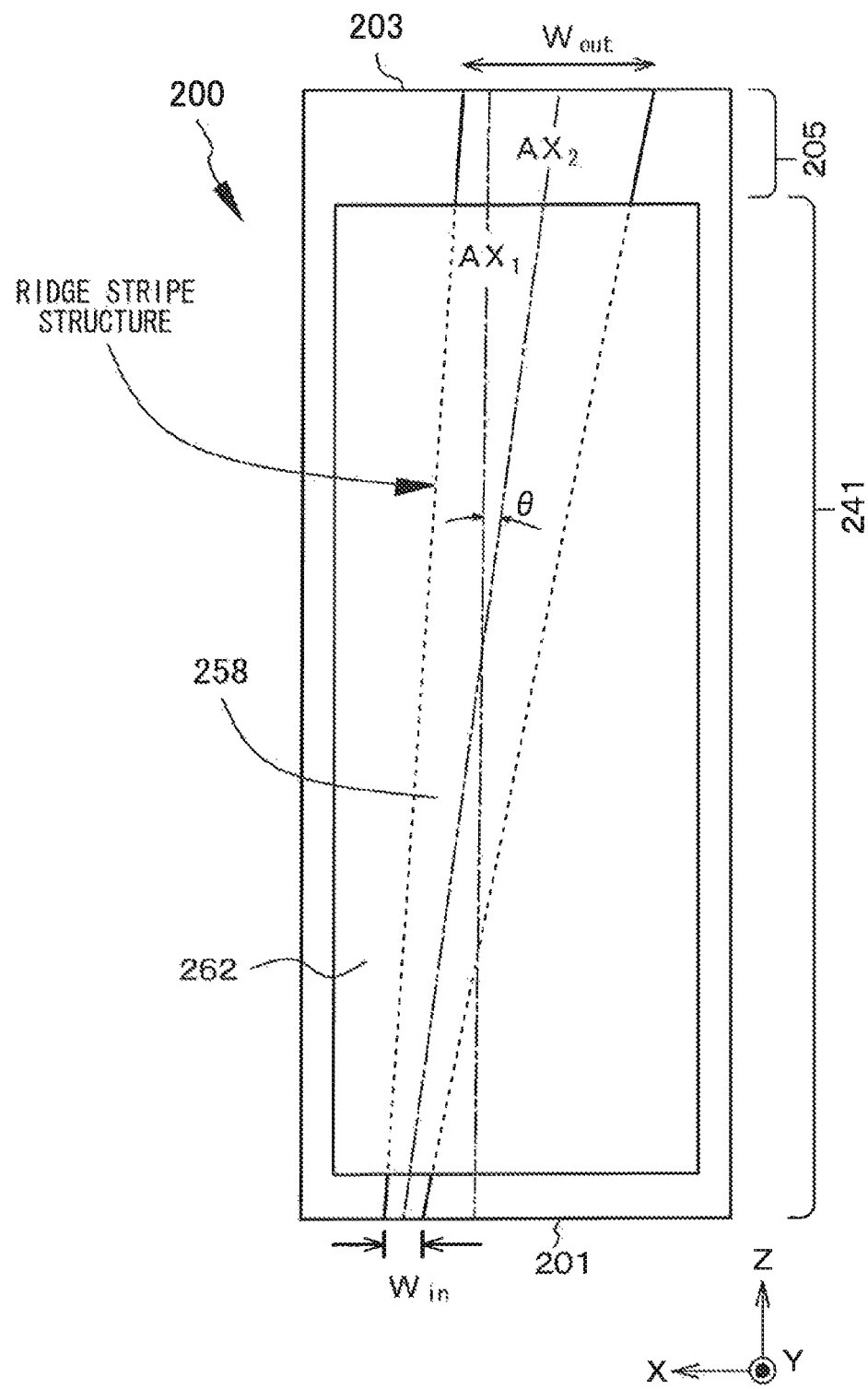
FIG. 5 is a schematic plan view of a ridge stripe structure in the semiconductor optical amplifier of the first example.

The first example relates to the semiconductor optical amplifier according to the first embodiment of the invention. FIG. 1 illustrates a conceptual view of a light output device of the first example including the semiconductor optical amplifier. FIG. 2 illustrates a schematic cross sectional view of the semiconductor optical amplifier where the semiconductor optical amplifier is cut along a virtual vertical plane (YZ plane) including an axis line of the semiconductor optical amplifier (direction in which a light guide extends, and is referred to as "Z direction" for convenience sake). FIG. 3 illustrates a schematic cross sectional view of the semiconductor optical amplifier where the semiconductor optical amplifier is cut along a virtual vertical plane (XY plane) orthogonal to the axis line of the semiconductor optical amplifier. FIG. 2 is a schematic cross sectional view taken along line I-I of FIG. 3. FIG. 3 is a schematic cross sectional view taken along line II-II of FIG. 2. FIG. 4 illustrates a schematic perspective view of the semiconductor optical amplifier. FIG. 5 illustrates a schematic plan view of a ridge stripe structure.

The light output device of the first example includes a laser light source 100 and a semiconductor optical amplifier 200 that optically amplifies laser light from the laser light source 100 and outputs amplified light.

As illustrated in FIG. 1, the semiconductor optical amplifier 200 is composed of a transmissive semiconductor optical amplifier. Low reflective coating layers (AR) 202 and 204 are formed on a light incident end face 201 of the semiconductor optical amplifier 200 and a light output end face 203 opposed to the light incident end face 201. The low reflecting coating layers 202 and 204 have a structure in which a titanium oxide layer and an aluminum oxide layer are layered. The laser light entering from the light incident end face 201 side is optically amplified inside the semiconductor optical amplifier 200, and is outputted from the light output end face 203 on the opposite side of the light incident end face 201 side. The laser light is fundamentally guided in only one direction. Further, in the first example, the laser light source 100 is composed of a known continuous oscillation laser equipment. Laser light outputted from the laser equipment enters the semiconductor optical amplifier 200.

In the light output device of the first example illustrated in FIG. 1, laser light outputted from the laser light source 100 enters a reflecting mirror 20 through a light isolator 15 and a reflecting mirror 16. Laser light reflected by the reflecting mirror 20 passes through a half-wave plate (λ/2 wave plate) 21 and a lens 22, and enters the semiconductor optical amplifier 200. The light isolator 15 is arranged to prevent returned light from the semiconductor optical amplifier 200 from heading for the laser light source 100. The laser light is optically amplified in the semiconductor optical amplifier 200, and is outputted outside the system through a lens 30.

The semiconductor optical amplifier 200 includes: a laminated structure in which a first compound semiconductor layer 230 that has a first conductivity type (in the first example, specifically, n-type conductivity type) and is composed of GaN compound semiconductor, a third compound semiconductor layer (active layer) 240 that has a light amplification region (carrier injection region, gain region) 241 composed of GaN compound semiconductor, and a second compound semiconductor layer 250 that has a second conductivity type different from the first conductivity type (in the first example, specifically, p-type conductivity type) and is composed of GaN compound semiconductor are sequentially layered; a second electrode 262 formed on the second compound semiconductor layer 250; and a first electrode 261 electrically connected to the first compound semiconductor layer 230.

In the semiconductor optical amplifier 200 of the first example, the laminated structure has the ridge stripe structure. When the width of the ridge stripe structure in the light output end face 203 is $W_{out}$, and the width of the ridge stripe structure in the light incident end face 201 is $W_{in}$, $W_{out} > W_{in}$ is satisfied. Specifically, $W_{out}$ is 15 µm and $W_{in}$ is 1.4 µm. A carrier non-injection region 205 is provided in an internal region of the laminated structure from the light output end face 203 along axis line $AX_1$ of the semiconductor optical amplifier 200. When length of the carrier non-injection region 205 along the axis line $AX_1$ of the semiconductor optical amplifier 200 (width of the carrier non-injection region 205) is $L_{NC}$, $L_{NC}$=5 µm is satisfied. The second electrode 262 is not provided in the carrier non-injection region 205. The length of the entire semiconductor optical amplifier is 2.0 mm. The carrier non-injection region is also provided in an internal region of the laminated structure from the light incident end face 201 along the axis line of the semiconductor optical amplifier 200.

More specifically, the semiconductor optical amplifier 200 of the first example has a ridge stripe type separate confinement heterostructure (SCH structure). In addition, the semiconductor optical amplifier 200 of the first example has a structure similar to a GaN laser diode structure composed of an index guide type AlGaInN. The width of the ridge stripe structure is gently and flatly extended in tapered shape from the light incident end face 201 to the light output end face 203. Further, the axis line $AX_1$ of the semiconductor optical amplifier 200 intersects with axis line $AX_2$ of the ridge stripe structure at a given angle, specifically at θ=5.0 deg. The axis line $AX_1$ and the axis line $AX_2$ are indicated by dotted lines in FIG. 5.

The laminated structure is formed on a compound semiconductor substrate 221. Specifically, the semiconductor optical amplifier 200 is provided on (0001) plane of the n-type GaN substrate 221. The (0001) plane of the n-type GaN substrate 221 is also called "C plane," and is a crystal plane having polarity. The first compound semiconductor layer 230, the third compound semiconductor layer 240, and the second compound semiconductor layer 250 are specifically composed of AlGaInN compound semiconductor. More specifically, the first compound semiconductor layer 230, the third compound semiconductor layer 240, and the second compound semiconductor layer 250 have a layer structure illustrated in the following Table 1. In Table 1, the listed items are shown in the order from the layer farthest from the n-type GaN substrate 221 to the layer closest to the n-type GaN substrate 221. The bandgap of compound semiconductor composing the well layer in the third compound semiconductor layer 240 is 3.06 eV. The third compound semiconductor layer 240 has a quantum well structure including a well layer and a barrier layer. The doping concentration of impurity (specifically, silicon (Si)) of the barrier layer is from $2 \times 10^{17}$ cm$^{-3}$ to $1 \times 10^{20}$ cm$^{-3}$ both inclusive.

TABLE 1

Second compound semiconductor layer 250
p-type GaN contact layer (Mg doped) 257
p-type AlGaN (Mg doped) cladding layer 255
p-type GaN (Mg doped) layer 254
p-type AlGaN electron barrier layer (Mg doped) 253
Third compound semiconductor layer 240
GaInN quantum well active layer
(well layer: $Ga_{0.92}In_{0.08}N$/barrier layer: $Ga_{0.98}In_{0.02}N$)
First compound semiconductor layer 230
n-type GaN layer 232
n-type AlGaN cladding layer 231
well layer (two layers): 10 nm [non-doped]
barrier layer (three layers): 12 nm [doping concentration (Si): $2 \times 10^{18}$ cm$^{-3}$]

Further, part of the p-type GaN contact layer 257 and part of the p-type AlGaN cladding layer 255 are removed by RIE method, and a ridge stripe structure (ridge section 258) is formed. On both sides of the ridge section 258, a laminated insulating film 259 composed of $SiO_2$/Si is formed. The $SiO_2$ layer is the lower layer and the Si layer is the upper layer. The difference between the effective refractive index of the ridge section 258 and the effective refractive index of the laminated insulating film 259 is from $5 \times 10^{-3}$ to $1 \times 10^{-2}$ both inclusive, and specifically $7 \times 10^{-3}$. On the p-type GaN contact layer 257 corresponding to the top face of the ridge section 258 to part of the top face of the p-type AlGaN cladding layer 255, the second electrode (p-type ohmic electrode) 262 is formed. Meanwhile, on the rear face of the n-type GaN substrate 221, the first electrode (n-type ohmic electrode) 261 composed of Ti/Pt/Au is formed. In the first example, the second electrode 262 is formed from a Pd single layer having a thickness of 0.1 μm.

The thickness of the p-type AlGaN cladding layer 255 is 400 nm. The thickness of the p-type GaN layer 254 is 100 nm. The thickness of the p-type GaN electron barrier layer 253 is 20 nm. The thickness of the p-type GaN contact layer 257 is 100 nm. Further, the p-type AlGaN electron barrier layer 253, the p-type GaN layer 254, and the p-type AlGaN cladding layer 255, and the p-type GaN contact layer 257 composing the second compound semiconductor layer 250 are doped with Mg at the level of $1 \times 10^{19}$ cm$^{-3}$ or more (specifically at the level of $2 \times 10^{19}$ cm$^{-3}$). Meanwhile, the thickness of the n-type AlGaN cladding layer 231 is 2.5 μm, and the thickness of the n-type GaN layer 232 is 200 nm. When the thickness of the n-type compound semiconductor layer sandwiched between the n-type AlGaN cladding layer 231 and the third compound semiconductor layer 240 (thickness of the n-type GaN layer 232) is $t_1$, and the thickness of the p-type compound semiconductor layer sandwiched between the p-type AlGaN cladding layer 255 and the third compound semiconductor layer 240 (total thickness of the p-type GaN layer 254 and the p-type AlGaN electron barrier layer 253) is $t_2$, $t_1 = 200$ nm, $t_2 = 120$ nm, and $0.1 \leq t_2/t_1 < 1$ are satisfied.

Figure 6A:
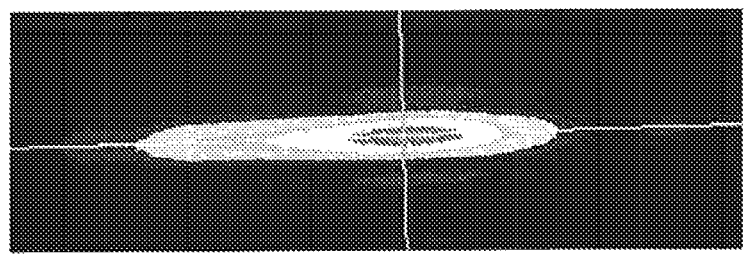
FIGS. 6A and 6B are respectively near-field images of laser light outputted from the semiconductor optical amplifier of the first example and a semiconductor optical amplifier of Comparative example 1.
Figure 6B:
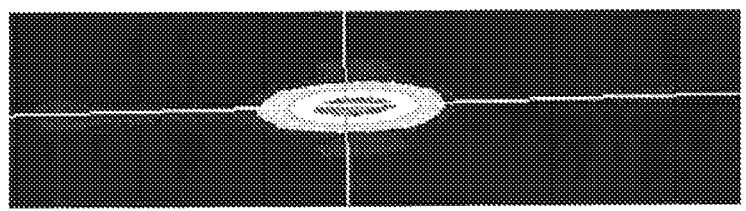

In the first example, single mode continuous oscillation laser light in wavelength of 405 nm (light output: 15 milliwatt) entered the semiconductor optical amplifier 200. A direct current of 600 milliampere was flown from the second electrode 262 to the first electrode 261. In the case where the value of the direct current is converted to a value per 1 cm$^2$ of the third compound semiconductor layer 240 structuring the light incident end face 201, the value is $3.7 \times 10^3$ ampere/cm$^2$. A near-field image of laser light outputted from the semiconductor optical amplifier 200 at this time is illustrated in FIG. 6A. As Comparative example 1, a semiconductor optical amplifier having the same composition and the same structure as those of first example was fabricated, except that the carrier non-injection region 205 was not provided. A near-field image of laser light outputted from a semiconductor optical amplifier of Comparative example 1 in the case where a direct current of 600 milliampere was flown from the second electrode to the first electrode is illustrated in FIG. 6B. As evidenced by FIG. 6B, in the semiconductor optical amplifier of Comparative example 1, the width of the near-field image was narrower than $W_{out}$ (15 μm), and its $1/e^2$ width was 5 μm (half bandwidth: 3.1 μm). The inventors of the invention firstly found that such a phenomenon is a phenomenon unique to nitride semiconductor system semiconductor optical amplifiers. Such a narrow near-field image adversely affects saturation and reliability of amplified light output. The light intensity density of laser light outputted from the semiconductor optical amplifier of Comparative example 1 was 47 milliwatt. Meanwhile, as evidenced by FIG. 6A, in the semiconductor optical amplifier 200 of the first example, the mode field was broadened, the width of the near-field image was wide and its $1/e^2$ width was 11.5 μm (half bandwidth: 5.8 μm). Further, the light intensity density of laser light outputted from the semiconductor optical amplifier 200 of the first example was 122 milliwatt. The amplified light output was higher than that of the semiconductor optical amplifier of Comparative example 1. As described above, it was confirmed that the amplified light output was significantly increased by providing the carrier non-injection region 205. Further, the value of (width of the ridge stripe structure in the light output end face)/(width of the laser light outputted from the semiconductor optical amplifier) was 1.3. The width of the laser light outputted from the semiconductor optical amplifier means $1/e^2$ width in a near-field image, that is, width of a near-field image having $1/e^2$ intensity to the peak intensity.

It is presumed that the width of the near-field image of outputted laser light is broadened by providing the carrier non-injection region 205 for the following reason. That is, carrier distribution in the laminated structure in XY plane is in the shape of a mountain having one peak if the light intensity of the incident laser light is low. However, if the light intensity of the incident laser light is increased, carrier injection/diffusion in the laminated structure of the semiconductor optical amplifier are not performed sufficiently, and thus the carrier distribution in the laminated structure in XY plane becomes in the shape of a mountain having two peaks (mountain/valley/mountain-like light intensity pattern). It is known that in the case where the number of carriers is decreased in the compound semiconductor layer, relative refractive index of the compound semiconductor layer is increased. Thus, laser light outputted from the light output end face of the semiconductor optical amplifier is difficult to be broadened in the width direction, and the width of the near-field image was narrower than $W_{out}$. In addition, since the area occupying the light output end face of the region from which laser light is outputted from the semiconductor optical amplifier is small, high output of the semiconductor optical amplifier is difficult to be realized.

Meanwhile, in the semiconductor optical amplifier of the first example, the carrier non-injection region 205 not contributing to light amplification is provided. Thus, even if the light intensity of incident laser light is increased, the phenomenon that relative refractive index is increased due to carrier distribution is able to be suppressed from being generated. Thus, laser light outputted from the light output end face of the semiconductor optical amplifier is easily broadened in the width direction. In addition, since the area occupying the light output end face of the region from which laser light is outputted from the semiconductor optical amplifier is large, high output of the semiconductor optical amplifier is able to be realized.

Second Example

Figure 7:
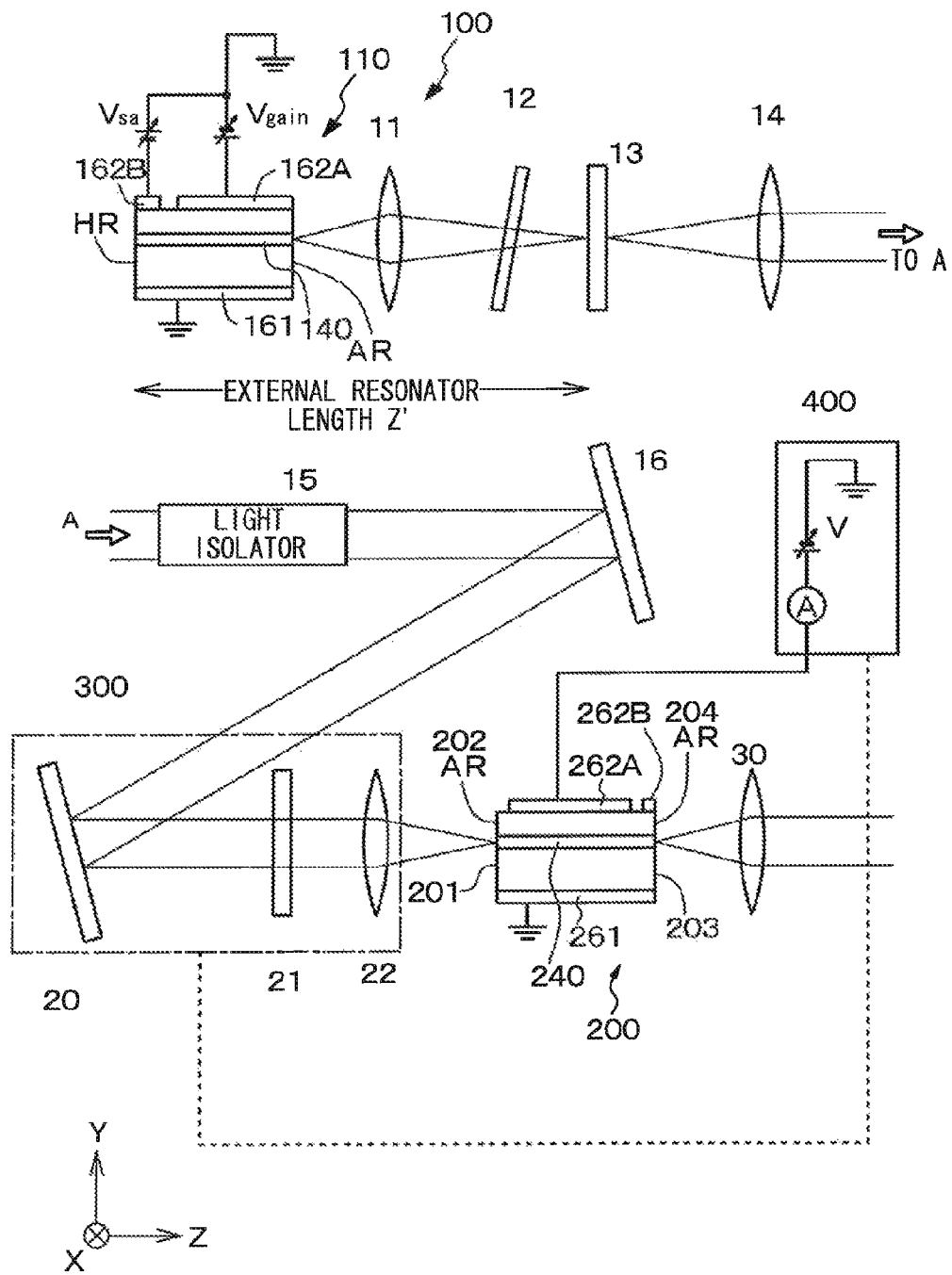
FIG. 7 is a conceptual view of a light output device of a second example including the semiconductor optical amplifier.
Figure 8:
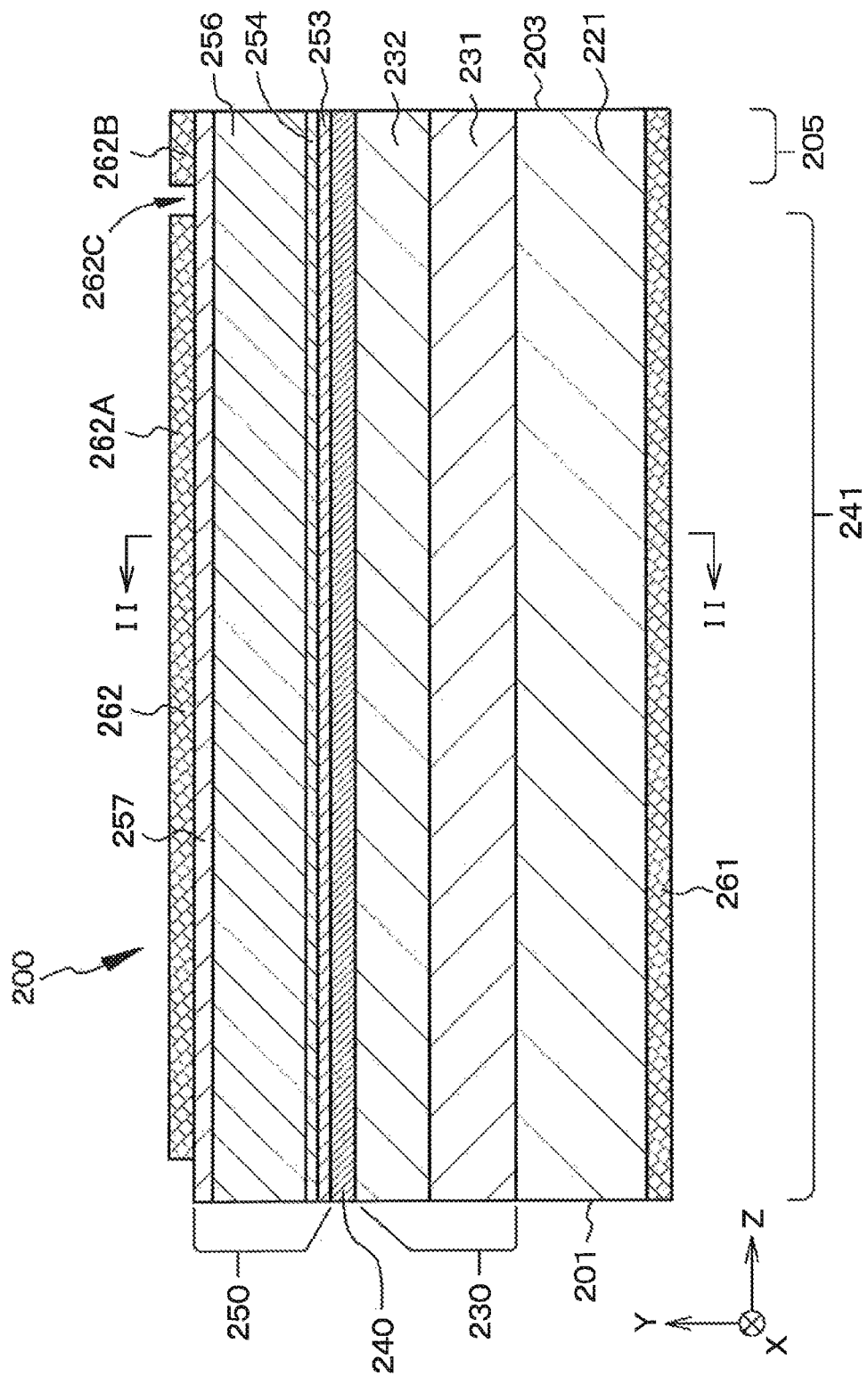
FIG. 8 is a schematic cross sectional view of the semiconductor optical amplifier where the semiconductor optical amplifier is cut along a virtual vertical plane (YZ plane) including an axis line (Z direction) of the semiconductor optical amplifier of the second example.
Figure 9:
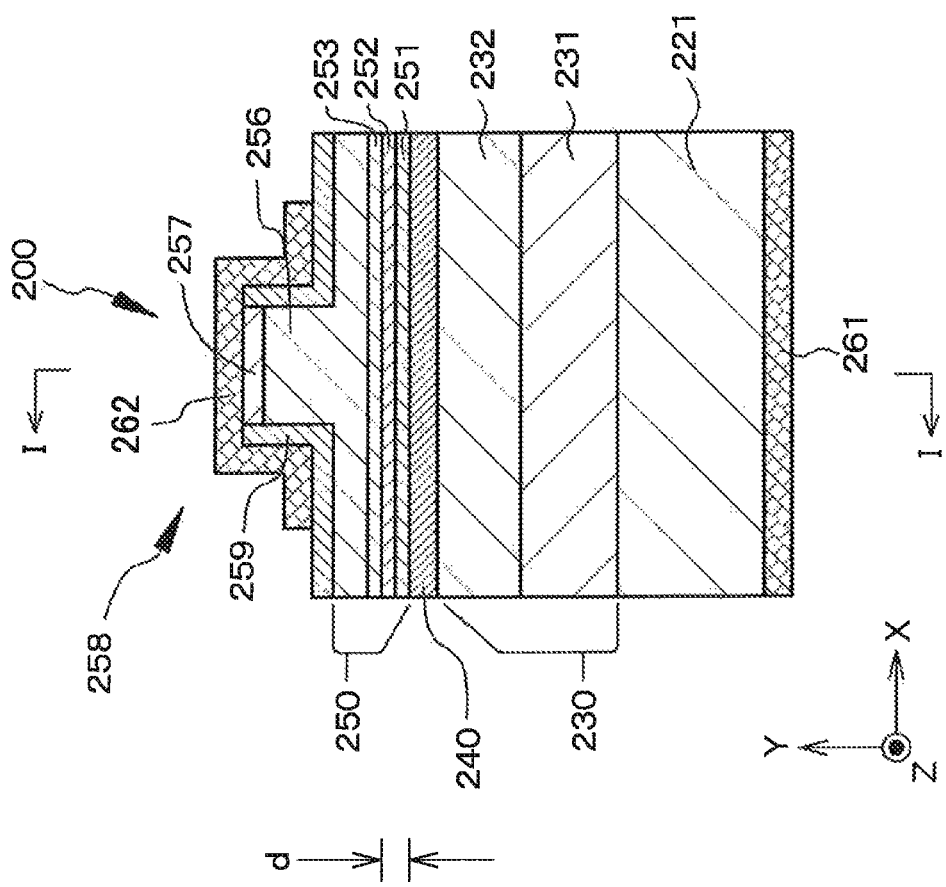
FIG. 9 is a schematic cross sectional view of the semiconductor optical amplifier where the semiconductor optical amplifier is cut along a virtual vertical plane (XY plane) orthogonal to the axis line of the semiconductor optical amplifier of the second example.
Figure 11:
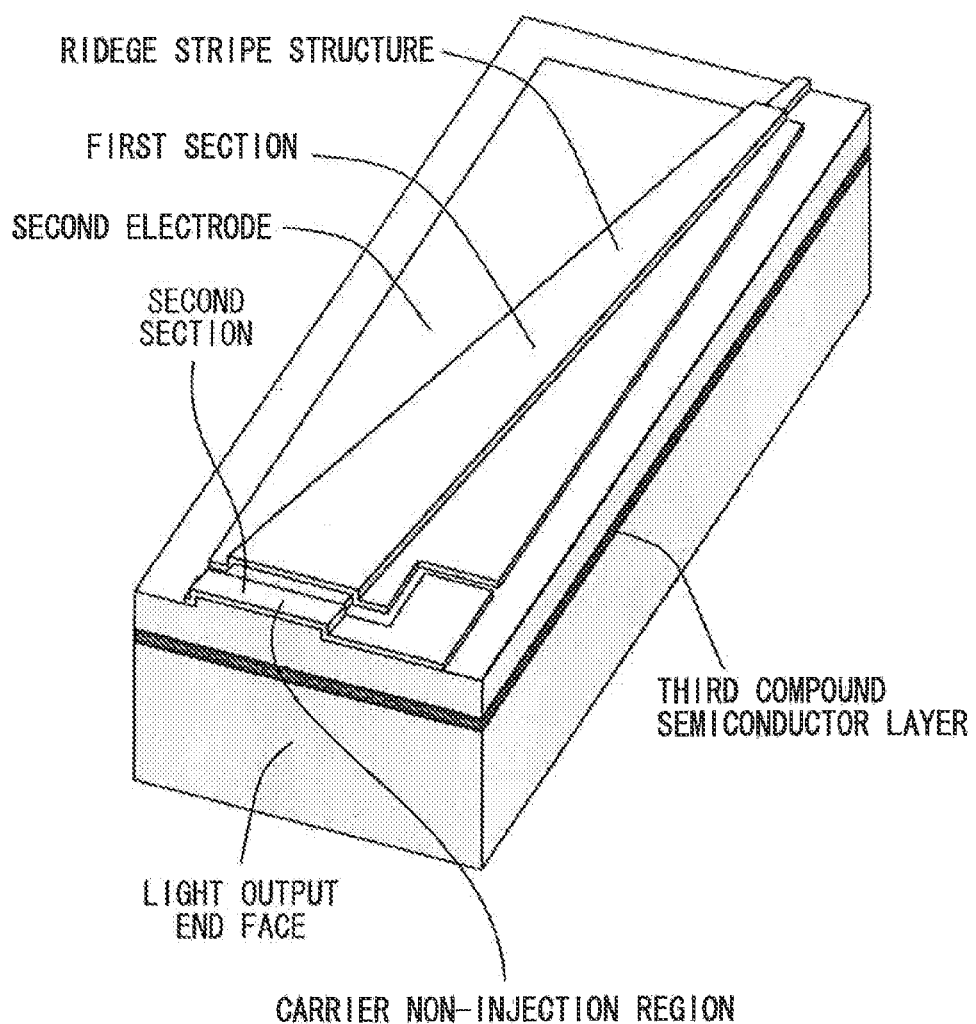
FIG. 11 is a schematic perspective view of the semiconductor optical amplifier of the second example.
Figure 12:
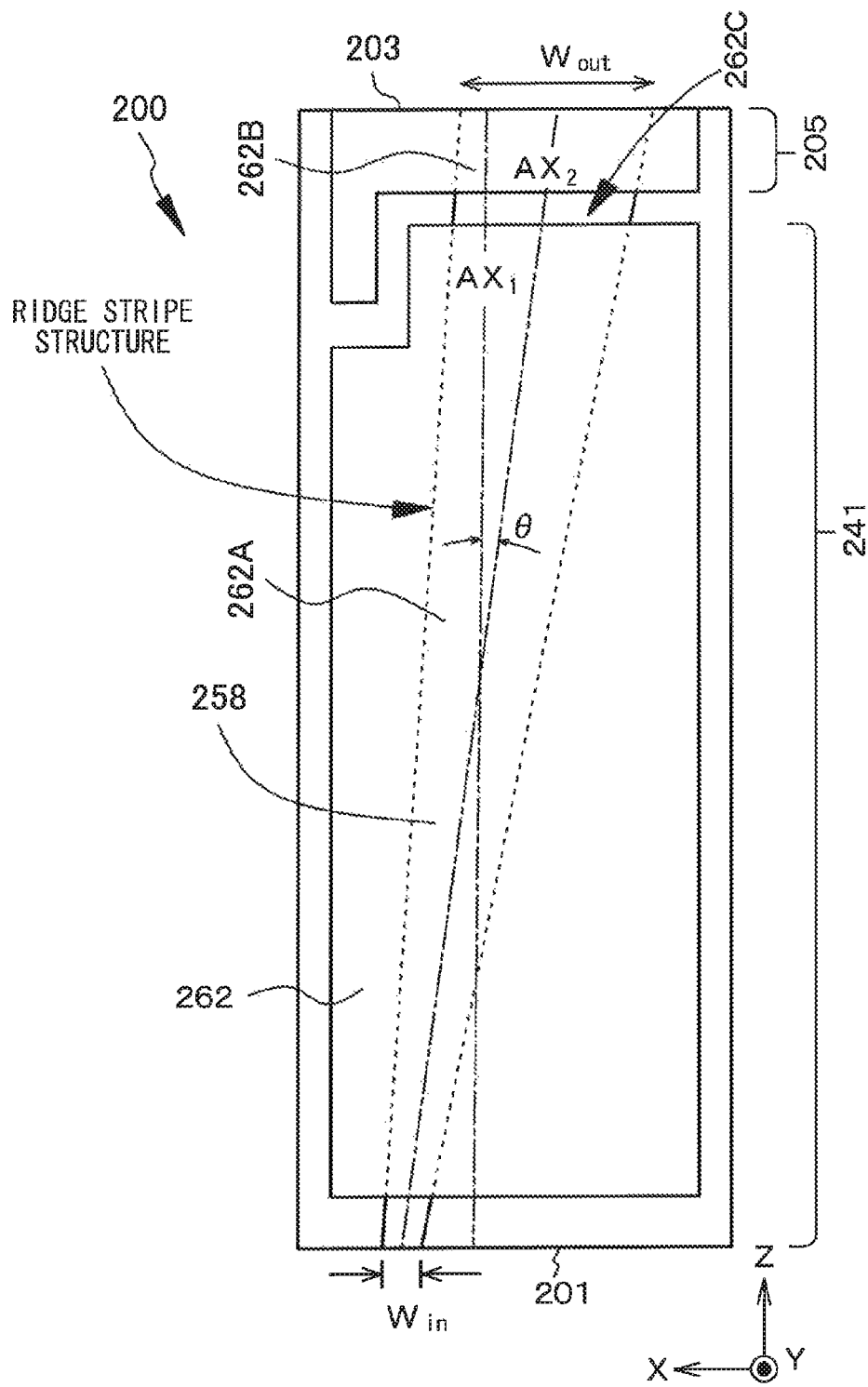
FIG. 12 is a schematic plan view of a ridge stripe structure in the semiconductor optical amplifier of the second example.

The second example is a modification of the first example. FIG. 7 illustrates a conceptual view of a light output device of the second example including the semiconductor optical amplifier. FIG. 8 illustrates a schematic cross sectional view of the semiconductor optical amplifier where the semiconductor optical amplifier is cut along a virtual vertical plane (YZ plane) including an axis line (Z direction) of the semiconductor optical amplifier. FIG. 9 illustrates a schematic cross sectional view of the semiconductor optical amplifier where the semiconductor optical amplifier is cut along a virtual vertical plane (XY plane) orthogonal to the axis line of the semiconductor optical amplifier. FIG. 8 is a schematic cross sectional view taken along line I-I of FIG. 9. FIG. 9 is a schematic cross sectional view taken along line II-II of FIG. 8. Further, FIG. 11 illustrates a schematic perspective view of the semiconductor optical amplifier, and FIG. 12 illustrates a schematic plan view of a ridge stripe structure.

Figure 10:
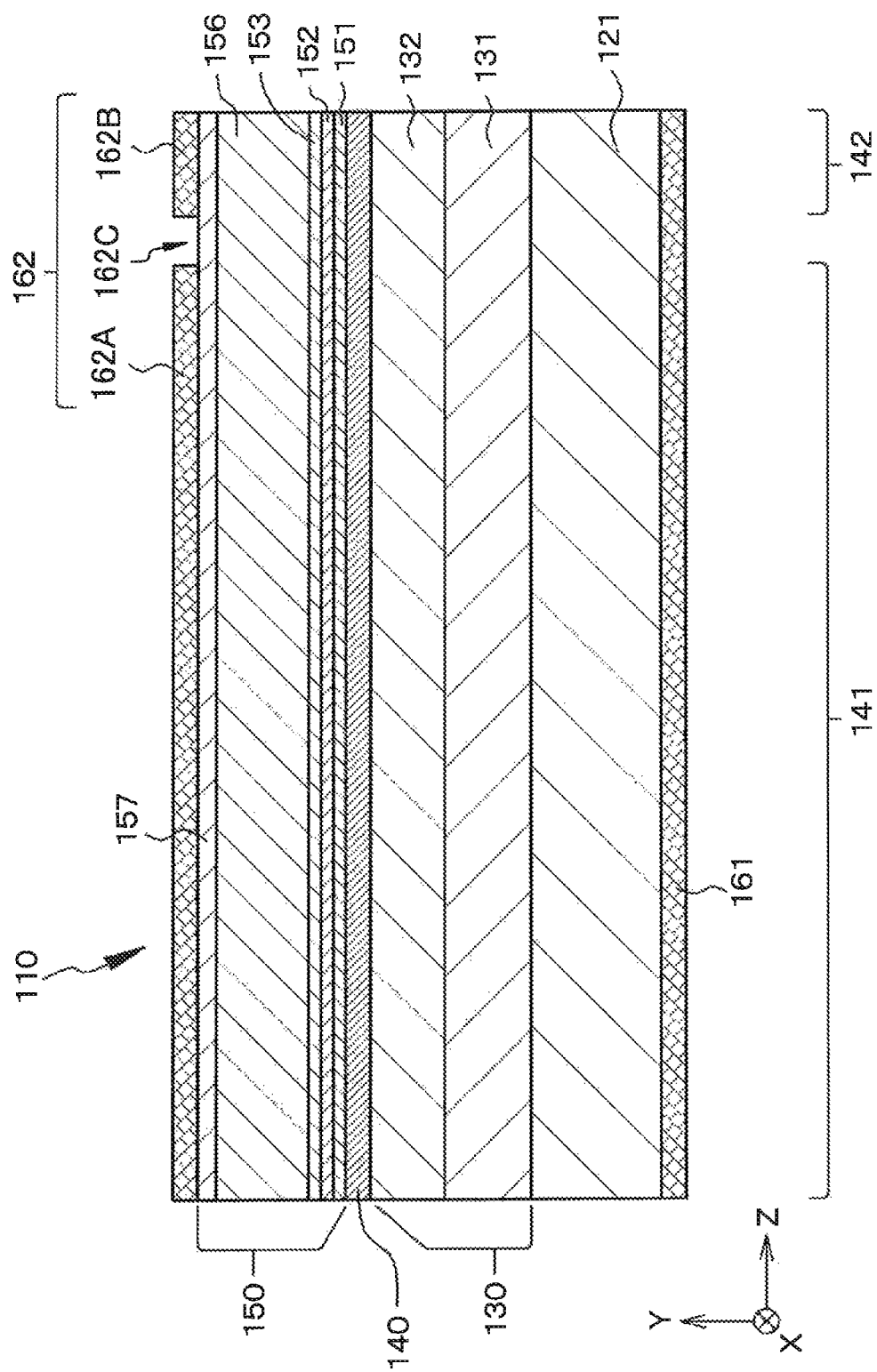
FIG. 10 is a schematic end view taken along the direction in which a resonator of a mode locking laser diode device in the second example extends.
Figure 19A:
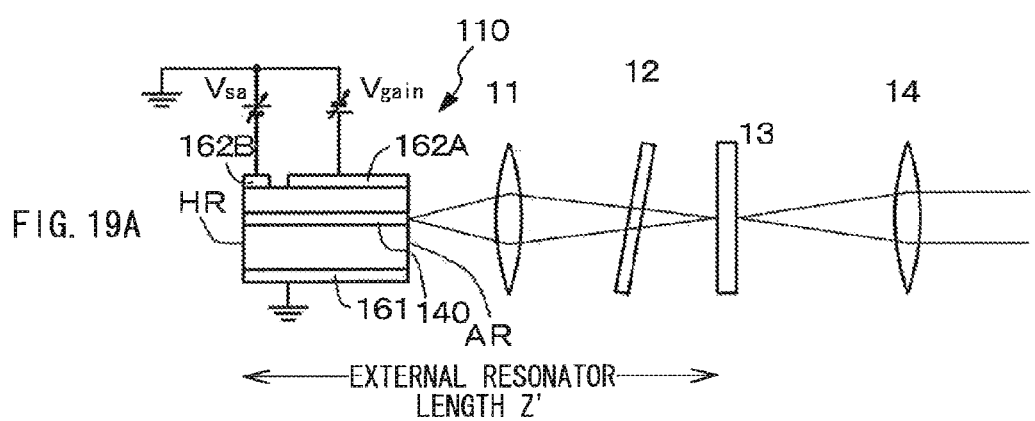
FIGS. 19A and 19B are views respectively and schematically illustrating a system of performing mode locking drive by configuring an external resonator from the mode locking laser diode device in the second example and a mode locking laser diode device in a sixth example.

Further, FIG. 10 illustrates a schematic end view along the direction in which a resonator of a mode locking laser diode device configuring a laser light source extends (a schematic end view where the mode locking laser diode device is cut along the YZ plane). A schematic cross sectional view taken along the direction perpendicular to the direction in which the resonator extends (schematic cross sectional view where the mode locking laser diode device is cut along the XY plane) is the same as FIG. 9 except for referential numbers. That is, the 200s referential numbers in FIG. 9 correspond to 100s referential numbers of the schematic cross sectional view taken along the direction perpendicular to the direction in which the resonator extends. FIG. 10 is a schematic end view similar to the view taken along line I-I of FIG. 9. Further, FIG. 19A schematically illustrates a system of performing mode locking drive by configuring an external resonator from the mode locking laser diode device of the second example.

In the second example, a second electrode 262 is composed of a first section 262A and a second section 262B that are separated by an isolation trench 262C, and the second section 262B of the second electrode is provided in a carrier non-injection region 205. A voltage equal to or less than a built-in voltage is applied to the second section 262B of the second electrode. Specifically, 0 volt is applied to the second section 262B of the second electrode. Light amplification as an inherent function of the semiconductor optical amplifier 200 is able to be performed by applying a voltage to the first section 262A of the second electrode, while measurement for position adjustment and the like is able to be performed by applying a voltage to the second section 262B of the second electrode.

In the second example, when the length of the first section 262A is $L_{Amp-1}$, and the length of the second section 262B is $L_{Amp-2}$, $L_{Amp-1}=1.97$ mm, $L_{Amp-2}=0.01$ mm, and $0.001 \leq L_{Amp-2}/L_{Amp-1} \leq 0.01$ are satisfied. Further, the width of the isolation trench is 0.02 mm.

In the second example, a voltage applied to the second section of the second electrode is lower the voltage applied to the first section of the second electrode. Thereby, since the carrier non-injection region including the second section exists, even if the light intensity of incident laser light is increased, the phenomenon that relative refractive index of the compound semiconductor layer is increased is able to be inhibited from being generated. In addition, laser light outputted from the light output end face of the semiconductor optical amplifier is easily broadened in the width direction. Further, since the area occupying the light output end face of the region from which laser light is outputted from the semiconductor optical amplifier is large, high output of the semiconductor optical amplifier is able to be realized.

The light output device of the second example includes: the laser light source 100; the semiconductor optical amplifier 200 that optically amplifies laser light from the laser light source 100 and outputs amplified light; an alignment device 300 that adjusts relative position of the semiconductor optical amplifier with respect to laser light entering the semiconductor optical amplifier 200; and a semiconductor optical amplifier control device 400 that controls operation of the semiconductor optical amplifier 200.

The semiconductor optical amplifier control device 400 is specifically composed of a combination of a known direct current electric power source, a voltage measurement device, and a current measurement device. Further, resolution capability of a voltage monitor in the semiconductor optical amplifier control device 400 is 1 millivolt or less, and is more specifically 0.1 millivolt or less. Further, resolution capability of a current monitor in the semiconductor optical amplifier control device 400 is 100 microampere or less, and is more specifically 10 microampere or less.

In the second example, the laser light source 100 is composed of a mode locking laser diode device, and pulse laser light outputted from the mode locking laser diode device enters the semiconductor optical amplifier 200. In this case, the laser light source 100 outputs pulse laser light based on mode locking operation. For details of the mode locking laser diode device, a description will be given later. The semiconductor optical amplifier 200 in the second example substantially has the same composition and the same configuration as those of a mode locking laser diode device 110 configuring the laser light source 100 in the second example, except for the composition and the structure of the second electrode.

In the light output device of the second example illustrated in FIG. 7, the laser light source 100 is composed of the mode locking laser diode device 110, a lens 11, an optical filter 12, an external mirror 13, and a lens 14. Laser light outputted from the laser light source 100 enters a reflecting mirror 20 through the light isolator 15 and the reflecting mirror 16. Laser light reflected by the reflecting mirror 20 passes through the half-wave plate ($\lambda/2$ wave plate) 21 and the lens 22, and enters the semiconductor optical amplifier 200. Light is amplified in the semiconductor optical amplifier 200, and is outputted outside the system through the lens 30. The reflecting mirror 20, the half-wave plate 21, and the lens 22 are laid on the alignment device 300. The alignment device 300 is specifically composed of XYZ stage. When the thickness direction of the laminated structure in the semiconductor optical amplifier 200 described later is Y direction and the axis line direction of the semiconductor optical amplifier 200 is Z direction, the reflecting mirror 20 and the lens 22 are moved in the X direction, the Y direction, and the Z direction by the alignment device 300.

The mode locking laser diode device 110 of the second example that configures the laser light source 100 and has light emitting wavelength band of 405 nm includes: a laminated structure in which a first compound semiconductor layer 130 that has a first conductivity type (in the second example, specifically, n-type conductivity type) and is composed of GaN compound semiconductor, a third compound semiconductor layer (active layer) 140 that has a light emitting region (gain region) 141 composed of GaN compound semiconductor, and a second compound semiconductor layer 150 that has a second conductivity type different from the first conductivity type (in the second example, specifically, p-type conductivity type) and is composed of GaN compound semiconductor are sequentially layered; b. a strip-shaped second electrode 162 formed on the second compound semiconductor layer 150; and a first electrode 161 electrically connected to the first compound semiconductor layer 130.

The laminated structure is formed on compound semiconductor substrates 121 and 221 having polarity. The third compound semiconductor layers 140 and 240 have a quantum well structure including a well layer and a barrier layer. The thickness of the well layer is from 1 nm to 10 nm both inclusive. The doping concentration of impurity (specifically, silicon (Si)) of the barrier layer is from $2\times10^{18}$ cm$^{-3}$ to $1\times10^{20}$ cm$^{-3}$ both inclusive.

Specifically, the mode locking laser diode device 110 and the semiconductor optical amplifier 200 of the second example have a ridge stripe type separate confinement heterostructure (SCH structure). More specifically, the mode locking laser diode device 110 and the semiconductor optical amplifier 200 of the second example have a GaN laser diode structure composed of an index guide type AlGaInN, and a straight line-like ridge section (ridge stripe structure). In addition, the mode locking laser diode device 110 and the semiconductor optical amplifier 200 are provided on (0001) plane of an n-type GaN substrate 121 and the n-type GaN substrate 221. The third compound semiconductor layers 140 and 240 have a quantum well structure. The (0001) plane of the n-type GaN substrates 121 and 221 is also called "C plane," and is a crystal plane having polarity. The first compound semiconductor layers 130 and 230, the third compound semiconductor layers 140 and 240, and the second compound semiconductor layers 150 and 250 are specifically composed of AlGaInN compound semiconductor. More specifically, the first compound semiconductor layers 130 and 230, the third compound semiconductor layers 140 and 240, and the second compound semiconductor layers 150 and 250 have a layer structure illustrated in the following Table 2. In Table 2, the listed items are shown in the order from the layer farthest from the n-type GaN substrates 121 and 221 to the layer closest to the n-type GaN substrates 121 and 221.

TABLE 2

Second compound semiconductor layers 150 and 250
p-type GaN contact layer (Mg doped) 157 and 257
p-type GaN (Mg doped)/AlGaN superlattice cladding layers 156 and 256
p-type AlGaN electron barrier layer (Mg doped) 153 and 253
Non-doped AlGaN cladding layer 152 and 252
Non-doped GaInN light guide layers 151 and 251
Third compound semiconductor layers 140 and 240
GaInN quantum well active layer
(well layer: Ga$_{0.92}$In$_{0.08}$N/barrier layer: Ga$_{0.98}$In$_{0.02}$N)
First compound semiconductor layers 130 and 230
n-type GaN layers 132 and 232
n-type AlGaN cladding layers 131 and 231
well layer (two layers): 8 nm [non-doped]
barrier layer (three layers): 10 nm [doping concentration (Si): $2\times10^{18}$ cm$^{-3}$]

Further, part of the p-type GaN contact layers 157 and 257 and part of the p-type GaN/AlGaN superlattice cladding layers 156 and 256 are removed by RIE method, and ridge stripe structures (a ridge section 158 and the ridge section 258) are formed. On both sides of the ridge sections 158 and 258, a laminated insulating film 159 and the laminated insulating film 259 composed of SiO$_2$/Si is formed. The SiO$_2$ layer is the lower layer and the Si layer is the upper layer. The difference between the effective refractive index of the ridge sections 158 and 258 and the effective refractive index of the laminated insulating films 159 and 259 is from $5\times10^{-3}$ to $1\times10^{-2}$ both inclusive, and is specifically $7\times10^{-3}$. On the p-type GaN contact layers 157 and 257 corresponding to the top face of the ridge sections 158 and 258, the second electrodes (p-side ohmic electrodes) 162 and 262 are formed. Meanwhile, on the rear face of the n-type GaN substrates 121 and 221, a first electrode (n-side ohmic electrode) 161 and the first electrode (n-side ohmic electrode) 261 composed of Ti/Pt/Au are formed. Specifically, the laminated insulating films 159 and 259 have SiO$_2$/Si laminated structure.

In the mode locking laser diode device 110 of the second example, the p-type AlGaN electron barrier layer 153, the p-type GaN/AlGaN superlattice cladding layer 156, and the p-type GaN contact layer 157 that are Mg-doped compound semiconductor layers are arranged not to overlap with each other as much as possible in the light density distribution generated from the third compound semiconductor layer 140 and regions in the vicinity thereof. Theref, internal loss is inhibited in a range in which internal quantum efficiency is not lowered. Therefore, threshold current $I_{th}$ at which laser oscillation is started is decreased. Further, it was found that internal loss $\alpha_i$ is lowered by increasing a value of distance d from the third compound semiconductor layers 140 to the p-type AlGaN electron barrier layer 153. It was also found that if the value d becomes a certain value or more, efficiency of hole injection into the well layer is lowered, and as a result, electron-hole recombination ratio in the third compound semiconductor layer 140 is lowered, and internal quantum efficiency $\eta_i$ is decreased. Thus, the distance d from the third compound semiconductor layer 140 to the p-type AlGaN electron barrier layer 153 was set to 0.10 μm, the height of the ridge section (ridge stripe structure) was set to 0.30 μm, the thickness of the second compound semiconductor layer 150 located between the second electrode 162 and the third compound semiconductor layer 140 was set to 0.50 μm, and the thickness of a portion of the p-type GaN/AlGaN superlattice cladding layer 156 located below the second electrode 162 was set to 0.40 μm. "The distance d between the electron barrier layer 153 and the third compound semiconductor layers 140" means a distance between a portion of the electron barrier layer 153 facing the third compound semiconductor layer 140 (interface) and a portion of the third compound semiconductor layer 140 facing the electron barrier layer 153 (interface). A composition and a configuration of the semiconductor optical amplifier 200 are similar to the foregoing composition and the foregoing configuration of the mode locking laser diode device 110.

In the second example, the second electrodes 162 and 262 are formed from a Pd single layer having a thickness of 0.1 μm. Further, in the second example, the width of an isolation trench 162C that separates the second electrode 162 composing the mode locking laser diode device 110 into a first section 162A and a second section 162B is 1 μm or more and 50% or less the resonator length. Further, the length of a saturable absorption region 142 is shorter than the length of the light emitting region 141. Further, the length of the second electrode 162 (total length of the first section and the second section) is shorter than the length of the third compound semiconductor layer 140. Specifically, resonator length Z" was set to 0.60 mm, the length of the first section 162A of the second electrode 162 was set to 0.52 mm, the length of the second section 162B was set to 0.06 mm, and the width of the isolation trench 162C (length in the resonator length direction) was set to 0.02 mm.

The thickness of the p-type GaN/AlGaN superlattice cladding layers 156 and 256 having a superlattice structure in which a p-type GaN layer and a p-type AlGaN layer are alternately layered is 0.7 μm or less, and specifically 0.4 μm. The thickness of the p-type GaN layer composing the superlattice structure is 2.5 nm. The thickness of the p-type AlGaN layer composing the superlattice structure is 2.5 nm. The total number of layers of the p-type GaN layer and the p-type AlGaN layer is 160. Further, the distance from the third compound semiconductor layers 140 and 240 to the second electrodes 162 and 262 is 1 μm or less, and specifically 0.5 μm. Further, the p-type AlGaN electron barrier layers 153 and 253, the p-type GaN/AlGaN superlattice cladding layers 156 and 256, and the p-type GaN contact layers 157 and 257 composing the second compound semiconductor layers 150 and 250 are doped with Mg at the level of $1\times10^{19}$ cm$^{-3}$ or more (specifically at the level of $2\times10^{19}$ cm$^{-3}$). Further, the second compound semiconductor layers 150 and 250 are provided with the non-doped compound semiconductor layer (the non-doped GaInN light guide layers 151 and 251 and the non-doped AlGaN cladding layer 152 and 252) and the p-type compound semiconductor layer from the third compound semiconductor layer side. The distance d from the third compound semiconductor layer 140 to the p-type compound semiconductor layer (specifically, the p-type AlGaN electron barrier layers 153 and 253) is $1.2\times10^{-7}$ m or less, and specifically 100 nm.

Further, in the second example, a given value of voltage (voltage equal to or less than built-in voltage) is applied to the second section 262B of the semiconductor optical amplifier 200 while laser light enters the semiconductor optical amplifier 200 from the laser light source 100. The relative position of the semiconductor optical amplifier 200 with respect to laser light entering the semiconductor optical amplifier 200 is adjusted so that the current flown in the semiconductor optical amplifier 200 becomes the maximum.

Specifically, in the second example, when a current flown in the second section 262B of the semiconductor optical amplifier 200 in the case where a given value of voltage $V_0$ is applied to the semiconductor optical amplifier 200 while laser light does not enter the semiconductor optical amplifier 200 from the laser light source 100 is $I_1$, and a current flown in the second section 262B of the semiconductor optical amplifier 200 in the case where a given value of voltage $V_0$ is applied to the semiconductor optical amplifier 200 while laser light enters the semiconductor optical amplifier 200 from the laser light source 100 is $I_2$, the relative position of the semiconductor optical amplifier 200 with respect to laser light entering the semiconductor optical amplifier 200 is adjusted so that value of $\Delta I=(I_2-I_1)$ becomes the maximum.

Figure 13:
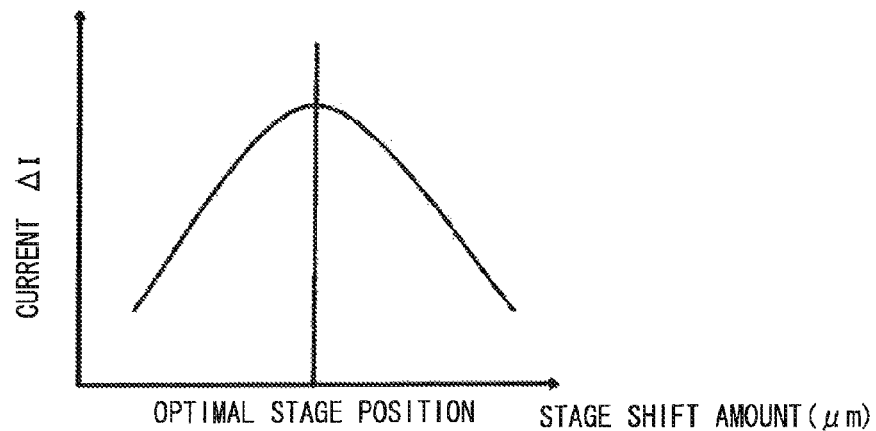
FIG. 13 is a graph schematically illustrating change of a current flown in the semiconductor optical amplifier in the case where a given value of voltage is applied to the semiconductor optical amplifier while making laser light enter the semiconductor optical amplifier of the second example from the laser light source and XYZ stage is moved in the X direction.

FIG. 13 schematically illustrates change of the current $\Delta I$ flown in the semiconductor optical amplifier 200 in the case where a given value of voltage is applied to the semiconductor optical amplifier 200 while laser light enters the semiconductor optical amplifier 200 from the laser light source 100 and the XYZ stage is moved in the X direction. Along with movement of the XYZ stage in the X direction, the current $\Delta I$ flown in the semiconductor optical amplifier 200 is flatly increased until the $\Delta I$ exceeds the maximum value, and is flatly decreased. Change of light output of laser light emitted from the semiconductor optical amplifier 200 at this time shows the totally same behavior as that of change of current. Thus, light output of laser light emitted from the semiconductor optical amplifier 200 is able to be the maximum by adjusting the relative position of the semiconductor optical amplifier 200 with respect to laser light entering the semiconductor optical amplifier 200 so that the current flown in the semiconductor optical amplifier 200 becomes the maximum.

In the semiconductor optical amplifier 200 of the second example, in the case where a given value of voltage $V_0$ is applied to the semiconductor optical amplifier 200 while laser light enters the semiconductor optical amplifier 200 from the laser light source 100 and the XYZ stage is moved in the X direction, as illustrated in FIG. 13, a voltage applied to (added to) the semiconductor optical amplifier 200 is increased. In the case where the XYZ stage is moved, light output from the semiconductor optical amplifier 200 is increased, and when such a phenomenon is generated, the number of carriers in the light amplification region (carrier injection region, gain region) 241 is decreased. Thus, a current flown in the semiconductor optical amplifier 200 is increased to compensate such decrease of the number of carriers. Positioning method of the semiconductor optical amplifier and the light output device in the second example are based on the foregoing phenomenon. A positioning equipment (XYZ stage) 300 may be moved by an operator. Otherwise, the positioning equipment (XYZ stage) 300 is able to be automatically moved by direction of a semiconductor optical amplifier control device 400 based on voltage measurement result.

In the second example, a current applied to the semiconductor optical amplifier 200 is measured to adjust the relative position of the semiconductor optical amplifier 200 with respect to laser light entering the semiconductor optical amplifier 200. Thus, measurement for position adjustment is able to be performed without depending an external monitoring equipment. Thus, the relative position of the semiconductor optical amplifier 200 with respect to laser light entering the semiconductor optical amplifier 200 is able to be adjusted accurately.

Further, by monitoring the currents $I_1$ and $I_2$ flown in the second section 262B of the semiconductor optical amplifier 200, operation state of the semiconductor optical amplifier 200 and the mode locking laser diode device 110 is able to be monitored.

In the mode locking laser diode device 110 of the second example, the third compound semiconductor layer 140 includes the saturable absorption region 142. Further, the second electrode 162 is separated into the first section 162A for obtaining forward bias state by flowing a current to the first electrode 161 through the light emitting region 141, and the second section 162B for applying an electric field to the saturable absorption region 142 by the isolation trench 162C. Forward bias state is obtained by flowing a current to the first electrode 161 from the first section 162A of the second electrode 162 through the light emitting region 141, and an electric field is added to the saturable absorption region 142 by applying a voltage between the first electrode 161 and the second section 162B of the second electrode 162. In addition, in the mode locking laser diode device of the second example, light pulse is generated in the light emitting region 141 by flowing a current from the second electrode 162 to the first electrode 161 through the laminated structure.

Specifically, in the mode locking laser diode device 110 of the second example, as described above, the second electrode 162 is separated into the first section 162A for obtaining forward bias state by flowing a direct current (forward bias current $I_{gain}$) to the first electrode 161 through the light emitting region (gain region) 141, and the second section 162B for applying an electric field to the saturable absorption region 142 (the second section 162B for adding reverse bias voltage $V_{sa}$ to the saturable absorption region 142) by the isolation trench 162C. The electric resistance value (also referred to as "separating resistance value") between the first section 162A and the second section 162B of the second electrode 162 is $1\times10$ times or more the electric resistance value between the second electrode 162 and the first electrode 161, is specifically $1.5 \times 10^3$ times the electric resistance value between the second electrode 162 and the first electrode 161. Further, the electric resistance value (separating resistance value) between the first section 162A and the second section 162B of the second section 162 is $1 \times 10^2 \Omega$ or more, and is specifically $1.5 \times 10^4 \Omega$.

Further, in the mode locking laser diode device 110 of the second example, the second electrode 162 having a separating resistance value of $1 \times 10^2 \Omega$ or more should be formed on the second compound semiconductor layer 150. In the case of the GaN laser diode device, mobility in the compound semiconductor having p-type conductivity type is small differently in the existing GaAs laser diode device. Thus, it is possible that the electric resistance value between the first section 162A and the second section 162B of the second electrode 162 becomes 10 times or more the electric resistance value between the second electrode 162 and the first electrode 161, or the electric resistance value between the first section 162A and the second section 162B of the second section 162 becomes $1 \times 10^2 \Omega$ or more without setting high resistance of the second compound semiconductor layer 150 having p-type conductivity type by ion injection or the like but separating the second electrode 162 formed thereon by the isolation trench 162C.

Figure 31:
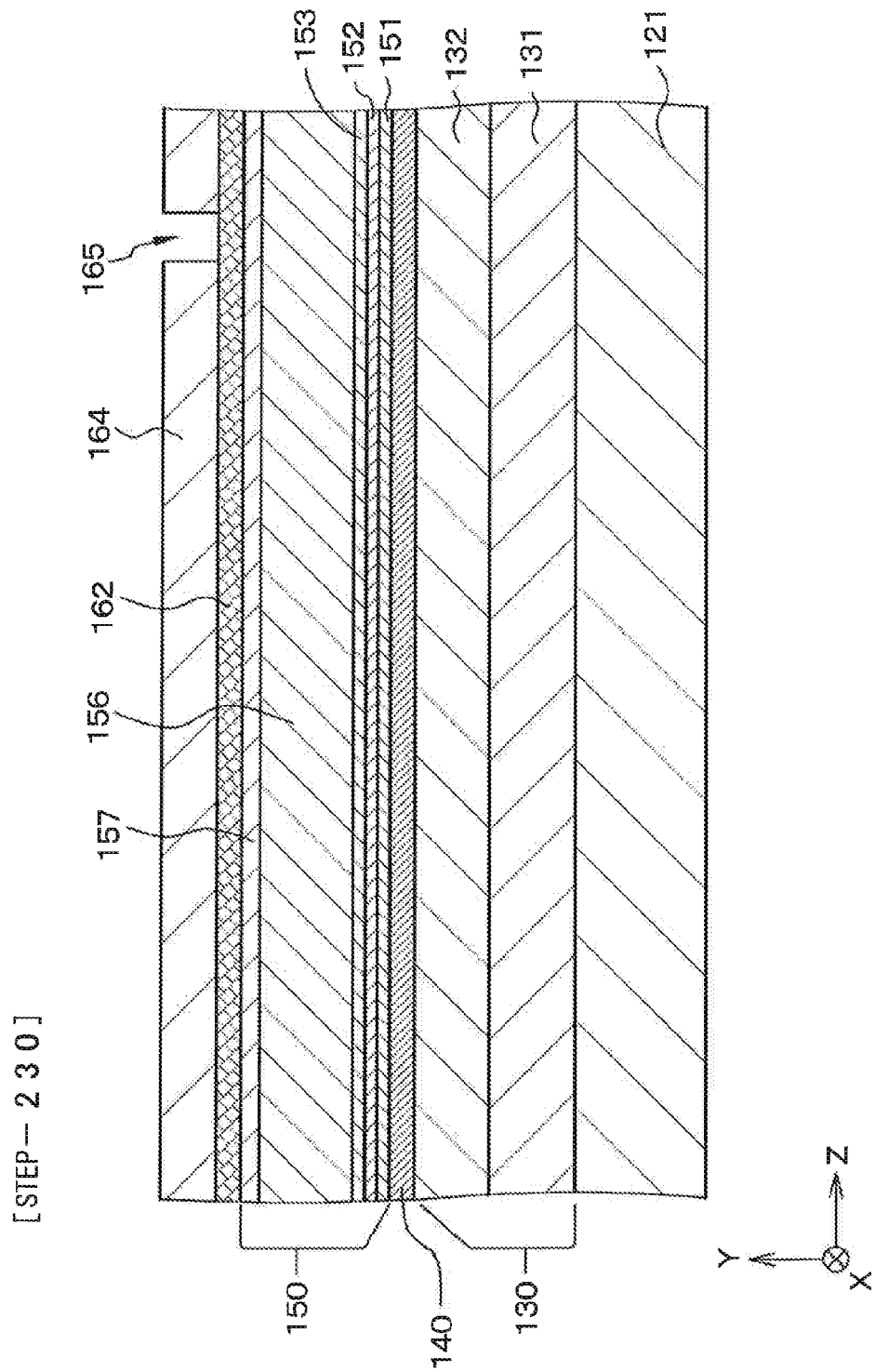
FIG. 31 is a schematic partial end view of a substrate and the like for explaining a method of manufacturing the mode locking laser diode device in the second example following FIG. 30B.

A description will be given of a method of manufacturing the mode locking laser diode device of the second example with reference to FIGS. 29A, 29B, 30A, 30B, and 31. FIGS. 29A, 29B, 30A, and 30B are schematic partial cross sectional views where the substrate and the like are cut in XY plane. FIG. 31 is a schematic partial end view where the substrate and the like are cut in YZ plane.

Requested characteristics of the second electrode 162 are as follows:
(1) a function as an etching mask in etching the second compound semiconductor layer 150 is included;
(2) the second electrode 162 is able to be wet-etched without deteriorating optical and electric characteristics of the second compound semiconductor layer 150;
(3) contact specific resistance value of $10^{-2} \Omega \cdot cm^2$ or less is shown in the case where the second electrode 162 is formed on the second compound semiconductor layer 150;
(4) in the case of a laminated structure, a material composing the lower metal layer has large work function, shows low contact specific resistance value to the second compound semiconductor layer 150, and is able to be wet-etched; and
(5) in the case of a laminated structure, a material composing the upper metal layer has resistance to etching in forming the ridge stripe structure (for example, $Cl_2$ gas used in RIE method), and is able to be wet-etched.

Step-200

First, a laminated structure in which the first compound semiconductor layer 130 that has first conductivity type (n-type conductivity type) and is composed of GaN compound semiconductor, the third compound semiconductor layer (active layer) 140 including the light emitting region (gain region) 141 composed of GaN compound semiconductor and the saturable absorption region 142, and the second compound semiconductor layer 150 that has second conductivity type (p-type conductivity type) different from the first conductivity type and is composed of GaN compound semiconductor are sequentially layered is formed on a substrate, specifically on (0001) plane of the n-type GaN substrate 121 based on known MOCVD method (refer to FIG. 29A).

Step-210

After that, the strip-shaped second electrode 162 is formed on the second compound semiconductor layer 150. Specifically, after a Pd layer 163 is formed over the entire face of the second compound semiconductor layer 150 based on vacuum evaporation method (refer to FIG. 29B), a strip-shaped etching-use resist layer is formed on the Pd layer 163 based on photolithography technique. After the Pd layer 163 not covered with the etching-use resist layer is removed by using aqua regia, the etching-use resist layer is removed. Thereby, the structure illustrated in FIG. 30A is able to be obtained. It is possible that the strip-shaped second electrode 162 is formed on the second compound semiconductor layer 150 based on liftoff method.

Step-220

Next, at least part of the second compound semiconductor layer 150 is etched (in the second example, part of the second compound semiconductor layer 150 is etched) with the use of the second electrode 162 as an etching-use mask to form the ridge stripe structure. Specifically, part of the second compound semiconductor layer 150 is etched with the use of the second electrode 162 as an etching-use mask based on RIE method using $Cl_2$ gas. Thereby, the structure illustrated in FIG. 30B is able to be obtained. As described above, the ridge stripe structure is formed by self alignment method by using the second electrode 162 patterned in the shape of a strip as an etching-use mask. Thus, misalignment is not generated between the second electrode 162 and the ridge stripe structure.

Step-230

After that, a resist layer 164 for forming the isolation trench in the second electrode 162 is formed (refer to FIG. 31). Referential number 165 represents an aperture provided in the resist layer 164 for forming the isolation trench. Next, the isolation trench 162C is formed in the second electrode 162 by wet etching method with the use of the resist layer 164 as a wet etching-use mask, and thereby the second electrode 162 is separated into the first section 162A and the second section 162B by the isolation trench 162C. Specifically, aqua regia is used as an etching liquid, and the entire body is dipped into the aqua regia for about 10 seconds, and thereby the isolation trench 162C is formed in the second electrode 162. After that, the resist layer 164 is removed. Accordingly, the structure illustrated in FIG. 10 is able to be obtained. As described above, differently from dry etching method, by adopting wet etching method, optical characteristics and electric characteristics of the second compound semiconductor layer 150 are not deteriorated. Thus, light emitting characteristics of the mode locking laser diode device are not deteriorated. If dry etching method is adopted, there is a possibility that internal loss $\alpha_i$ of the second compound semiconductor layer 150 is increased, the threshold voltage is increased, and light output is lowered. In this case, when an etching rate of the second electrode 162 is $ER_0$, and an etching rate of the laminated body is $ER_1$, the following formula is established:

$$ER_0/ER_1 = 1 \times 10^2$$

As described above, since the high etching selection ratio exists between the second electrode 162 and the second compound semiconductor layer 150, the second electrode 162 is able to be surely etched without etching the laminated structure (or even if the laminated structure is etched, the etching amount is slight).

Step-240

After that, the n-side electrode 161 is formed, the substrate is cleaved, and further packaging is made. Accordingly, the mode locking laser diode device 110 is able to be fabricated.

In general, resistance R ($\Omega$) of a semiconductor layer is expressed as follows by using specific resistance value $\rho$ ($\Omega \cdot m$) of a material composing a semiconductor layer, length of the semiconductor layer $X_0$ (m), cross section area S of the semiconductor layer (m$^2$), carrier density n (cm$^{-3}$), electric charge amount e (C), and mobility $\mu$ (m$^2$/V sec).

$$R=(\rho \cdot X_0)/S=X_0/(n \cdot e \cdot \mu \cdot S)$$

Since mobility of the p-type GaN semiconductor is two-digit or more smaller than that of the p-type GaAs semiconductor, the electric resistance value gets high easily. Thus, it is found that the electric resistance value of the laser diode device having a ridge stripe structure with small cross section area being 1.5 μm wide and 0.35 μm high becomes a large value based on the foregoing formula.

Figure 27:
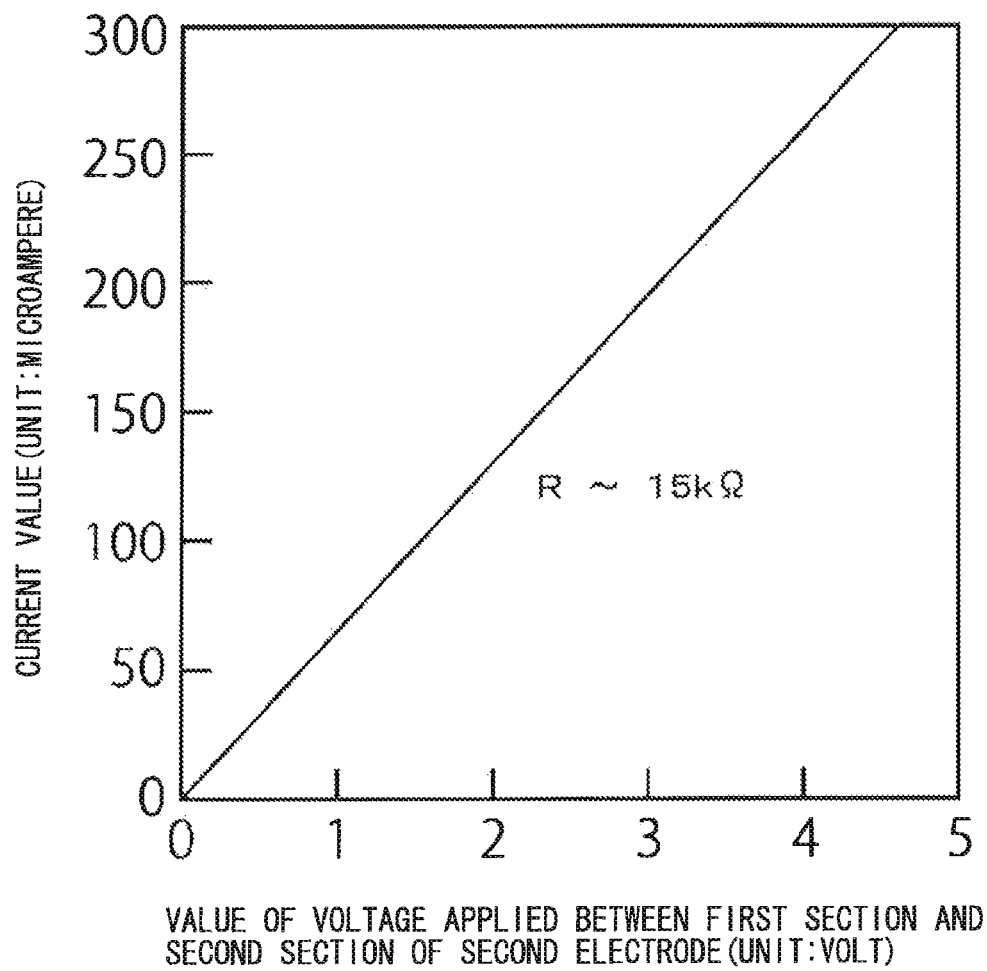
FIG. 27 is a graph illustrating result obtained by measuring an electric resistance value between a first section and a second section of a second electrode of the mode locking laser diode device obtained in the second example by four terminal method.

FIG. 27 illustrates a result obtained by measuring an electric resistance value between the first section 162A and the second section 162B of the second electrode 162 of the fabricated mode locking laser diode device 110 of the second example by four terminal method. When the width of the isolation trench 162C was 20 μm, the electric resistance value between the first section 162A and the second section 162B of the second electrode 162 was 15 kΩ.

In the fabricated mode locking laser diode device 110 of the second example, forward bias state was obtained by flowing a direct current from the first section 162A of the second electrode 162 to the first electrode 161 through the light emitting region 141, and electric field was applied to the saturable absorption region 142 by applying reverse bias voltage $V_{sa}$ between the first electrode 161 and the second section 162B of the second electrode 162, and thereby mode locking drive was performed.

Further, the electric resistance value between the first section 162A and the second section 162B of the second electrode 162 is ten times or more the electric resistance value between the second electrode 162 and the first electrode 161, or 1×10$^2$Ω or more. Thus, flow of leakage current from the first section 162A of the second electrode 162 to the second section 162B of the second electrode 162 is able to be inhibited securely. In the result, the light emitting region 141 is able to be in forward bias state, the saturable absorption region 142 is securely able to be in reverse bias state, and mode locking operation is able to be securely performed.

Further, the semiconductor optical amplifier 200 is able to be manufactured by the same manufacturing method as that of the mode locking laser diode device 110, except that the structure of the second electrode is different. Thus, detailed description thereof will be omitted.

To promote better understanding of the mode locking laser diode device of the second example, a mode locking laser diode device of a second referential example was fabricated. In the mode locking laser diode device of the second referential example, the structure of the third compound semiconductor layer 140 in the layer structure illustrated in Table 2 was as illustrated in the following Table 3.

TABLE 3

|  | Second example | Second referential example |
|---|---|---|
| Well layer | 8 nm | 10.5 nm |
| Barrier layer | 12 nm | 14 nm |
| Impurity doping concentration of well layer | Non-doped | Non-doped |
| Impurity doping concentration of barrier layer | Si: 2 × 10$^{18}$ cm$^{-3}$ | Non-doped |

In the second example, the thickness of the well layer is 8 nm, the barrier layer is doped with Si at a concentration of Si: 2×10$^{18}$ cm$^{-3}$, and QCSE effect in the third compound semiconductor layer is modified. Meanwhile, in the second referential example, the thickness of the well layer is 10.5 nm, and the barrier layer is not doped with impurity.

A light condensing external resonator was formed from the mode locking laser diode devices of the second example and the second referential example, and mode locking driving was performed (refer to FIG. 19A). In the light condensing external resonator illustrated in FIG. 19A, the external resonator is configured of the end face of the mode locking laser diode device in which a high reflective coating layer (HR) is formed on the saturable absorption region side and the external mirror 13, and light pulse is extracted from the external mirror 13. A low reflective coating layer (AR) is formed on the end face (light output end face) of the mode locking laser diode device on the light emitting region (gain region) side. As the optical filter 12, a bandpass filter is mainly used, which is inserted for controlling laser oscillation wavelength. Repetition frequency f of light pulse train is determined by the external resonator length Z' as expressed by the following formula, where c represents light velocity and n represents reflective index of waveguide.

$$f=c/(2n \cdot Z')$$

Figure 25A:
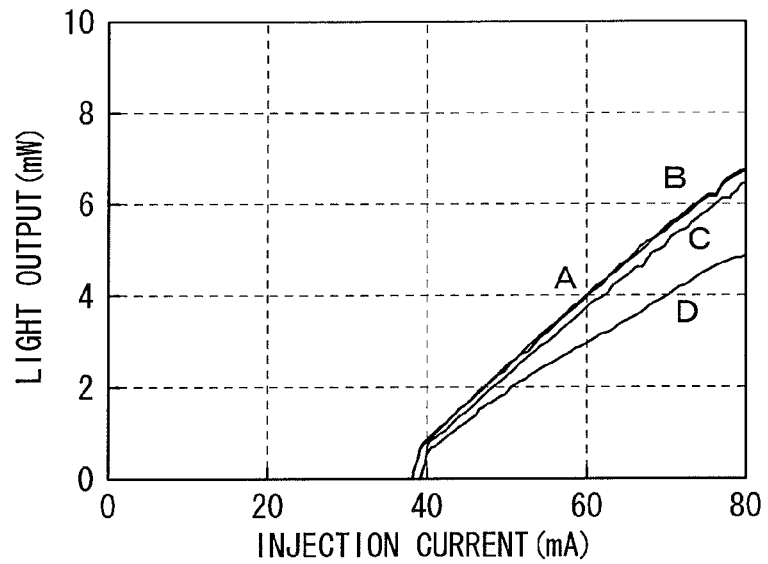
FIGS. 25A and 25B are graphs illustrating reverse bias voltage dependence measurement results of relation between an injection current and light output (L-I characteristics) in the second example and a second referential example.
Figure 25B:
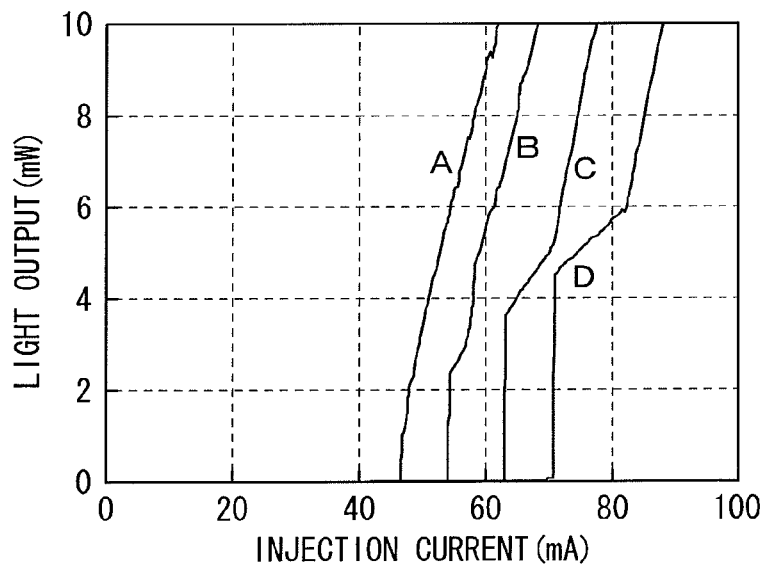

Mode locking is determined by a direct current applied to the light emitting region 141 and the reverse bias voltage $V_{sa}$ applied to the saturable absorption region 142. FIGS. 25A and 25B illustrate reverse bias voltage dependence measurement results of relation between an injection current and light output (L-I characteristics) of the second example and the second referential example. In FIGS. 25A and 25B, measurement results affixed with referential symbol "A" are results in the case of the reverse bias voltage $V_{sa}$=0 volt, measurement results affixed with referential symbol "B" are results in the case of the reverse bias voltage $V_{sa}$=-3 volt, measurement results affixed with referential symbol "C" are results in the case of the reverse bias voltage $V_{sa}$=-6 volt, and measurement results affixed with referential symbol "D" are results in the case of the reverse bias voltage $V_{sa}$=-9 volt. In FIG. 25A, the measurement result in the case of the reverse bias voltage $V_{sa}$=0 volt almost overlaps the measurement result in the case of the reverse bias voltage $V_{sa}$=-3 volt.

Based on comparison between FIGS. 25A and 25B, it is found that in the second referential example, as the reverse bias voltage $V_{sa}$ is increased, the threshold current $I_{th}$ at which laser oscillation is started is gradually increased, and change is shown at lower reverse bias voltage $V_{sa}$ compared to in the second example. It indicates that in the third compound semiconductor layer 140 of the second example, effect of saturable absorption is electrically controlled more by the reverse bias voltage $V_{sa}$.

Figure 26A:
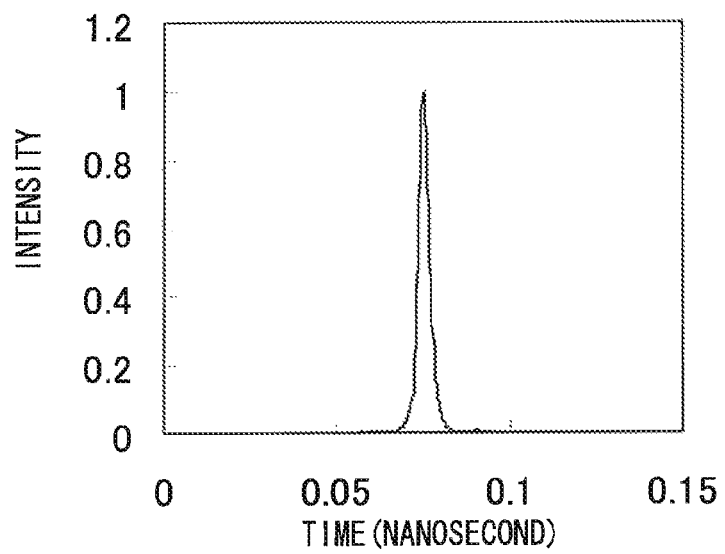
FIGS. 26A and 26B are views illustrating results obtained by measuring light pulse generated in the second example and the second referential example by a streak camera.
Figure 26B:
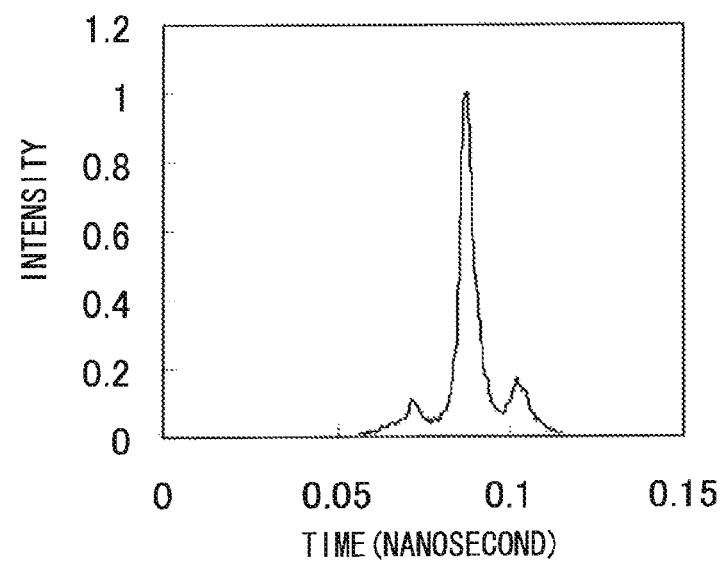

FIGS. 26A and 26B illustrate results obtained by measuring light pulse generated in the second example and the second referential example by a streak camera. In FIG. 26B obtained in the second referential example, subpulse component is generated before and after main pulse. Meanwhile, in FIG. 26A obtained in the second example, subpulse component is inhibited from being generated. The results may be all caused by increased effect of saturable absorption since QCSE effect is moderated by the structure of the third compound semiconductor layer 140.

Drive conditions and the like of the mode locking laser diode device of the second example illustrated in FIG. 19A are exemplified in the following Table 4. $I_{th}$ represents a threshold current.

TABLE 4

Mode locking drive conditions:
0 < 1$_{gain}$/I$_{th}$ ≤ 5
−20 ≤ V$_{sa}$ (volt) ≤ 0
High reflective coating layer (HR):
85 ≤ reflectance R$_{HR}$ (%) < 100
Low reflective coating layer (AR):
0 < reflectance R$_{AR}$ (%) ≤ 0.5
Optical filter:
85 ≤ transmittance T$_{BPF}$ (%) < 100
0 < half bandwidth τ$_{BPF}$ (nm) ≤ 2.0
400 < peak wavelength λ$_{BPF}$ (nm) < 450
External mirror:
0 < reflectance R$_{OC}$ (%) < 100
External resonator length Z'
0 < Z' (mm) < 1500

More specifically, in the second example, the following conditions were adopted as an example:
I$_{gain}$: 120 mA
I$_{th}$: 45 mA
Reverse bias voltage V$_{sa}$: −11 (volt)
Reflectance R$_{HR}$: 95%
Reflectance R$_{AR}$: 0.3%
Transmittance T$_{BPF}$: 90%
Half bandwidth τ$_{BPF}$: 1 nm
Peak wavelength λ$_{BPF}$: 410 nm
Reflectance R$_{OC}$: 20%
External resonator length Z': 150 mm Meanwhile, in the second referential example, the same conditions as those of the second example were adopted except for the following conditions:
I$_{gain}$: 95 mA
I$_{th}$: 50 mA
Reverse bias voltage V$_{sa}$: −12.5 (volt)
Reflectance R$_{OC}$: 50%

Figure 14A:
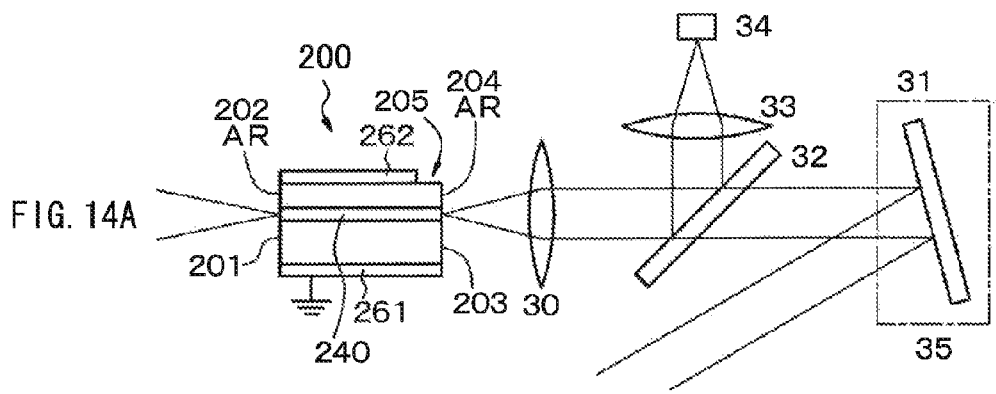
FIG. 14A is a conceptual view of a modification of the light output device of the second example.

As illustrated in the conceptual view of FIG. 14A, part of light output of laser light outputted from the semiconductor optical amplifier 200 is extracted by using a beam splitter 32, and extracted light enters a photodiode 34 through a lens 33. Thereby, the light output of laser light outputted from the semiconductor optical amplifier 200 may be measured. In the case where light output is changed from a desired value, alignment method of the semiconductor optical amplifier of the second example is executed again. That is, a given value of voltage V$_0$ is applied to the semiconductor optical amplifier 200 while laser light enters the semiconductor optical amplifier 200 from the laser light source 100, and thereby the relative position of the semiconductor optical amplifier 200 with respect to laser light entering the semiconductor optical amplifier 200 is adjusted again so that a current flown in the semiconductor optical amplifier 200 becomes the maximum. In the case where result of readjustment of the relative position of the semiconductor optical amplifier 200 with respect to laser light entering the semiconductor optical amplifier 200 is the same as the relative position of the semiconductor optical amplifier with respect to laser light entering the semiconductor optical amplifier 200 before readjustment, light path through which the laser light outputted from the semiconductor optical amplifier 200 passes is adjusted. Such adjustment may be performed by, for example, laying a reflective mirror 31 on an XYZ stage 35. The XYZ stage 35 may be moved by an operator. Otherwise, the XYZ stage 35 is able to be automatically moved by direction of the semiconductor optical amplifier control device 400 based on the voltage and measurement result of the photodiode 34. In FIG. 14A, elements of the light output device located in the upstream of the semiconductor optical amplifier 200 are the same as the elements of the light output device of the second example, and thus the elements of the light output device located in the upstream of the semiconductor optical amplifier 200 are not illustrated in the figure. By adopting such a method, in the case where change occurs in the light output monitor, it is possible to easily determine whether or not such change is caused by relative position change of the semiconductor optical amplifier 200 with respect to laser light entering the semiconductor optical amplifier 200 (that is, change of efficiency of coupling of the entrance laser light and the light guide of the semiconductor optical amplifier).

Third Example

Figure 15A:
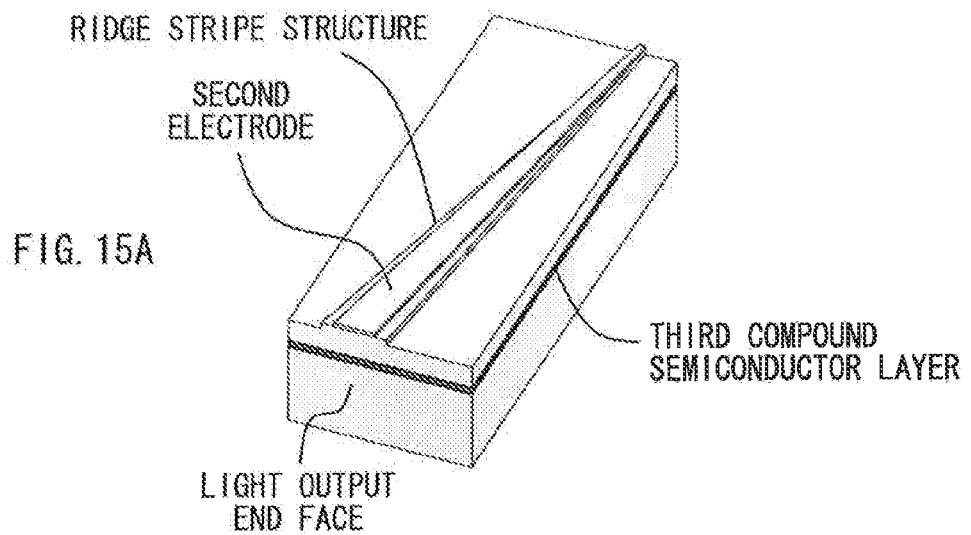
FIGS. 15A and 15B are schematic perspective views of semiconductor optical amplifiers according to a third example and a fourth example.
Figure 16:
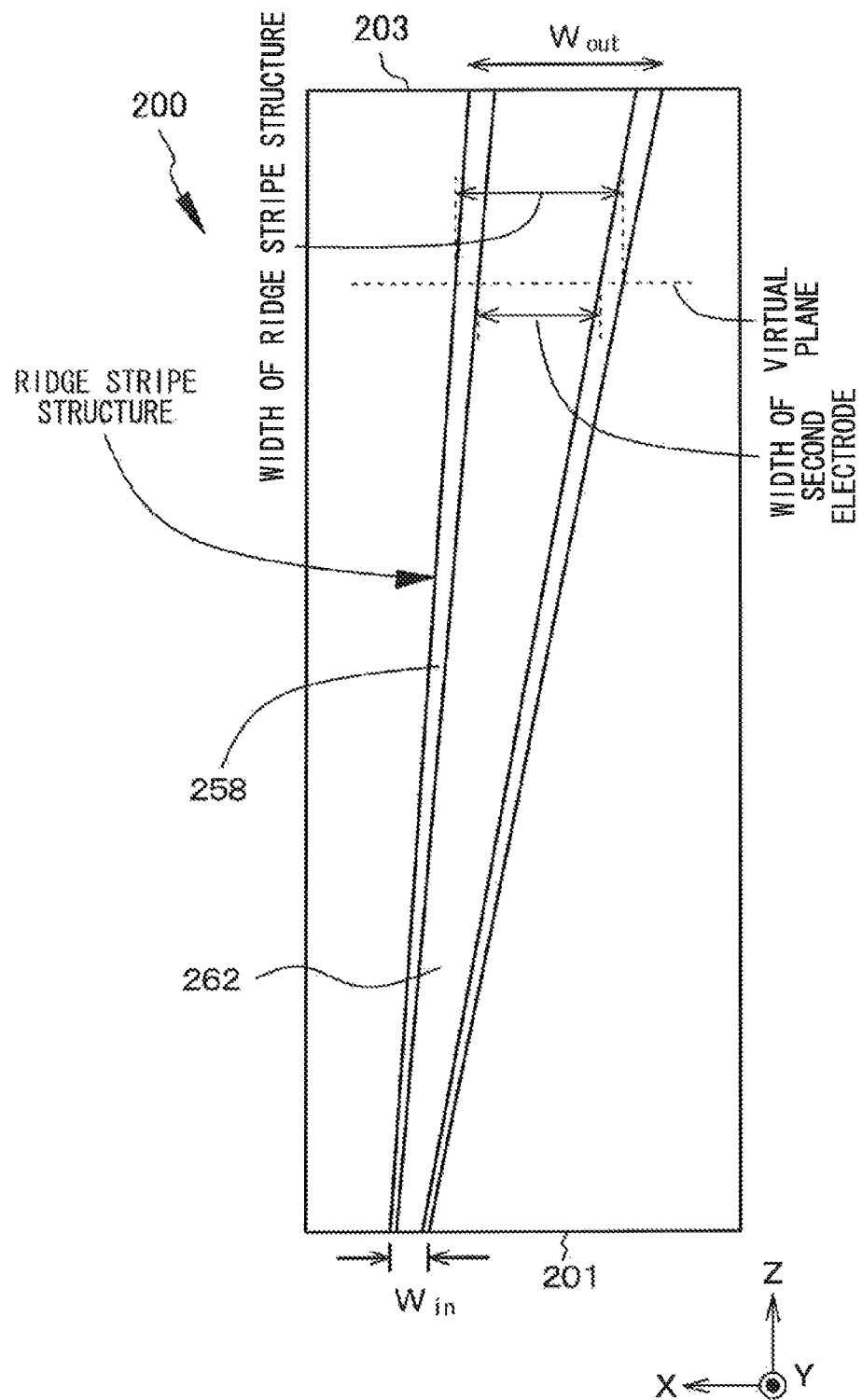
FIG. 16 is a schematic plan view of a ridge stripe structure of the semiconductor optical amplifier of the third example illustrated in FIG. 15A.
Figure 17:
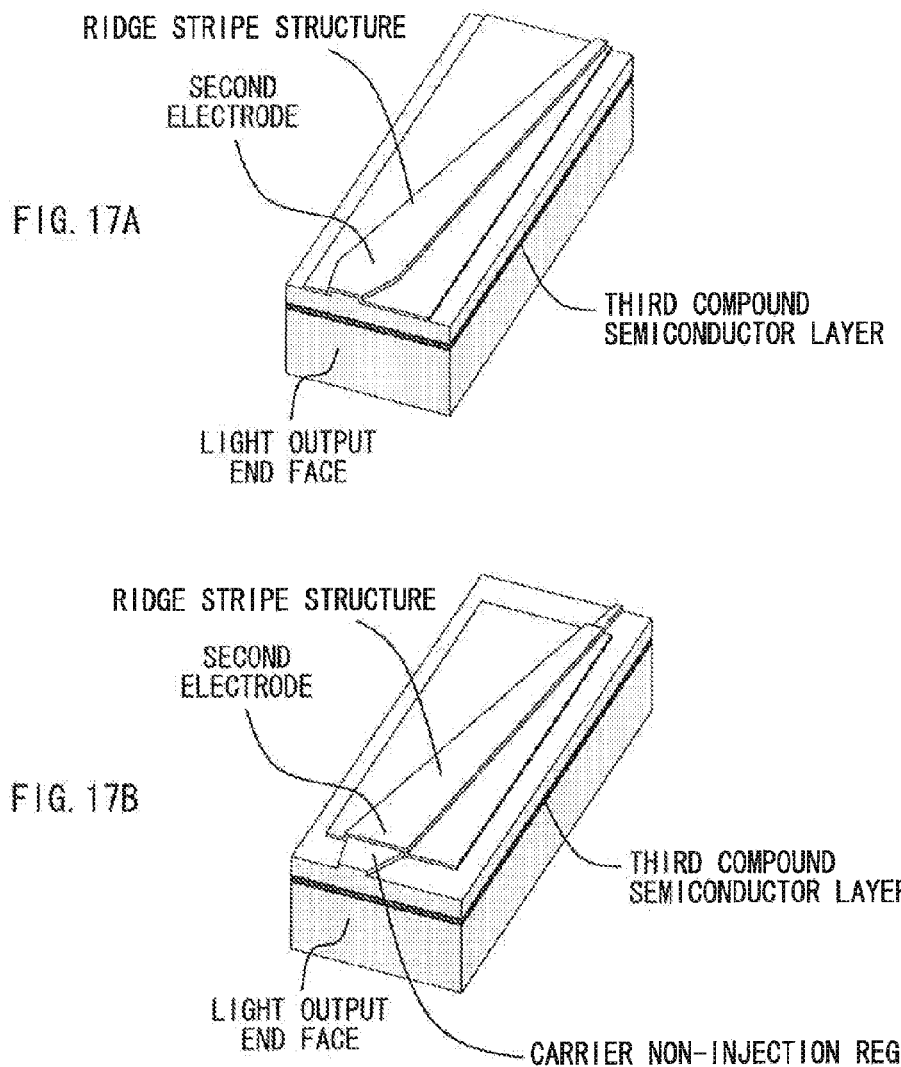
FIGS. 17A and 17B are schematic perspective views of semiconductor optical amplifiers of modifications of the third example and the fourth example.
Figure 18:
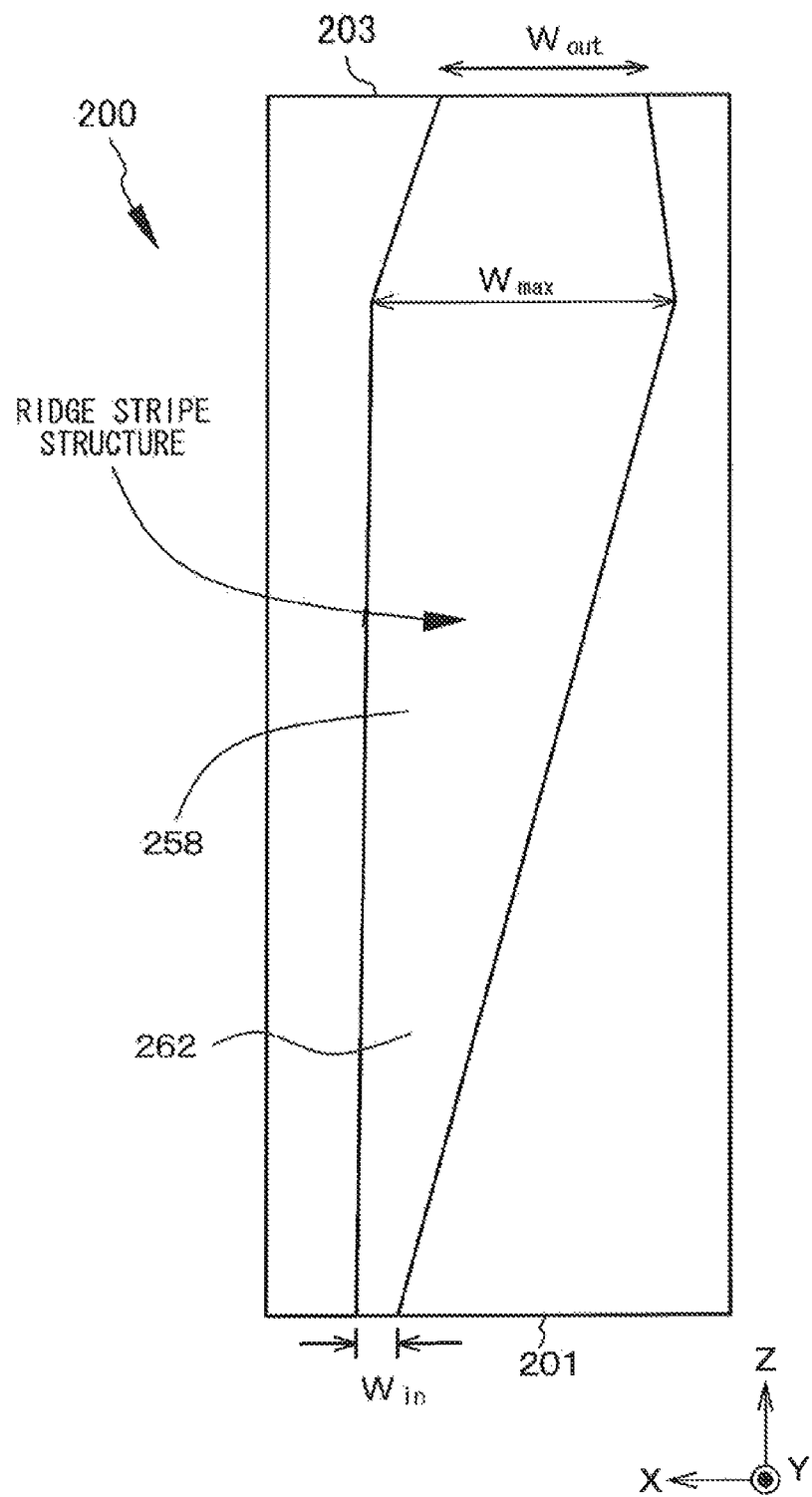
FIG. 18 is a schematic plan view of a ridge stripe structure of the semiconductor optical amplifier of the modification of the third example illustrated in FIG. 17A.

The third example relates to the semiconductor optical amplifiers according to the second embodiment and the third embodiment of the invention. FIGS. 15A and 16 illustrate a schematic perspective view of the semiconductor optical amplifier and a schematic plan view of a ridge stripe structure according to the second embodiment of the invention of the third example. The width of the second electrode 262 is narrower than the width of the ridge stripe structure. In this case, (width of the second electrode)/(width of the ridge stripe structure) satisfies a value from 0.2 to 0.9 both inclusive. Further, FIGS. 17A and 18 illustrate a schematic perspective view of the semiconductor optical amplifier and a schematic plan view of a ridge stripe structure according to the third embodiment of the invention of the third example. Where the maximum width of the ridge stripe structure is W$_{max}$, W$_{max}$/W$_{out}$ is satisfied, and 0.2≤W$_{out}$/W$_{max}$≤0.9 is satisfied. In FIG. 18, though the second electrode 262 is not illustrated, the second electrode 262 is formed from the p-type GaN contact layer corresponding to the top face of the ridge section to part of the top face of the p-type AlGaN cladding layer as in the first example.

A composition and a structure of the semiconductor optical amplifier of the third example are the same as the composition and the structure of the semiconductor optical amplifier described in the first example except for the foregoing points or except that the carrier non-injection region is not provided, and thus detailed description thereof will be omitted.

As illustrated in FIG. 6B, in the case where the width of the near-field image is narrower than W$_{out}$, there is a possibility that light field becomes unstable depending on drive conditions and light output conditions such as the light density, the carrier diffusion length, and device temperature. Thus, in the third example, by adopting the foregoing composition and the foregoing structure, mode instability is modified.

Fourth Example

Figure 15B:
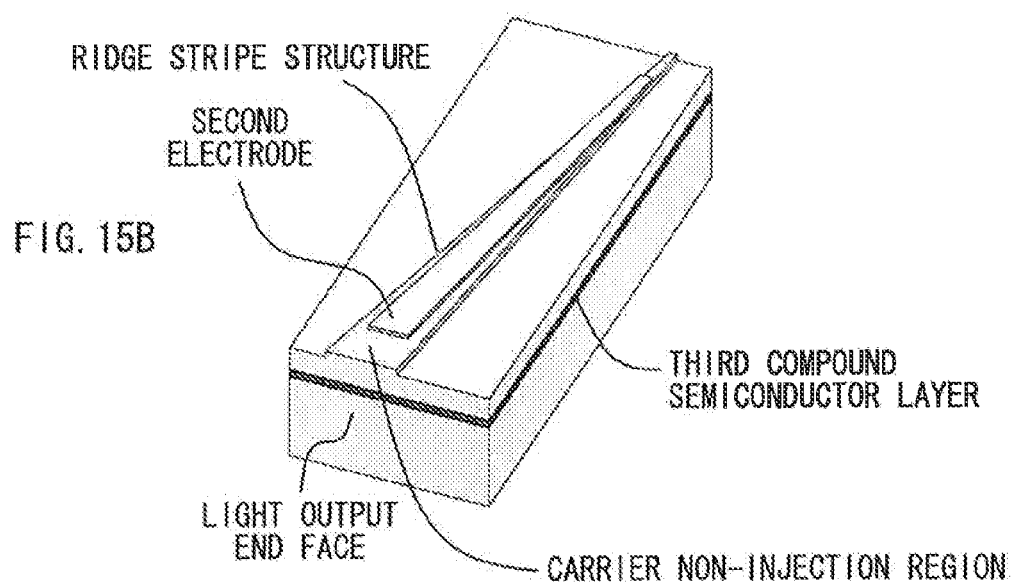

The fourth example is a modification of the third example. FIG. 15B illustrates a schematic perspective view of a modified example of the semiconductor optical amplifier illustrated in FIGS. 15A and 16, and FIG. 17B illustrates a schematic perspective view of a modified example of the semiconductor optical amplifier illustrated in FIGS. 17A and 18. As illustrated in FIG. 15B and FIG. 17B, in the fourth example, differently from the third example, a carrier non-injection region is provided in the internal region of the laminated structure from the light output end face along the axis line of the semiconductor optical amplifier. A composition and a structure of the semiconductor optical amplifier of the fourth example are the same as the composition and the structure of the semiconductor optical amplifier described in the third example except for the foregoing points, and thus detailed description thereof will be omitted. In the forth example, the second electrode may be separated into the first section and the second section by the isolation trench as in the second example.

Fifth Example

Figure 19B:
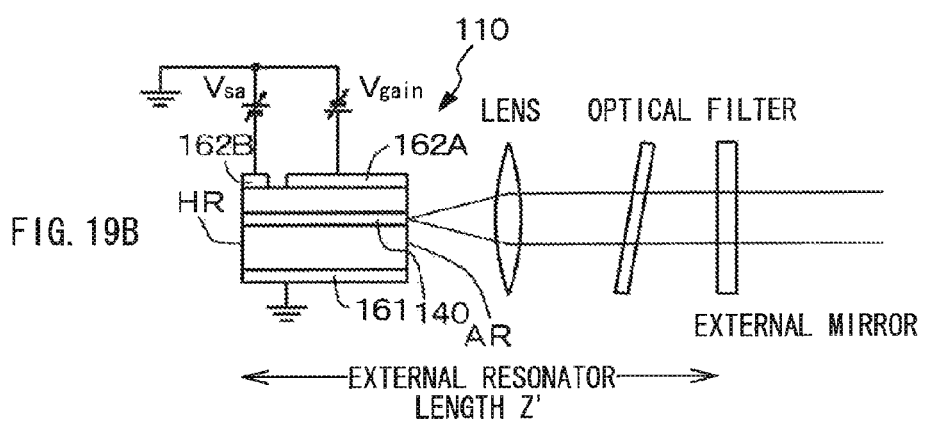
Figure 20A:
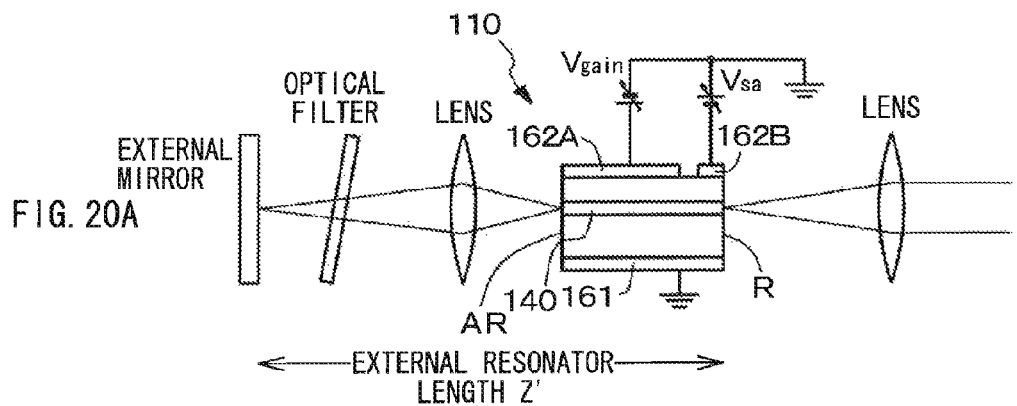
FIGS. 20A and 20B are views respectively and schematically illustrating a system of performing mode locking drive by configuring an external resonator from a mode locking laser diode device in a fifth example.
Figure 20B:
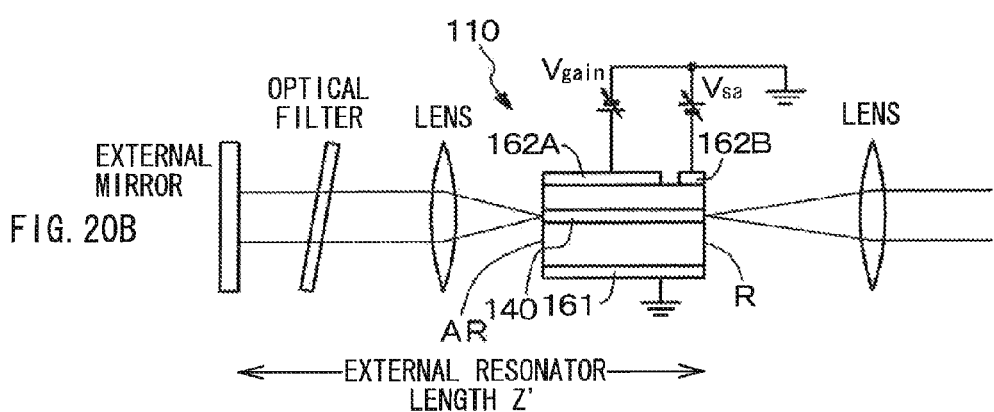

The fifth example is a modification of the mode locking laser diode device in the second example. FIGS. 19B, FIG. 20A, and FIG. 20B illustrate an example in which an external resonator is structured by the mode locking laser diode device of the fifth example.

In the collimation type external resonator illustrated in FIG. 19B, the external resonator is formed from the end face of the mode locking laser diode device in which a high reflective coating layer (HR) is formed on the saturable absorption region side and the external mirror, and light pulse is extracted from the external mirror. A low reflective coating layer (AR) is formed on the end face (light output end face) of the mode locking laser diode device on the light emitting region (gain region) side. The drive conditions and the like of the mode locking laser diode device of the fifth example illustrated in FIG. 19B are similar to those of the foregoing Table 4.

Meanwhile, in the external resonator illustrated in FIGS. 20A and 20B, the external resonator is formed from the end face of the mode locking laser diode device in which a reflective coating layer (R) is formed on the saturable absorption region side (light output end face) and the external mirror, and light pulse is extracted from the saturable absorption region 142. A low reflective coating layer (AR) is formed on the end face of the mode locking laser diode device on the light emitting region (gain region) side. The example illustrated in FIG. 20A is light condensing type, and the example illustrated in FIG. 20B is collimation type. The drive conditions and the like of the mode locking laser diode device of the fifth example illustrated in FIGS. 20A and 20B are similar to those of the foregoing Table 4. However, the reflective coating layer (R) may be as illustrated in the following Table 5.

TABLE 5

| Reflective coating layer (R) |
| --- |
| 0 < reflectance $R_R$ (%) < 100 |

Specifically, reflectance $R_R$ was set to 20%. A composition and a structure of the mode locking laser diode device in the fifth example are the same as the composition and the structure of the mode locking laser diode device described in the second example, and thus detailed description thereof will be omitted.

Sixth Example

Figure 20C:
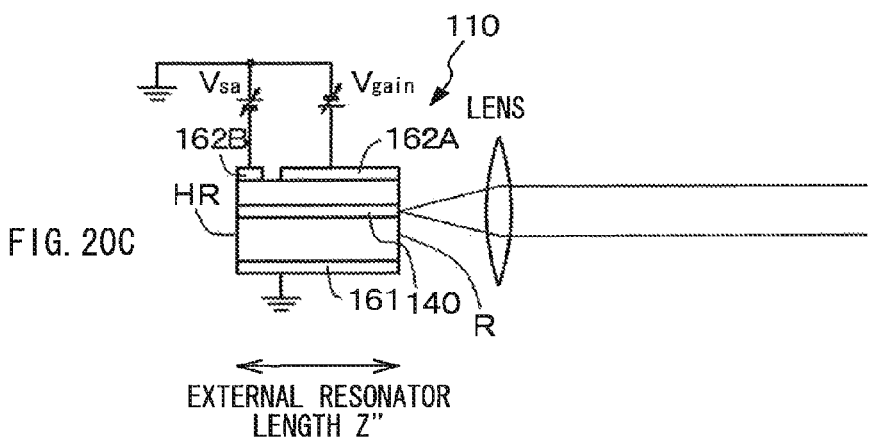
FIG. 20C is a view schematically illustrating a system of performing mode locking drive by using the mode locking laser diode device in the sixth example.

The sixth example is also a modification of the mode locking laser diode device of the second example. In the sixth example, as illustrated in FIG. 20C, the mode locking laser diode device is monolithic type. The drive conditions and the like of the mode locking laser diode device of the sixth example are similar to those of the foregoing Table 4. Other composition and other structure of the mode locking laser diode device of the sixth example are similar to the composition and the structure of the mode locking laser diode device described in the second example, and thus detailed description thereof will be omitted.

Seventh Example

Figure 21:
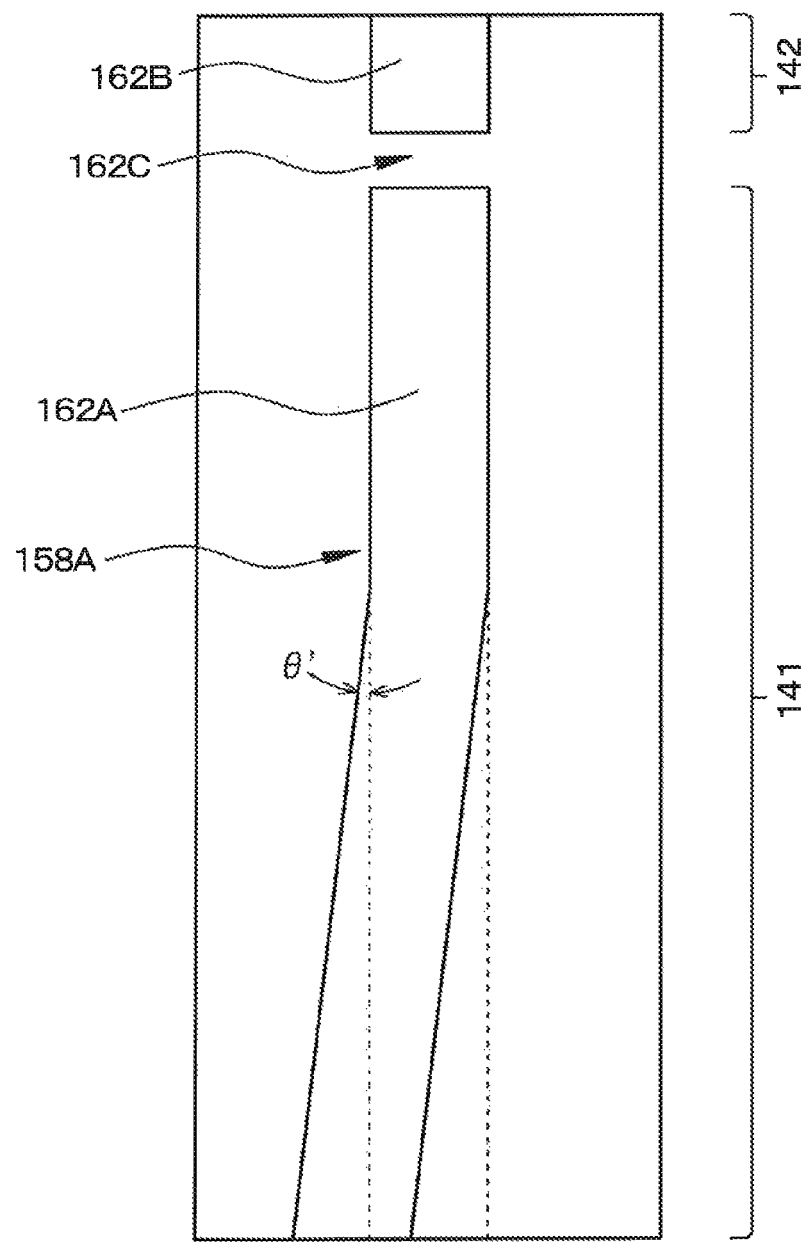
FIG. 21 is a schematic view viewed from above of a ridge section in a mode locking laser diode device of a seventh example.

The seventh example is also a modification of the mode locking laser diode device in the second example. The mode locking laser diode device of the seventh example is a laser diode device having a ridge stripe type separate confinement heterostructure with oblique light guide. FIG. 21 illustrates a schematic view viewed from above of a ridge section 158A in the mode locking laser diode device of the seventh example. The mode locking laser diode device of the seventh example has a structure in which two straight line-like ridge sections. A value of angle θ' of intersection of the two ridge sections desirably satisfies, for example, 0<θ'≤10 (deg), and preferably satisfies 0<θ'≤6 (deg). By adopting the oblique ridge stripe type, reflectance of the end face provided with low reflective coating is able to be closer to 0% as the ideal value. In the result, generation of light pulse that would revolve in the laser diode device is able to be prevented, and generation of sub-light pulse associated with main light pulse is able to be inhibited. The oblique ridge stripe type mode locking laser diode device of the seventh example is applicable to the second example, the fifth example, and the sixth example. Other composition and other structure of the mode locking laser diode device in the seventh example are similar to the composition and the structure of the mode locking laser diode device described in the second example, and thus detailed description thereof will be omitted.

Eighth Example

Figure 22A:
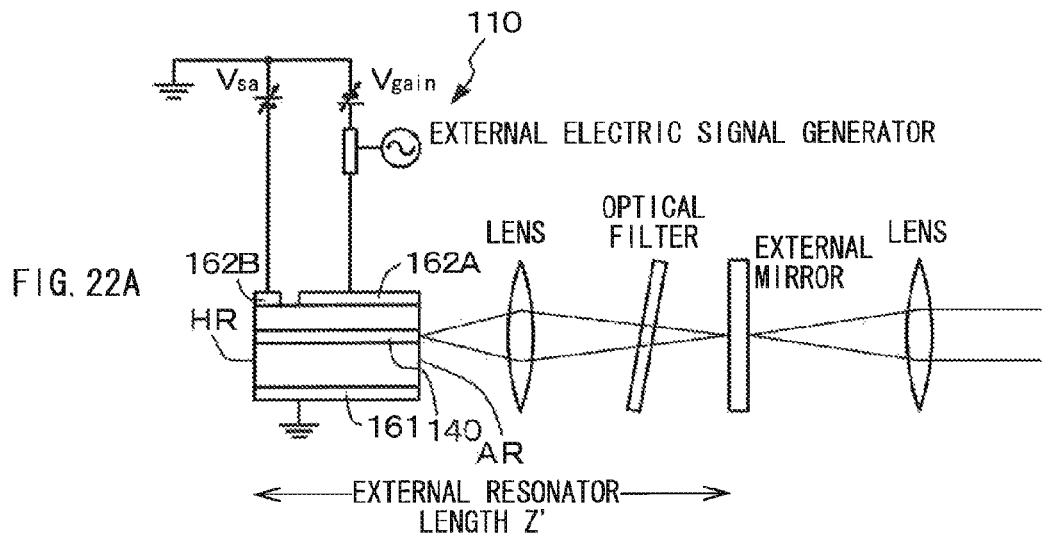
FIGS. 22A and 22B are views respectively and schematically illustrating a system of performing mode locking drive by using a mode locking laser diode device in an eighth example and a mode locking laser diode device in a ninth example.

The eighth example is also a modification of the mode locking laser diode device in the second example. In the eighth example, a current is flown from the second electrode 162 to the first electrode 161 through the light emitting region 141, and an external electric signal (RMS jitter $\Delta_{signal}$) is superimposed on the first electrode 161 from the second electrode 162 through the light emitting region 141. FIG. 22A schematically illustrates a system of performing mode locking drive by using the mode locking laser diode device of the eighth example. The external electric signal is sent from a known external electric signal generator to the second electrode 162. Thereby, light pulse is able to be sync with the external electric signal. That is, RMS timing jitter $\Delta t_{MILD}$ is able to be kept down as the following formula: $\Delta_{signal} \leq \Delta t_{MILD}$.

The drive conditions and the like of the mode locking laser diode device of the eighth example illustrated in FIG. 22A are similar to those of the foregoing Table 4. Voltage maximum value $V_{p-p}$ (unit: volt) of the external electric signal desirably satisfies $0<V_{p-p}\leq10$, and preferably satisfies $0<V_{p-p}\leq3$. Further, frequency $f_{signal}$ of the external electric signal and repetition frequency $f_{MILD}$ of a light pulse train desirably satisfy $0.99 \leq f_{signal}/f_{MILD} \leq 1.01$.

Figure 28A:
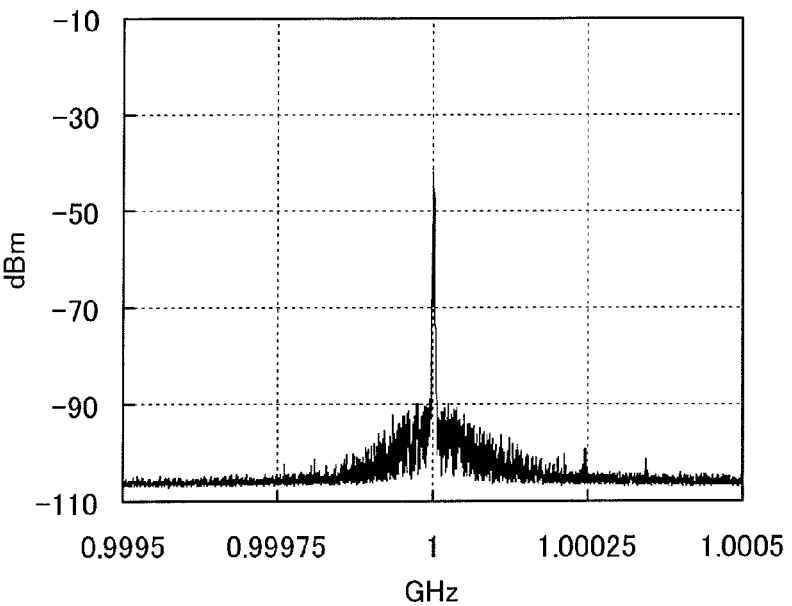
FIGS. 28A and 28B are graphs respectively illustrating results of measuring RF spectrum of the eighth example and an eighth referential example.
Figure 28B:
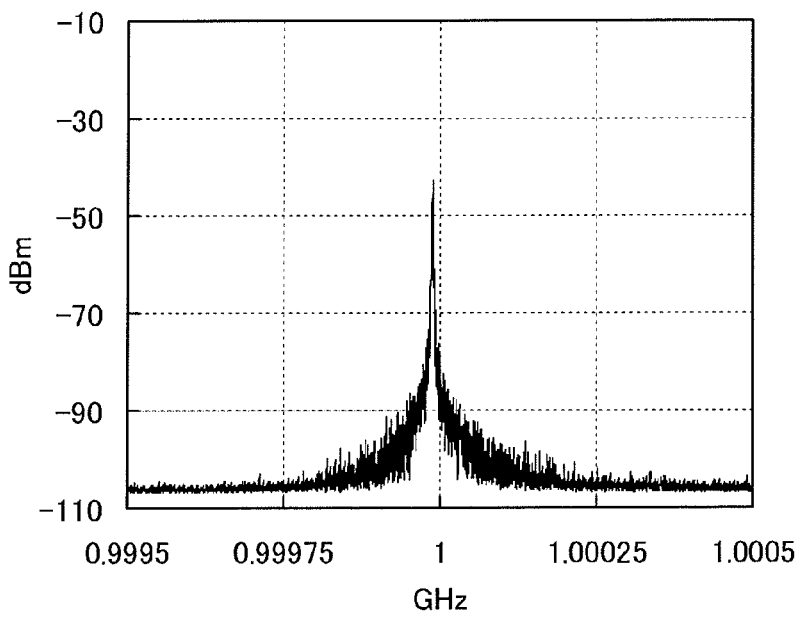

More specifically, in the eighth example, the following conditions were adopted as an example:

$I_{gain}$: 120 mA
$I_{th}$: 45 mA
Reverse bias voltage $V_{sa}$: −11 (volt)
Reflectance $R_{HR}$: 95%
Reflectance $R_{AR}$: 0.3%
Transmittance $T_{BPF}$: 90%
Half bandwidth $\tau_{BPF}$: 1 nm
Peak wavelength $\lambda_{BPF}$: 410 nm
Reflectance $R_{OC}$: 20%
External resonator length Z': 150 mm
$V_{p-p}$: 2.8 volt
$f_{signal}$: 1 GHz
$f_{MILD}$: 1 GHz
$\Delta_{signal}$: 1 picosecond
$\Delta t_{MILD}$: 1.5 picosecond Meanwhile, in the eighth referential example, a current was flown from the second electrode 162 to the first electrode 161 through the light emitting region 141 without superimposing an external electric signal on the first electrode 161 from the second electrode 162 through the light emitting region 141. RF spectrum was measured. FIGS. 28A and 28B illustrate measurement results in the eighth example and the eighth referential example. In the eighth referential example, the same conditions as those of the eighth example were adopted except for the following conditions:

Reflectance $R_{OC}$: 50%

FIGS. 28A and 28B show that in the eighth example, the area of bottom component of RF spectrum is decreased more than in the eighth referential example. Such a fact shows that the eighth example is a drive method in which the phase noise and the timing jitter are smaller compared to those of the eighth referential example.

Other composition and other structure of the mode locking laser diode device in the eighth example are similar to the composition and the structure of the mode locking laser diode device described in the second example, the fifth example, the sixth example, and the seventh example, and thus detailed description thereof will be omitted.

Ninth Example

Figure 22B:
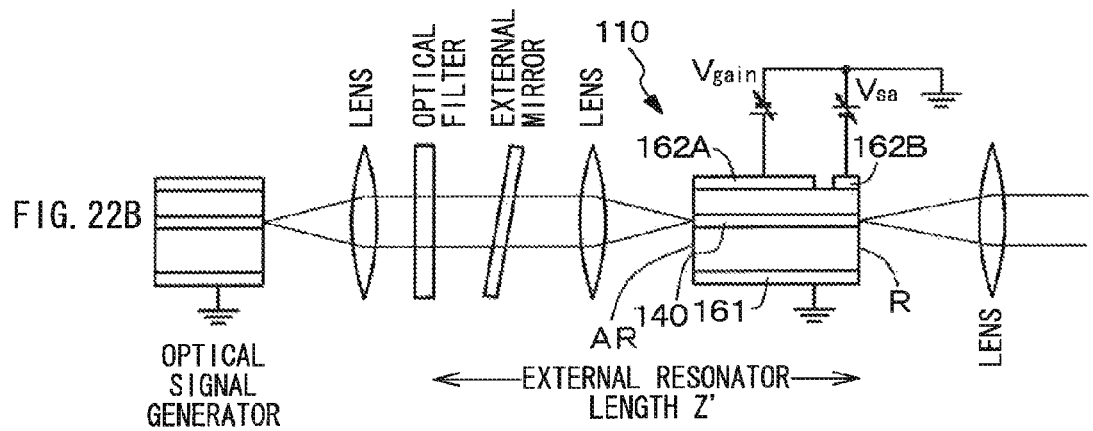

The ninth example is also a modification of the mode locking laser diode device in the second example. In the ninth example, an optical signal enters from one end face of the laminated structure. FIG. 22B schematically illustrates a system of performing mode locking drive by using the mode locking laser diode device of the ninth example. The optical signal (RMS jitter: $\Delta_{opto}$) is outputted from an optical signal generator composed of the laser diode device, and enters one end face of the laminated structure through a lens, an external mirror, an optical filter, and a lens. Thereby, light pulse is able to be sync with the optical signal. That is, the RMS timing jitter $\Delta t_{MLD}$ is able to be kept down as the following formula. $\Delta_{opto} \leq \Delta t_{MLD}$.

Other composition and other structure of the mode locking laser diode device in the ninth example are similar to the composition and the structure of the mode locking laser diode device described in the second example, the fifth example, the sixth example, and the seventh example, and thus detailed description thereof will be omitted.

Descriptions have been hereinbefore given of the invention with reference to the preferred embodiments. However, the invention is not limited to the foregoing embodiments. The compositions and the structures of the semiconductor optical amplifier, the light output device, the laser light source, and the laser diode device described in the embodiments are just exemplified, and modifications may be made as appropriate. Further, in the embodiments, though various values have been shown, such various values are just exemplified as well, and thus it is needless to say that, for example, if specifications of the semiconductor optical amplifier, the light output device, and the laser diode device to be used are changed, values are also changed. For example, the second electrode 162 may have a laminated structure including a lower metal layer composed of palladium (Pd) having a thickness of 20 nm and an upper metal layer composed of nickel (Ni) having a thickness of 200 nm. In performing wet etching with the use of aqua regia, the etching rate of nickel is about 1.25 times the etching rate of palladium.

Figure 14B:
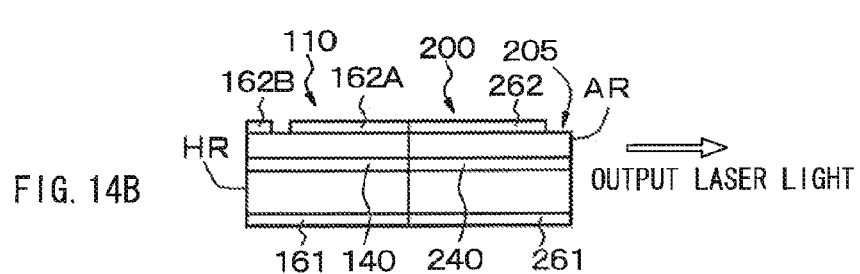
FIG. 14B is a conceptual view of a monolithic semiconductor optical amplifier.

In the embodiments, the semiconductor optical amplifier is composed of a transmissive semiconductor optical amplifier. However, the semiconductor optical amplifier is not limited thereto. As illustrated in a conceptual view of FIG. 14B, the semiconductor optical amplifier may be composed of a monolithic semiconductor optical amplifier. The monolithic semiconductor optical amplifier is an integrated body composed of a laser diode device and a semiconductor optical amplifier.

In the embodiments, the mode locking laser diode device 110 is provided on the {0001} plane, which is the C plane as the polarity plane of the n-type GaN substrate 121. Alternately, the mode locking laser diode device 110 may be provided on A plane as {11-20} plane, M plane as {1-100} plane, non-polarity plane such as {1-102} plane, {11-2n} plane including {11-24} plane and {11-22} plane, or a semi-polarity plane such as {10-11} plane and {10-12} plane. Even if piezoelectric polarization or intrinsic polarization is thereby generated in the third compound semiconductor layer of the mode locking laser diode device 110, piezoelectric polarization is not generated in the thickness direction of the third compound semiconductor layer and piezoelectric polarization is generated in the direction approximately perpendicular to the thickness direction of the third compound semiconductor layer. Thus, adverse effect resulting from piezoelectric polarization and intrinsic polarization is able to be excluded. {11-2n} plane means a non-polarity plane making 40 deg approximately with respect to the C plane. In the case where the mode locking laser diode device 110 is provided on a non-polarity plane or on a semi-polarity plane, limitation of the thickness of the well layer (from 1 nm to 10 nm both inclusive) and limitation of the impurity doping concentration of the barrier layer (from $2 \times 10^{18}$ cm$^{-3}$ to $1 \times 10^{20}$ cm$^{-3}$ both inclusive) are able to be eliminated.

Figure 23:
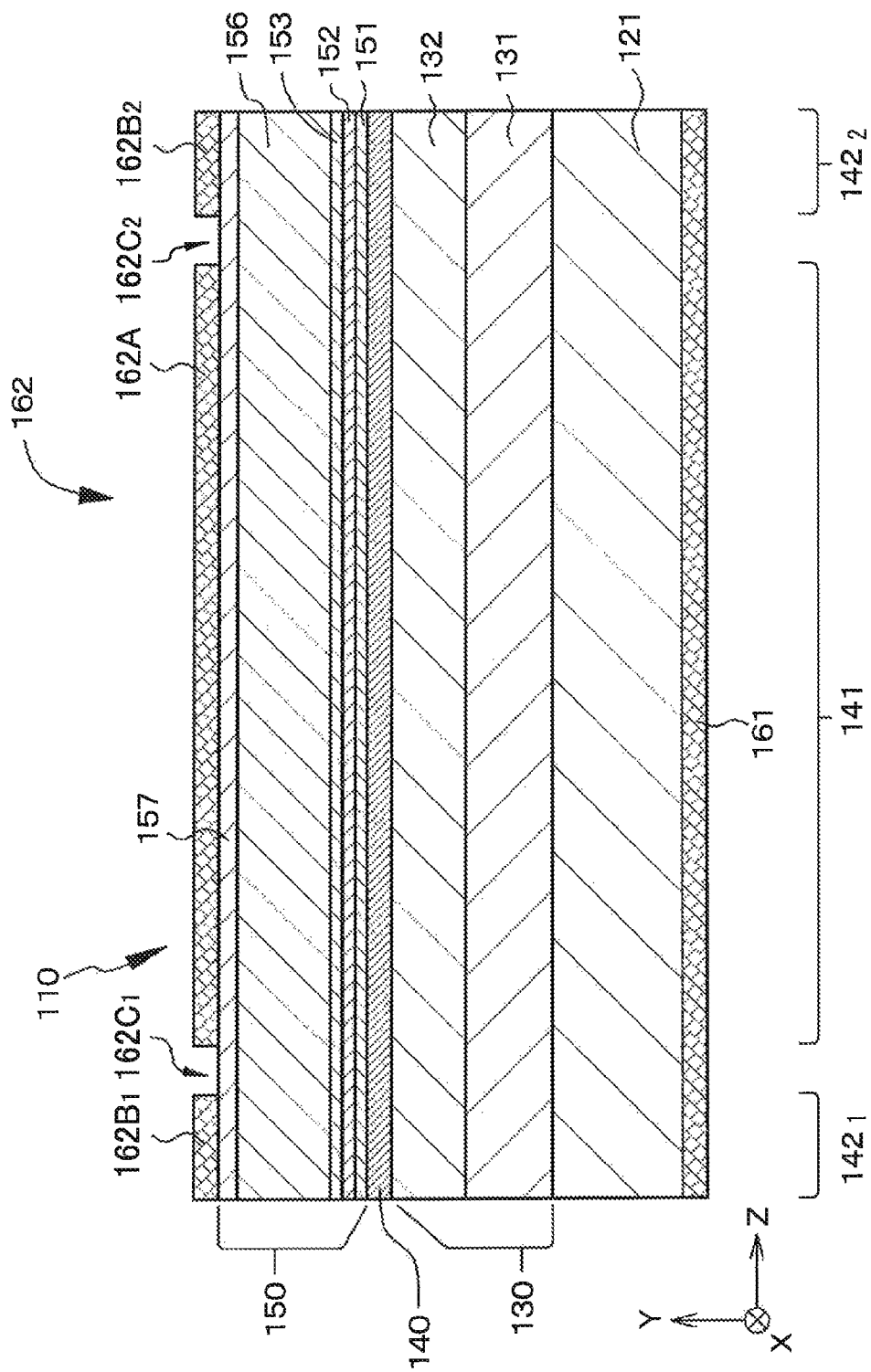
FIG. 23 is a schematic end view taken along a direction in which a resonator of a modification of the mode locking laser diode device in the second example is extended.
Figure 24:
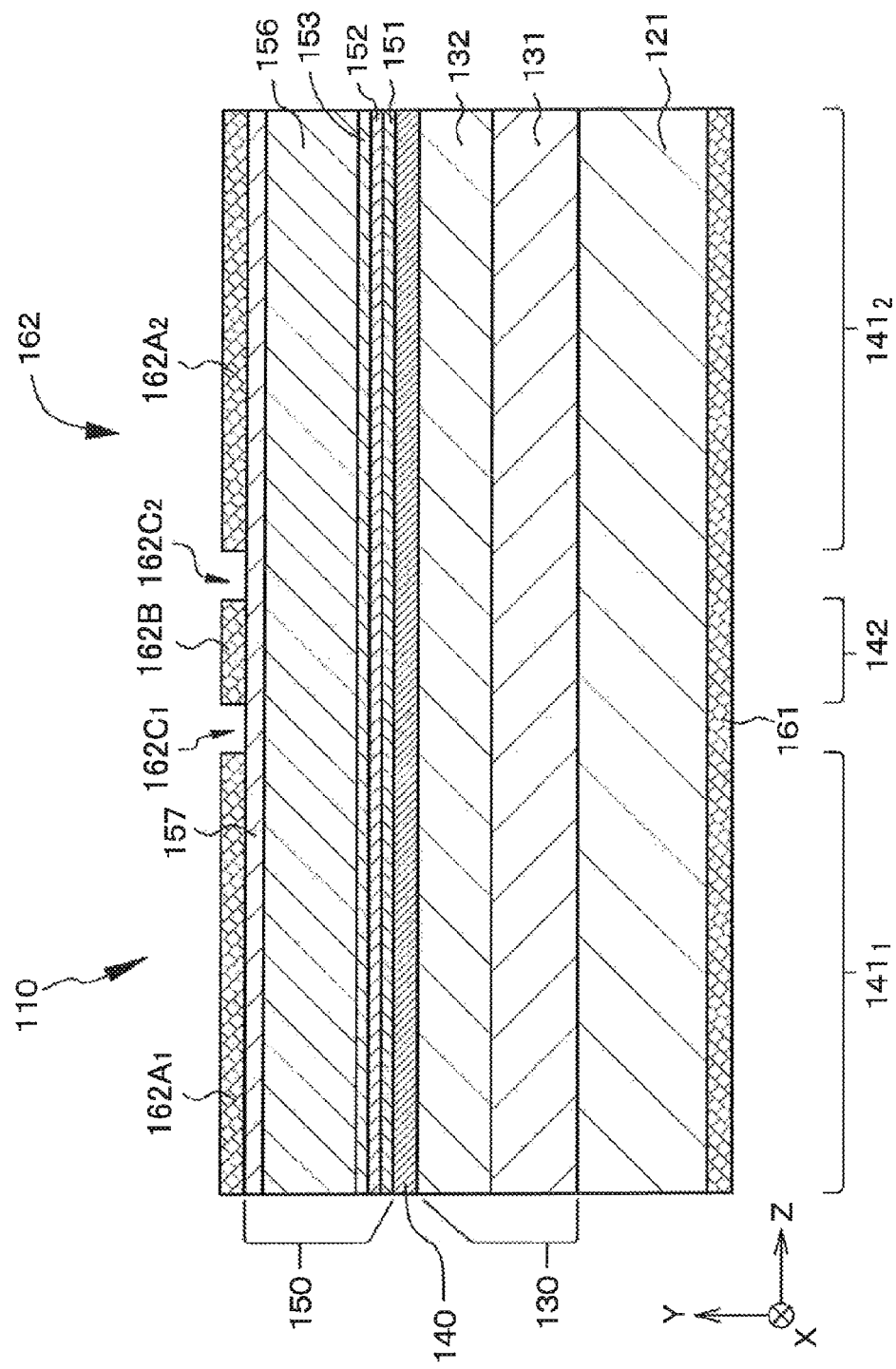
FIG. 24 is a schematic end view taken along a direction in which a resonator of another modification of the mode locking laser diode device in the second example is extended.

The number of the light emitting regions 141 and the saturable absorption regions 142 is not limited to 1. FIG. 23 illustrates a schematic end view of a mode locking laser diode device in which one first section 162A of the second electrode and two second sections 162B$_1$, and 162B$_2$ of the second electrode are provided. In the mode locking laser diode device, one end of the first section 162A is opposed to one second section 162B$_1$ with one isolation trench 162 C$_1$ in between, and the other end of the first section 162A is opposed to the other second section 162B$_2$ with the other isolation trench 162C$_2$ in between. Further, one light emitting region 141 is sandwiched between saturable absorption regions 142$_1$, and 142$_2$. Further, FIG. 24 illustrates a schematic end view of a mode locking laser diode device in which two first sections 162A$_1$, and 162A$_2$ of the second electrode and one second section 162B of the second electrode are provided. In the mode locking laser diode device, an end section of the second section 162B is opposed to one first section 162A$_1$ with one isolation trench 162 C$_1$ in between, and the other end of the second section 162B is opposed to the other first section 162A$_2$ with the other isolation trench 162 C$_2$ in between. Further, one saturable absorption region 142 is sandwiched between two light emitting regions 141$_1$, and 141$_2$.

Further, as a modification of the second embodiment, it is possible that a given value of current is applied to the semiconductor optical amplifier while laser light enters the semiconductor optical amplifier from the laser light source, and thereby the relative position of the semiconductor optical amplifier with respect to laser light entering the semiconductor optical amplifier is adjusted so that voltage applied to (added to) the semiconductor optical amplifier becomes the maximum. In this case, in the case where light output of laser light outputted from the semiconductor optical amplifier is measured and the light output is changed from a desired value, it is possible that a given value of current is applied to the semiconductor optical amplifier while laser light enters the semiconductor optical amplifier from the laser light source, and thereby the relative position of the semiconductor optical amplifier with respect to laser light entering the semiconductor optical amplifier is adjusted again so that voltage applied to (added to) the semiconductor optical amplifier becomes the maximum. Further, in the case where result of readjustment of the relative position of the semiconductor optical amplifier with respect to laser light entering the semiconductor optical amplifier is the same as the relative position of the semiconductor optical amplifier with respect to laser light entering the semiconductor optical amplifier before readjustment, light path through which the laser light outputted from the semiconductor optical amplifier passes is able to be adjusted. Specifically, where a voltage applied to (added to) the semiconductor optical amplifier in the case where a given value of current $I_0$ is flown to the semiconductor optical amplifier while laser light does not enter the semiconductor optical amplifier from the laser light source is $V_1$, and a voltage applied to (added to) the semiconductor optical amplifier in the case where a given value of current $I_0$ is flown to the semiconductor optical amplifier while laser light enters the semiconductor optical amplifier from the laser light source is $V_2$, the relative position of the semiconductor optical amplifier with respect to laser light entering the semiconductor optical amplifier may be adjusted so that value of $\Delta V = (V_2 - V_1)$ becomes the maximum. As a given value of current, 0 milliampere $< \Delta I \leq 20$ milliampere is able to be exemplified.

Further, as a modification of the second embodiment, it is possible that a given value of voltage is applied to the semiconductor optical amplifier while laser light enters the semiconductor optical amplifier from the laser light source, and thereby the relative position of the semiconductor optical amplifier with respect to laser light entering the semiconductor optical amplifier is adjusted so that a current flown to the semiconductor optical amplifier becomes the maximum. In this case, when light output of laser light outputted from the semiconductor optical amplifier is measured and the light output is changed from a desired value, it is possible that a given value of voltage is applied to the semiconductor optical amplifier while laser light enters the semiconductor optical amplifier from the laser light source, and thereby the relative position of the semiconductor optical amplifier with respect to laser light entering the semiconductor optical amplifier is adjusted again so that current flown in the semiconductor optical amplifier becomes the maximum. Further, in the case where result of readjustment of the relative position of the semiconductor optical amplifier with respect to laser light entering the semiconductor optical amplifier is the same as the relative position of the semiconductor optical amplifier with respect to laser light entering the semiconductor optical amplifier before readjustment, light path through which the laser light outputted from the semiconductor optical amplifier passes is able to be adjusted. Specifically, when a current flown in the semiconductor optical amplifier in the case where a given value of voltage $V_0$ is applied to the semiconductor optical amplifier while laser light does not enter the semiconductor optical amplifier from the laser light source is $I_1$, and a current flown in the semiconductor optical amplifier in the case where a given value of voltage $V_0$ is applied to the semiconductor optical amplifier while laser light enters the semiconductor optical amplifier from the laser light source is $I_2$, the relative position of the semiconductor optical amplifier with respect to laser light entering the semiconductor optical amplifier may be adjusted so that value of $\Delta I = (I_2 - I_1)$ becomes the maximum. As a given value of voltage, 0 volt $\leq \Delta V \leq 5$ volt is able to be exemplified.

The present application contains subject matter related to that disclosed in Japanese Priority Patent Application JP 2010-149345 filed in the Japanese Patent Office on Jun. 30, 2010, the entire contents of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A semiconductor optical amplifier comprising:
a laminated structure including (i) a first compound semiconductor layer that has a first conductivity type and is composed of GaN compound semiconductor, (ii) a second compound semiconductor layer that has a second conductivity type different from the first conductivity type and is composed of GaN compound semiconductor, and (iii) a third compound semiconductor layer that has a light amplification region composed of GaN compound semiconductor, the first compound semiconductor layer, the third compound semiconductor layer, and the second compound semiconductor layer being sequentially layered;
a second electrode on the second compound semiconductor layer; and
a first electrode electrically connected to the first compound semiconductor layer,
wherein,
the laminated structure has a ridge stripe structure,
when a width of the ridge stripe structure in a light output end face is $W_{out}$, and a width of the ridge stripe structure in a light incident end face is $W_{in}$, $W_{out} > W_{in}$ is satisfied, and
a carrier non-injection region is provided in the laminated structure, the carrier non-injection region extending from the light output end face of the ridge stripe structure and towards the light incident end face of the ridge stripe structure along an axis line of the semiconductor optical amplifier, the first, second, and third compound semiconductor layers being present in the carrier non-injection region, and the second electrode not being present in the carrier non-injection region.

2. The semiconductor optical amplifier according to claim 1, wherein $W_{out}$ is greater or equal to 5 μm.

3. The semiconductor optical amplifier according to claim 1, wherein $W_{in}$ is from 1.4 μm to 2.0 μm, both inclusive.

4. The semiconductor optical amplifier according to claim 1,
wherein the second electrode is composed of a first section and a second section separated by an isolation trench, and
the second section of the second electrode is provided in the carrier non-injection region.

5. The semiconductor optical amplifier according to claim 4, wherein a voltage equal to or less than a built-in voltage is applied to the second section of the second electrode.

6. The semiconductor optical amplifier according to claim 1, wherein the axis line of the semiconductor optical amplifier intersects with an axis line of the ridge stripe structure at a given angle that ranges from 0.1 to 10 degrees.

7. The semiconductor optical amplifier according to claim 1, wherein a value of (width of the ridge stripe structure in the light output end face)/(width of laser light outputted from the semiconductor optical amplifier) is from 1.1 to 10, both inclusive.

\* \* \* \* \*